(12) United States Patent
Sagehashi et al.

(10) Patent No.: US 8,900,793 B2
(45) Date of Patent: *Dec. 2, 2014

(54) POLYMER, CHEMICALLY AMPLIFIED RESIST COMPOSITION, AND PATTERNING PROCESS USING SAID CHEMICALLY AMPLIFIED RESIST COMPOSITION

(75) Inventors: Masayoshi Sagehashi, Jyoetsu (JP); Youichi Ohsawa, Jyoetsu (JP); Koji Hasegawa, Jyoetsu (JP); Tomohiro Kobayashi, Jyoetsu (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 53 days.

This patent is subject to a terminal disclaimer.

(21) Appl. No.: 13/476,700

(22) Filed: May 21, 2012

(65) Prior Publication Data

US 2012/0308932 A1 Dec. 6, 2012

(30) Foreign Application Priority Data

May 30, 2011 (JP) ................. 2011-120457

(51) Int. Cl.

| | |
|---|---|
| G03F 7/004 | (2006.01) |
| G03F 7/30 | (2006.01) |
| C08F 220/38 | (2006.01) |
| C08F 24/00 | (2006.01) |
| G03F 7/20 | (2006.01) |
| G03F 7/039 | (2006.01) |
| G03F 7/11 | (2006.01) |

(52) U.S. Cl.
CPC ............. G03F 7/2041 (2013.01); G03F 7/30 (2013.01); C08F 24/00 (2013.01); G03F 7/0045 (2013.01); G03F 7/0397 (2013.01); G03F 7/11 (2013.01); C08F 220/38 (2013.01); Y10S 430/111 (2013.01)
USPC ........ 430/270.1; 430/326; 430/330; 430/910; 526/268

(58) Field of Classification Search
CPC ......... G03F 7/0397; G03F 7/30; C08F 24/00; C08F 220/38
USPC ................ 430/270.1, 326, 330, 910; 526/268
IPC ........... G03F 7/0397, 7/30; C08F 24/00, 220/38
See application file for complete search history.

(56) References Cited

U.S. PATENT DOCUMENTS

| | | | |
|---|---|---|---|
| 5,650,483 A | 7/1997 | Malik et al. | |
| 6,048,672 A | 4/2000 | Cameron et al. | |
| 6,280,898 B1 | 8/2001 | Hasegawa et al. | |
| 6,312,867 B1 | 11/2001 | Kinsho et al. | |
| 7,833,694 B2* | 11/2010 | Hasegawa et al. | 430/270.1 |
| 8,062,831 B2* | 11/2011 | Shinachi et al. | 430/270.1 |
| 2002/0102491 A1 | 8/2002 | Kodama et al. | |
| 2003/0013039 A1 | 1/2003 | Kobayashi et al. | |
| 2004/0197697 A1 | 10/2004 | Korionoff et al. | |
| 2006/0228648 A1 | 10/2006 | Ohsawa et al. | |
| 2007/0078269 A1 | 4/2007 | Harada et al. | |
| 2007/0148594 A1* | 6/2007 | Funatsu et al. | 430/270.1 |
| 2007/0149702 A1 | 6/2007 | Ando et al. | |
| 2007/0160929 A1 | 7/2007 | Hasegawa et al. | |
| 2007/0231738 A1 | 10/2007 | Kaneko et al. | |
| 2007/0264596 A1 | 11/2007 | Ohsawa et al. | |
| 2008/0026331 A1* | 1/2008 | Hasegawa et al. | 430/327 |
| 2008/0085469 A1 | 4/2008 | Ohsawa et al. | |

(Continued)

FOREIGN PATENT DOCUMENTS

| | | |
|---|---|---|
| CA | 2049772 A1 | 2/1992 |
| JP | A-3-501970 | 5/1991 |

(Continued)

OTHER PUBLICATIONS

Dammel et al.; "193nm Immersion Lithography—Taking the Plunge;" *Journal of Photopolymer Science and Technology*; vol. 17. No. 4; (2004); pp. 587-602.

(Continued)

*Primary Examiner* — John Chu
(74) *Attorney, Agent, or Firm* — Oliff PLC

(57) ABSTRACT

There is disclosed a polymer having a repeating unit shown by the following general formula (1). There can be, in a photolithography using a high energy beam such as an ArF excimer laser beam and an EUV as a light source, (1) a polymer that gives a resist composition having an appropriate adhesion with a substrate and being capable of forming a pattern having excellent resolution, especially an excellent rectangular pattern profile, (2) a chemically amplified resist composition containing the said polymer, and (3) a patterning process using the said chemically amplified resist composition.

(1)

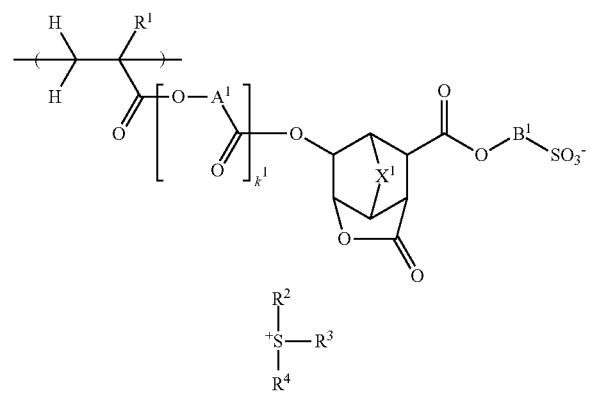

8 Claims, No Drawings

(56) References Cited

U.S. PATENT DOCUMENTS

| | | |
|---|---|---|
| 2008/0090172 A1 | 4/2008 | Hatakeyama et al. |
| 2008/0102407 A1 | 5/2008 | Ohsawa et al. |
| 2008/0118860 A1 | 5/2008 | Harada et al. |
| 2008/0153030 A1 | 6/2008 | Kobayashi et al. |
| 2009/0081588 A1 | 3/2009 | Hatakeyama et al. |
| 2009/0208867 A1 | 8/2009 | Harada et al. |
| 2009/0208873 A1 | 8/2009 | Harada et al. |
| 2009/0233223 A1 | 9/2009 | Tachibana et al. |
| 2009/0233242 A1* | 9/2009 | Hasegawa et al. ............ 430/325 |
| 2009/0274978 A1 | 11/2009 | Ohashi et al. |
| 2009/0274984 A1* | 11/2009 | Shinachi et al. ............. 430/325 |
| 2009/0280434 A1 | 11/2009 | Harada et al. |
| 2009/0318652 A1 | 12/2009 | Nagai et al. |
| 2010/0075256 A1 | 3/2010 | Joo et al. |
| 2010/0099042 A1* | 4/2010 | Ohashi et al. ............. 430/270.1 |
| 2010/0112482 A1 | 5/2010 | Watanabe et al. |
| 2010/0136478 A1 | 6/2010 | Kawaue et al. |
| 2010/0136482 A1 | 6/2010 | Harada et al. |
| 2010/0143830 A1 | 6/2010 | Ohashi et al. |
| 2010/0248149 A1 | 9/2010 | Tsuchimura et al. |
| 2010/0297560 A1 | 11/2010 | Seshimo et al. |
| 2010/0304294 A1 | 12/2010 | Ichikawa et al. |
| 2011/0014566 A1 | 1/2011 | Ichikawa et al. |
| 2011/0189607 A1* | 8/2011 | Ohashi et al. ............. 430/270.1 |
| 2012/0065291 A1 | 3/2012 | Matsumura et al. |
| 2012/0308920 A1* | 12/2012 | Domon et al. .................... 430/5 |

FOREIGN PATENT DOCUMENTS

| | | |
|---|---|---|
| JP | A-04-230645 | 8/1992 |
| JP | A-11-282168 | 10/1999 |
| JP | A-2000-336121 | 5/2000 |
| JP | A-2000-159758 | 6/2000 |
| JP | A-2000-336121 | 12/2000 |
| JP | A-2002-214774 | 7/2002 |
| JP | A-2003-066612 | 3/2003 |
| JP | A-2004-002252 | 1/2004 |
| JP | A-2004-531749 | 10/2004 |
| JP | B2-3613491 | 11/2004 |
| JP | A-2005-084365 | 3/2005 |
| JP | A-2006-178317 | 7/2006 |
| JP | A-2006-306856 | 11/2006 |
| JP | A-2007-145797 | 6/2007 |
| JP | A-2007-197718 | 8/2007 |
| JP | A-2007-297590 | 11/2007 |
| JP | A-2007-304490 | 11/2007 |
| JP | A-2008-031298 | 2/2008 |
| JP | A-2008-080474 | 4/2008 |
| JP | A-2008-106045 | 5/2008 |
| JP | A-2008-111103 | 5/2008 |
| JP | A-2008-122932 | 5/2008 |
| JP | A-2008-158339 | 7/2008 |
| JP | A-2009-007323 | 1/2009 |
| JP | A-2009-98638 | 5/2009 |
| JP | A-2009-098638 | 5/2009 |
| JP | A-2009-191151 | 8/2009 |
| JP | A-2009-192784 | 8/2009 |
| JP | A-2009-242789 | 10/2009 |
| JP | A-2009-269953 | 11/2009 |
| JP | A-2009-276363 | 11/2009 |
| JP | A-2010-002599 | 1/2010 |
| JP | A-2010-107695 | 5/2010 |
| JP | A-2010-134012 | 6/2010 |
| JP | A-2010-155824 | 7/2010 |
| JP | B2-4539865 | 9/2010 |
| JP | A-2010-250290 | 11/2010 |
| JP | A-2010-271501 | 12/2010 |
| JP | A-2011-006398 | 1/2011 |
| JP | A-2011-026300 | 2/2011 |
| JP | A-2011-037834 | 2/2011 |
| JP | A-2011-37834 | 2/2011 |
| JP | A-2011-037836 | 2/2011 |
| JP | A-2011-085878 | 4/2011 |
| WO | WO 89/03389 | 4/1989 |
| WO | WO 2007/069640 A1 | 6/2007 |
| WO | WO 2010/119910 A1 | 10/2010 |

OTHER PUBLICATIONS

Sep. 30, 2013 European Search Report issued in European Application No. 12003989.5.

Jul. 17, 2012 Notification of Reasons for Refusal issued in Japanese Application No. 2010-021078 (with partial translation).

Devoe et al., "Photochemistry and Photophysics of 'Onium Salts*," *Advances in Photochemistry*, vol. 17, pp. 313-355, 1992, John Wiley & Sons.

Dammel et al., "193 nm Immersion Lithography—Taking the Plunge," *Journal of Photopolymer Science and Technology*, vol. 17, No. 4, pp. 587-602, 2004.

Arimitsu et al., "Sensitivity Enhancement of Chemical-Ampflication-Type Photoimaging Materials by Acetoacetic Acid Derivatives," *Journal of Photopolymer Science and Technology*, vol. 8, No. 1, pp. 43-46, 1995.

Arimitsu et al., "Effect of Phenolic Hydroxyl Residues on the Improvement of Acid- Proliferation-Type Photoimaging Materials,"*Journal of Photopolymer Science and Technology*, vol. 9, No. 1, pp. 29-30, 1996.

Lowe, "Synthesis of sulphonium salts," *The Chemistry of the Sulphonium Group*, Ed. Stirling et al., Chapter 11, pp. 267-312, 1981, John Wiley & Sons Ltd.

Mar. 1, 2013 Office Action issued in U.S. Appl. No. 13/013,506.
Jul. 17, 2013 Office Action issued in U.S. Appl. No. 13/476,629.

* cited by examiner

POLYMER, CHEMICALLY AMPLIFIED RESIST COMPOSITION, AND PATTERNING PROCESS USING SAID CHEMICALLY AMPLIFIED RESIST COMPOSITION

BACKGROUND OF THE INVENTION

1. Field of the Invention

The present invention relates to (1) a polymer, (2) a chemically amplified resist composition containing the said polymer, and (3) a patterning process using the said chemically amplified resist composition. Meanwhile, a high energy beam in the present invention includes a ultraviolet beam, a deep ultraviolet beam, an electron beam, an EUV, an X-ray, an excimer laser beam, a γ-beam, and a synchrotron radiation beam.

2. Description of the Related Art

In recent years, as LSI progresses toward a high integration and a further acceleration in speed, a miniaturization of a pattern rule is being sought; and in this trend, deep ultraviolet beam lithography and vacuum ultraviolet lithography are considered to be viable next generation microprocessing technologies. In particular, a photolithography using an ArF excimer laser beam as a light source is an indispensable technology for ultramicroprocessing with the size of 0.13 μm or less.

The ArF lithography had been partly used since manufacturing of the device with the node of 130 nm; and this became a mainstream lithography technology since the device with the node of 90 nm. As the next lithography technology for the node of 45 nm, the lithography using an $F_2$ laser beam having a wavelength of 157 nm had been considered to be viable at first; but delay of development thereof was expected due to some problems. Then, the ArF immersion lithography, in which a liquid having a higher refractive index than an air, such as water, ethylene glycol, and glycerin, is inserted between a projector lens and a wafer thereby enabling to design the projector lens having the numerical aperture (NA) of 1.0 or more so as to accomplish high resolution, has been receiving an attention rapidly (for example, see Journal of Photopolymer Science and Technology, Vol. 17, No. 4, p 587 (2004)); and this technology is now in the stage of practical use. In this immersion lithography, a resist composition not easily leaching into water is required.

In the ArF lithography, a resist composition having high sensitivity capable of achieving sufficient resolution with small exposure dose thereby deterioration of an expensive optical material of a high precision may be avoided is required; and to this end, selection of a component that is highly transparent at the wavelength of 193 nm is the most generally used measure. For example, polyacrylic acid and its derivative, an alternative copolymer of norbornene and maleic anhydride, polynorbornene and a ring-opened metathesis polymer, and a hydrogenated ring-opened metathesis polymer have been proposed as the base polymer thereof; and this approach has been giving somewhat satisfactory results in terms of enhancing transparency of the resin itself.

To achieve high resolution, various photo acid generators and additives have been investigated. For example, it is generally known that high resolution can be obtained by adding a basic compound such as an amine as a quencher to control diffusion of an acid that is generated by photo-exposure. Alternatively, a function to control acid diffusion can also be acquired by using two or more photo acid generators wherein one of them is an onium salt generating a so-called weak acid (Japanese Patent Laid-Open (Kokai) No. 2010-155824 and Japanese Patent Laid-Open (Kokai) No. 2008-158339). That is, when an onium salt generating a strong acid such as a fluorinated sulfonic acid and an onium salt generating a weak acid such as a carboxylic acid and a sulfonic salt not substituted with a fluorine atom are used as a mixture of them, a strong acid generated from the photo acid generator by exposure to a high energy beam collides with the unreacted onium salt containing an weak acid whereby releasing the weak acid by a salt-exchange reaction and forming an onium salt having a strong acid anion. In this process, the strong acid is changed to the weak acid having a less catalytic performance; and thus, the acidic activity is apparently lost thereby resulting in that the acid diffusion can be controlled. Here, in the case that a photo acid generator generating a strong acid is an onium salt, the strong acid generated by exposure to a high energy beam can be changed to a weak acid, but a weak acid generated by exposure to a high energy beam cannot undergo a salt-exchange reaction by colliding with an unreacted onium salt generating a strong acid. These are caused by the phenomenon that the onium cation forms an ion pair with a stronger acid anion easily. However, an onium salt generating a weak acid is migratable and diffusible in itself in a resist composition thereby affecting lithography performance, causing leaching into an immersing liquid, and so on; and thus, there remains a problem in attaining high resolution.

Further, a resin-bonding type onium salt whose weakly acidic anion is bonded to a resin has been developed (WO2010119910 and Japanese Patent Laid-Open (Kokai) No. 2011-37834). With this, it became possible to control migration and diffusion of the onium salt having a weak acid; but there still remains a problem in overcoming a defect such as peel-off of a resist pattern from a substrate, the phenomenon often found in a resist added with a weakly acidic anion.

SUMMARY OF THE INVENTION

The present invention was made in view of the situation mentioned above and has an object to provide, in a photolithography using a high energy beam such as an ArF excimer laser beam and an EUV as a light source, (1) a polymer that gives a resist composition having an appropriate adhesion with a substrate and being capable of forming a pattern having excellent resolution, especially an excellent rectangular pattern profile, (2) a chemically amplified resist composition containing the said polymer, and (3) a patterning process using the said chemically amplified resist composition.

To solve the problems mentioned above, according to the present invention, provided is a polymer having a repeating unit shown by the following general formula (1),

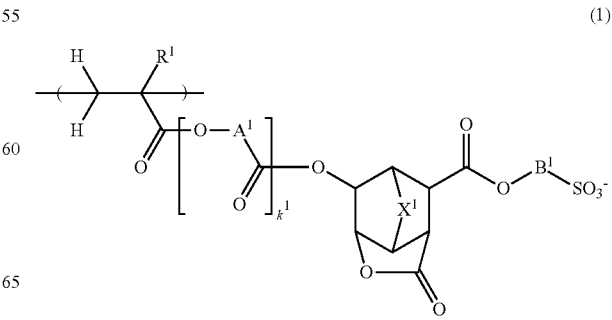

-continued $$\begin{array}{c} R^2 \\ | \\ {}^+S-R^3 \\ | \\ R^4 \end{array}$$

wherein, $R^1$ represents any of a hydrogen atom, a fluorine atom, a methyl group, and a trifluoromethyl group. Each $R^2$, $R^3$, and $R^4$ independently represents any of a substituted or an unsubstituted linear, branched, or cyclic alkyl, alkenyl, and oxoalkyl group having 1 to 10 carbon atoms; or any of a substituted or an unsubstituted aryl, aralkyl, and aryl oxoalkyl group having 6 to 18 carbon atoms; or any two or more of $R^2$, $R^3$, and $R^4$ may be bonded with each other to form a ring together with a sulfur atom in the formula. $X^1$ represents O or $CH_2$. $A^1$ represents a linear, a branched, or a cyclic divalent hydrocarbon group having 1 to 10 carbon atoms. $B^1$ represents an alkylene group having 1 to 10 carbon atoms or an arylene group having 6 to 18 carbon atoms wherein these groups may optionally contain a hetero atom except for a fluorine atom. $k^1$ represents an integer of 0 or 1.

The repeating unit shown by the general formula (1) has a lactone structure as well as a sulfonium salt structure of a sulfonic acid not substituted with a fluorine atom in $B^1$. Because of these, when a polymer having a repeating unit like this is used as a base resin for a chemically amplified resist composition, migration and diffusion of a strong acid generated from an acid generator can be controlled appropriately thereby giving excellent rectangularity to a resist pattern obtained therefrom, and in addition, excellent adhesion with a substrate can be obtained. Further, leaching of an anionic component of the sulfonium salt is so small that this can be used suitably as a material especially for an immersion lithography.

Further, it is preferable that the polymer contain a repeating unit having an acid-labile group in addition to the repeating unit shown by the general formula (1).

The repeating unit contained in the polymer of the present invention, shown by the general formula (1), can function not only to control migration and diffusion of an acid but also to generate an acid in itself by selection of the acid-labile unit.

Further, the present invention provides a chemically amplified resist composition comprising (A) the said polymer, (B) an organic solvent, (C) a photo acid generator, and (D) a basic compound.

When a chemically amplified resist composition containing the polymer of the present invention is used in the way as mentioned above, a resist pattern having excellent rectangularity and adhesion with a substrate can be obtained.

In addition, the present invention provides a patterning process comprising a step of applying the chemically amplified resist composition onto a substrate, a step of heat treatment, a step of exposing to a high energy beam via a photomask, and a step of development by using a developer.

Further in addition, the present invention provides a patterning process comprising a step of applying the chemically amplified resist composition onto a substrate, a step of heat treatment, a step of coating with a top coat that is not soluble in water but soluble in an alkaline developer, a step of exposure to a high energy beam via a photomask while water is inserted between the substrate and a projector lens, and a step of development by using a developer.

According to the patterning process of the present invention as mentioned above, a resist pattern having excellent rectangularity and adhesion with a substrate can be obtained. In addition, leaching of an anionic component of the sulfonium salt is small; and thus, this can be used suitably as a material for an immersion lithography.

The chemically amplified resist composition of the present invention using a base resin of the polymer having a sulfonium salt comprising a sulfonate anion having a specific structure and a sulfonium cation having a specific structure shows excellent resolution, especially rectangularity of a pattern profile. In addition, because a lactone structure is contained in the repeating unit, the composition has excellent adhesion with a substrate and is resistant to pattern fall; and thus, the composition is very useful.

DETAILED DESCRIPTION OF THE PREFERRED EMBODIMENTS

Inventors of the present invention carried out extensive studies to accomplish the object mentioned above; and as a result, they found that the resist material using a resin composition having a repeating unit shown by the general formula (1), which has a sulfonate anion having a specific structure as a resist base resin showed excellent resist resolution, especially rectangularity of a pattern profile, excellent adhesion with a substrate, lesser degree of peel-off of a line-and-space pattern and the like, and extreme effectiveness for fine microprocessing as a resist material. With these findings, the present invention could be accomplished.

Hereinafter, the polymer, the chemically amplified resist composition, and the patterning process of the present invention will be explained in detail. Firstly, the polymer provided by the present invention contains a repeating unit shown by the following general formula (1),

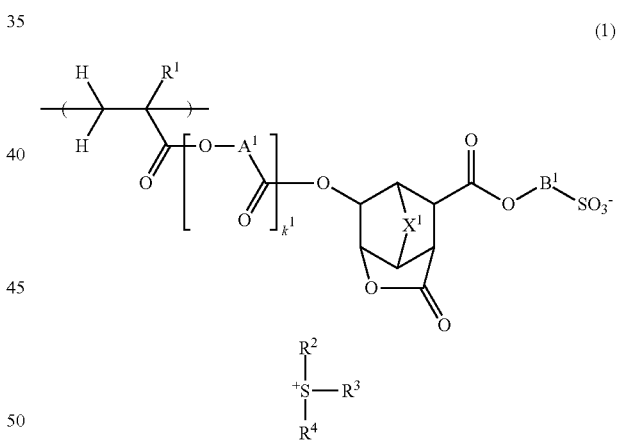

(1)

wherein, $R^1$ represents any of a hydrogen atom, a fluorine atom, a methyl group, and a trifluoromethyl group. Each $R^2$, $R^3$, and $R^4$ independently represents any of a substituted or an unsubstituted linear, branched, or cyclic alkyl, alkenyl, and oxoalkyl group having 1 to 10 carbon atoms; or any of a substituted or an unsubstituted aryl, aralkyl, and aryl oxoalkyl group having 6 to 18 carbon atoms; or any two or more of $R^2$, $R^3$, and $R^4$ may be bonded with each other to form a ring together with a sulfur atom in the formula. $X^1$ represents O or $CH_2$. $A^1$ represents a linear, a branched, or a cyclic divalent hydrocarbon group having 1 to 10 carbon atoms. $B^1$ represents an alkylene group having 1 to 10 carbon atoms or an arylene group having 6 to 18 carbon atoms wherein these groups may optionally contain a hetero atom except for a fluorine atom. $k^1$ represents an integer of 0 or 1.

Specific example of the alkylene group having 1 to 10 carbon atoms or the arylene group having 6 to 18 carbon atoms, wherein these groups may optionally contain a hetero atom except for a fluorine atom, shown by $B^1$ in the general formula (1), includes the followings, though not limited to them. Here, in the present invention, a hetero atom except for a fluorine atom refers to a nitrogen atom, oxygen atom, sulfur atom, and so on.

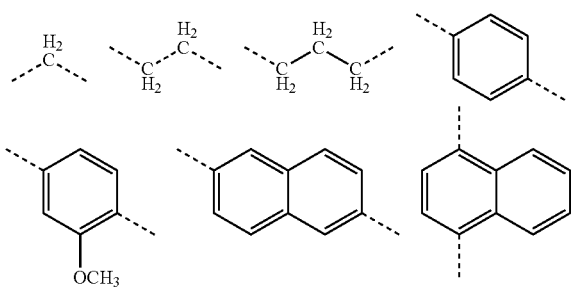

(In the formulae, broken lines show bonding hands.)

In the general formula (1), each $R^2$, $R^3$, and $R^4$ independently represents any of a substituted or unsubstituted linear, branched, or cyclic alkyl group, alkenyl group, and oxoalkyl group having 1 to 10 carbon atoms; any of a substituted or unsubstituted aryl, aralkyl, and aryl oxoalkyl group having 6 to 18 carbon atoms.

Specific example of the substituted or unsubstituted alkyl group includes a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, and an adamantly group.

Example of the substituted or unsubstituted alkenyl group includes a vinyl group, an allyl group, a propenyl group, a butenyl group, a hexenyl group, and a cyclohexenyl group.

Example of the substituted or unsubstituted oxoalkyl group includes a 2-oxocyclopentyl group, a 2-oxocyclohexyl group, a 2-oxopropyl group, a 2-oxoethyl group, a 2-cyclopentyl-2-oxoethyl group, a 2-cyclohexyl-2-oxoethyl group, and a 2-(4-methylcyclohexyl)-2-oxoethyl group.

Example of the substituted or unsubstituted aryl group includes a phenyl group, a naphthyl group, and a thienyl group; an alkoxyphenyl group such as a 4-hydroxy phenyl group, a 4-methoxy phenyl group, a 3-methoxy phenyl group, a 2-methoxy phenyl group, a 4-ethoxy phenyl group, a 4-tert-butoxy phenyl group, and a 3-tert-butoxy phenyl group; an alkyl phenyl group such as a 2-methyl phenyl group, a 3-methyl phenyl group, a 4-methyl phenyl group, a 4-ethyl phenyl group, a 4-tert-butyl phenyl group, a 4-n-butyl phenyl group, and a 2,4-dimethyl phenyl group; an alkyl naphthyl group such as a methyl naphthyl group and an ethyl naphthyl group; an alkoxy naphthyl group such as a methoxy naphthyl group and an ethoxy naphthyl group; a dialkyl naphthyl group such as a dimethyl naphthyl group and a diethyl naphthyl group; and a dialkoxy naphthyl group such as a dimethoxy naphthyl group and a diethoxy naphthyl group.

Example of the substituted or unsubstituted aralkyl group includes a benzyl group, a 1-phenylethyl group, and a 2-phenylethyl group.

Example of the substituted or unsubstituted aryl oxoalkyl group includes a 2-aryl-2-oxoethyl group such as a 2-phenyl-2-oxoethyl group, a 2-(1-naphthyl)-2-oxoethyl group, and a 2-(2-naphthyl)-2-oxoethyl group.

As to the case that any two or more of $R^2$, $R^3$, and $R^4$ are bonded with each other to form a ring together with a sulfur atom in the formula, example thereof includes the groups shown by the following formulae, though not limited to them.

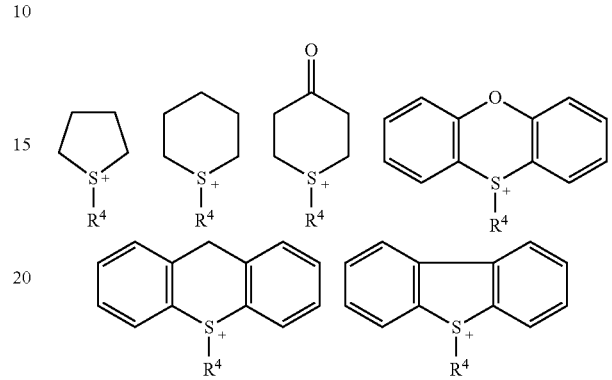

(In the formulae, $R^4$ represents the same meanings as described before.)

More specific example of the sulfonium cation includes a triphenyl sulfonium, a 4-hydroxyphenyl diphenyl sulfonium, a bis(4-hydroxyphenyl)phenyl sulfonium, a tris(4-hydroxyphenyl)sulfonium, a 4-tert-butoxyphenyl diphenyl sulfonium, a bis(4-tert-butoxyphenyl)phenyl sulfonium, a tris(4-tert-butoxyphenyl)sulfonium, a 3-tert-butoxyphenyl diphenyl sulfonium, a bis(3-tert-butoxyphenyl)phenyl sulfonium, a tris(3-tert-butoxyphenyl)sulfonium, a 3,4-di-tert-butoxyphenyl diphenyl sulfonium, a bis(3,4-di-tert-butoxyphenyl)phenyl sulfonium, a tris(3,4-di-tert-butoxyphenyl)sulfonium, a diphenyl (4-thiophenoxyphenyl)sulfonium, a 4-tert-butoxycarbonylmethyloxyphenyl diphenyl sulfonium, a tris(4-tert-butoxycarbonylmethyloxyphenyl)sulfonium, a (4-tert-butoxyphenyl) bis(4-dimethylaminophenyl)sulfonium, a tris(4-dimethylaminophenyl)sulfonium, a 2-naphthyl diphenyl sulfonium, a (4-hydroxy-3,5-dimethylphenyl) diphenyl sulfonium, a (4-n-hexyloxy-3,5-dimethylphenyl) diphenyl sulfonium, a dimethyl (2-naphthyl)sulfonium, a 4-hydroxyphenyl dimethyl sulfonium, a 4-methoxyphenyl dimethyl sulfonium, a trimethyl sulfonium, a 2-oxocyclohexyl cyclohexyl methyl sulfonium, a trinaphthyl sulfonium, a tribenzyl sulfonium, a diphenyl methyl sulfonium, a dimethyl phenyl sulfonium, a 2-oxo-2-phenylethyl thiacyclopentanium, a diphenyl 2-thienyl sulfonium, a 4-n-butoxynaphthyl-1-thiacyclopentanium, a 2-n-butoxynaphthyl-1-thiacyclopentanium, a 4-methoxynaphthyl-1-thiacyclopentanium, and a 2-methoxynaphthyl-1-thiacyclopentanium.

More preferable example thereof includes a triphenyl sulfonium, a 4-tert-butylphenyl diphenyl sulfonium, a 4-tert-butoxyphenyl diphenyl sulfonium, a tris(4-tert-butylphenyl)sulfonium, a tris(4-tert-butoxyphenyl)sulfonium, and dimethyl phenyl sulfonium.

In the general formula (1), $A^1$ represents a linear, a branched, or a cyclic divalent hydrocarbon group having 1 to 10 carbon atoms; and specific example thereof includes the followings.

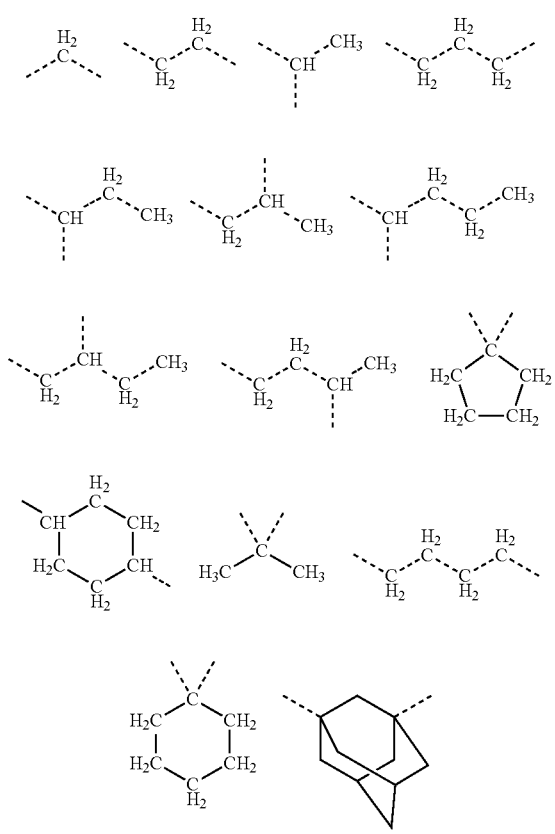
(In the formula, broken lines shown in the formulae indicate bonding hands.)
Specific example of the repeating unit shown by the general formula (1) includes the followings, but not limited to them.
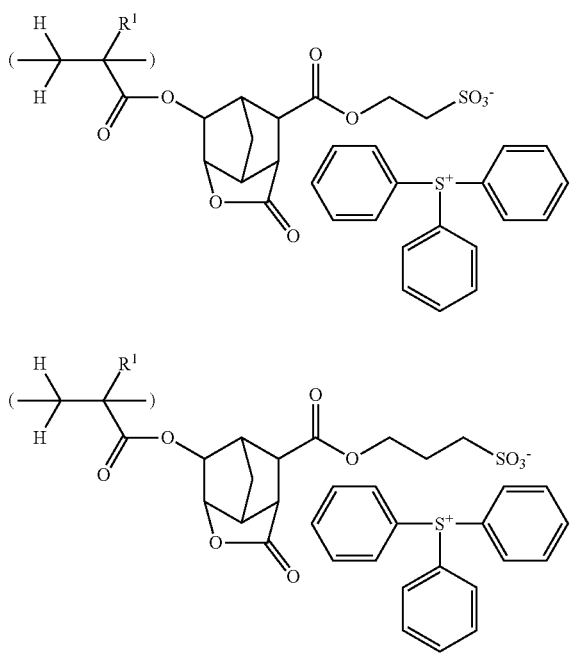
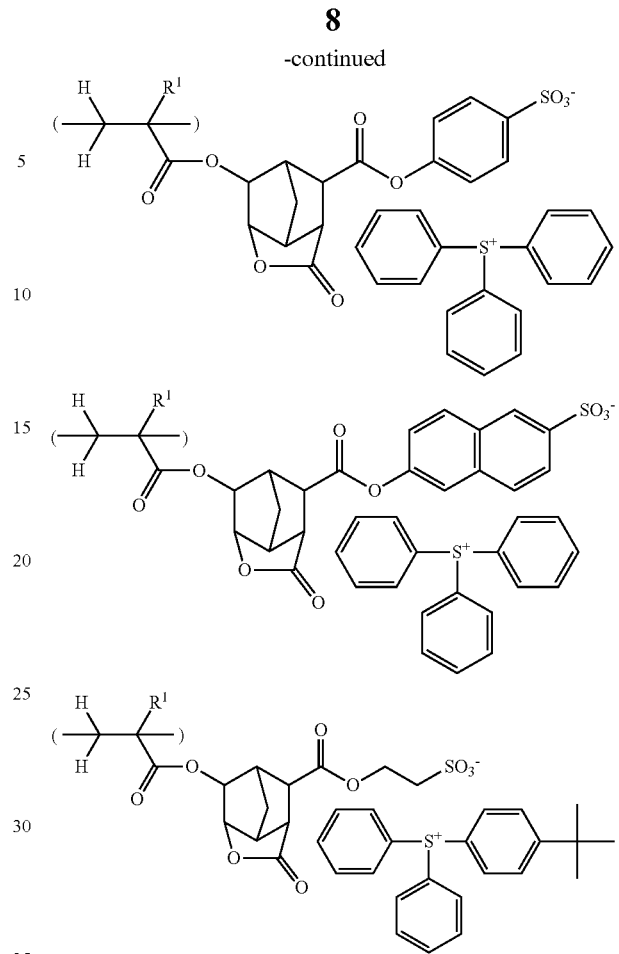
-continued
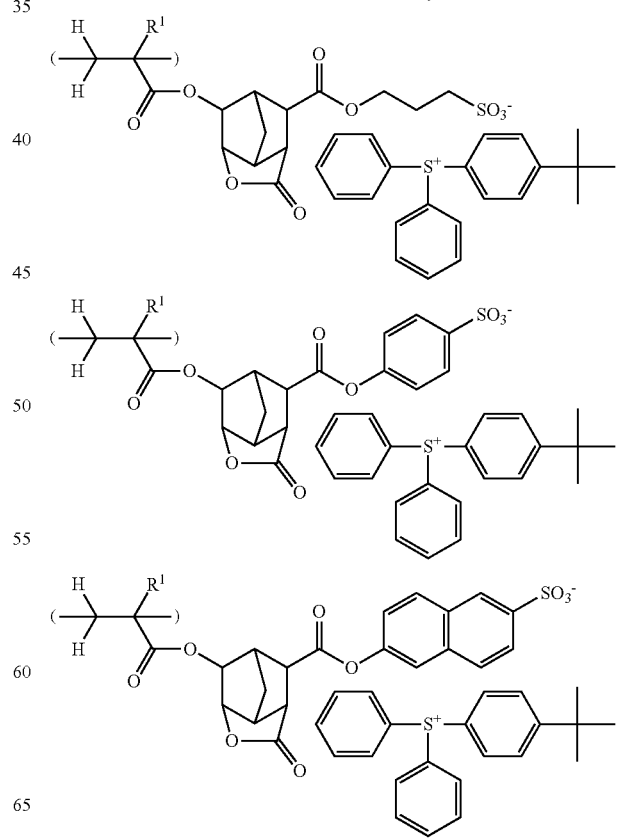

-continued
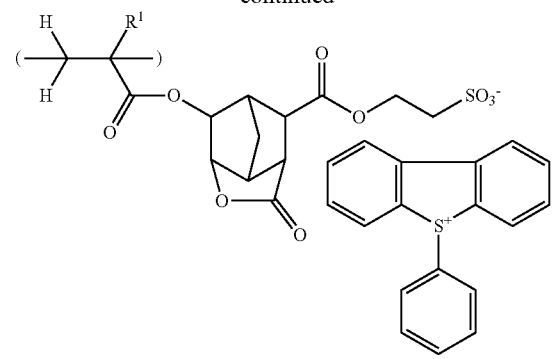
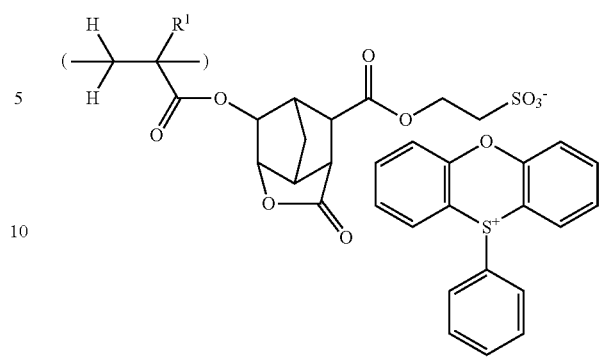
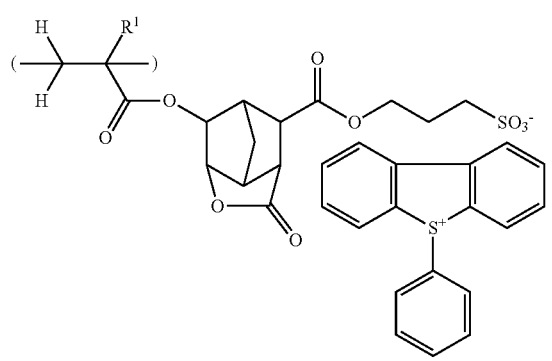
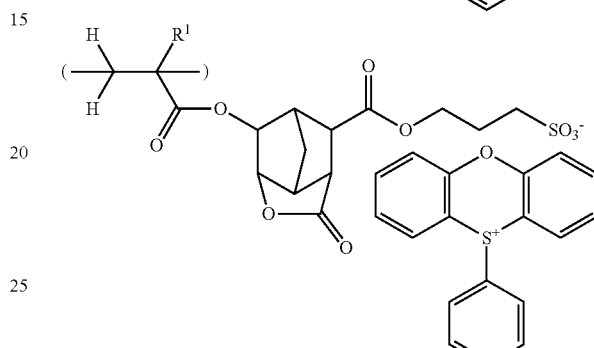
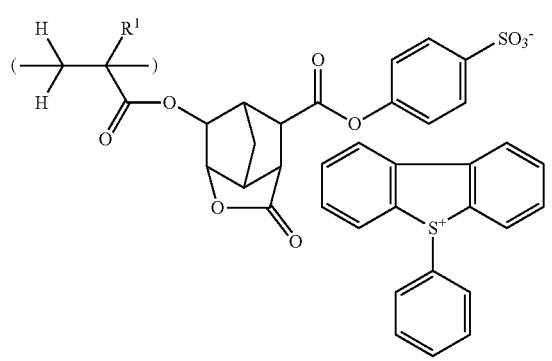
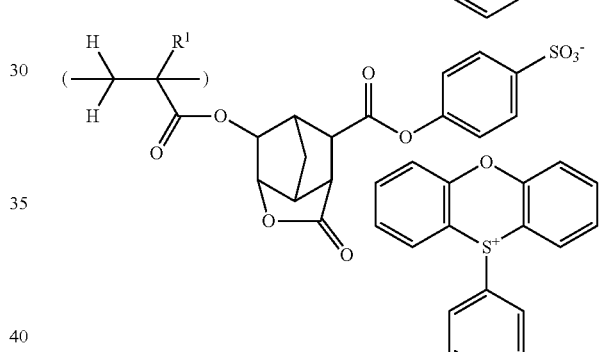
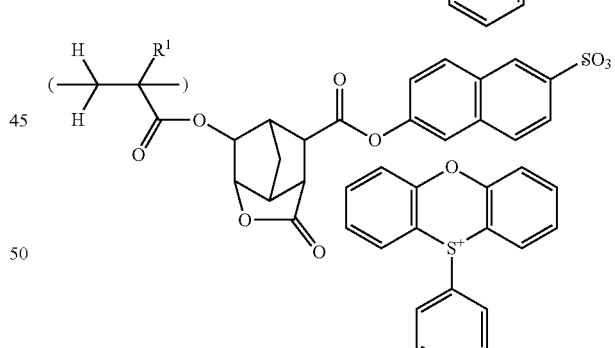
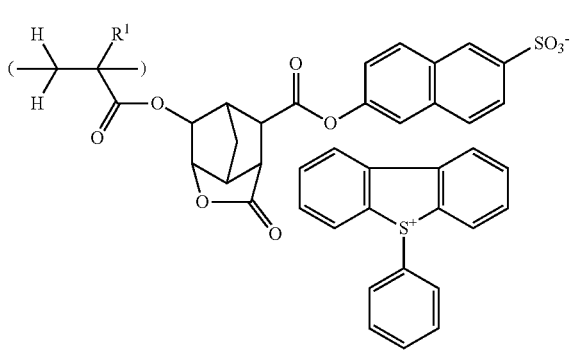
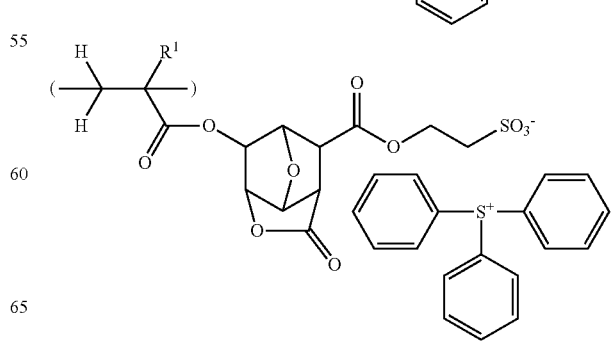
wherein, $R^1$ represents the same meanings as before.

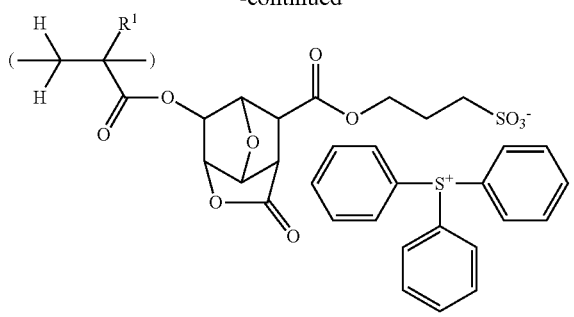
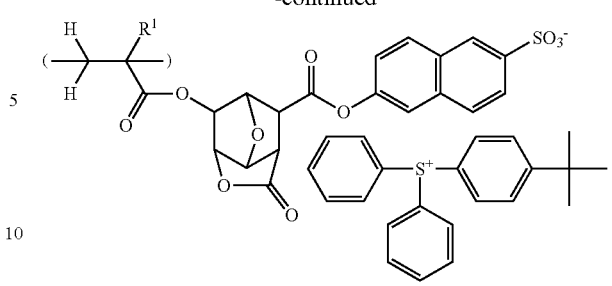
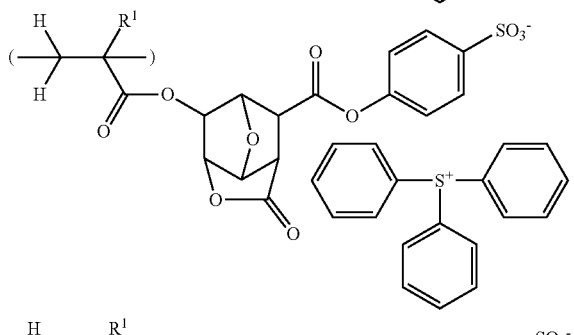
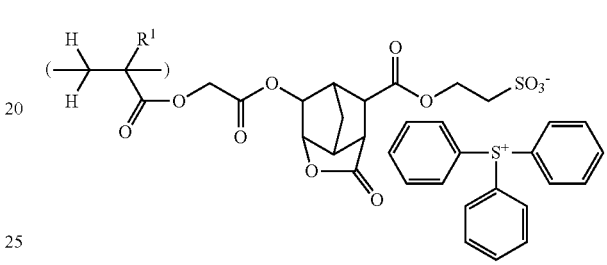
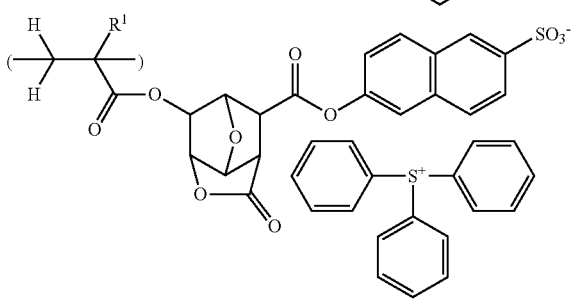
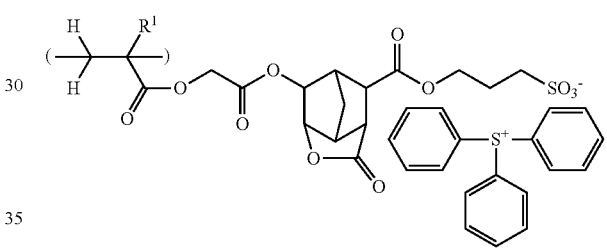
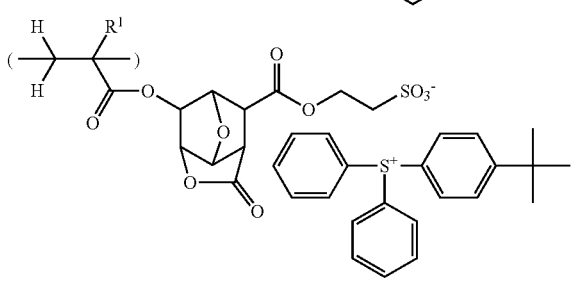
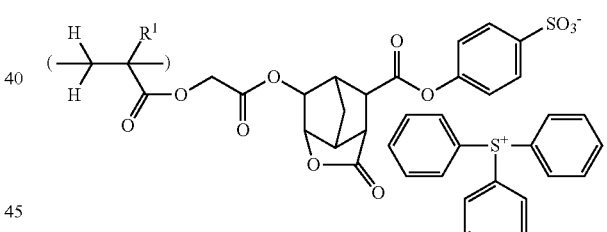
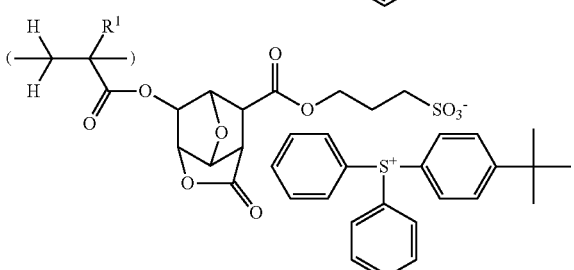
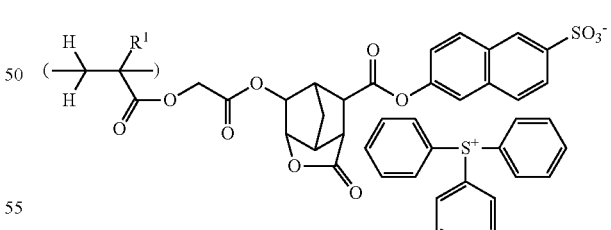
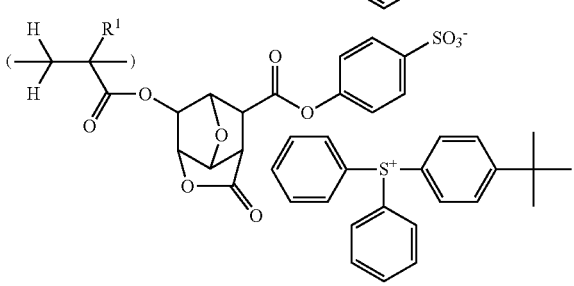
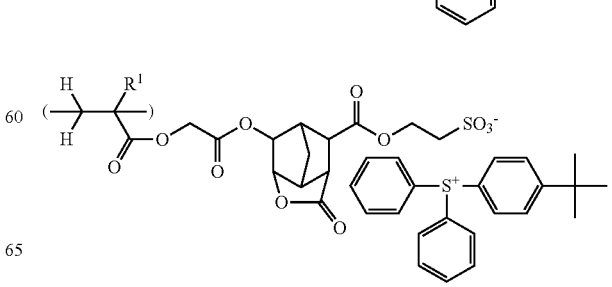
wherein, $R^1$ represents the same meanings as before.

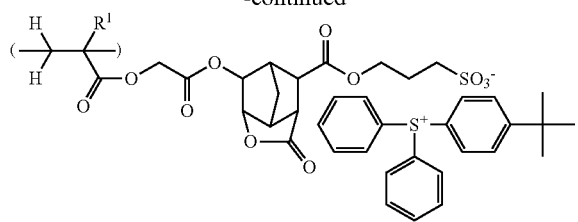
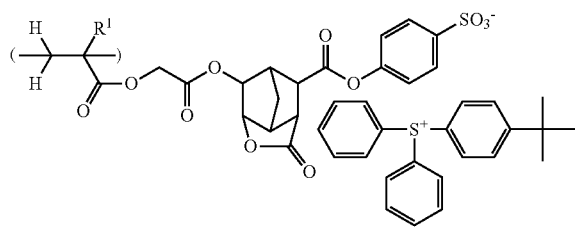
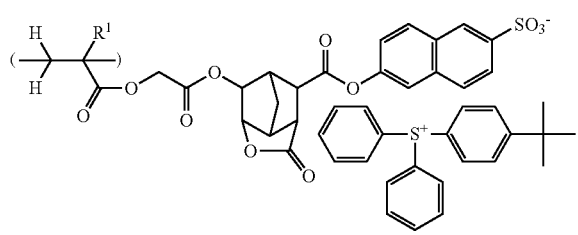
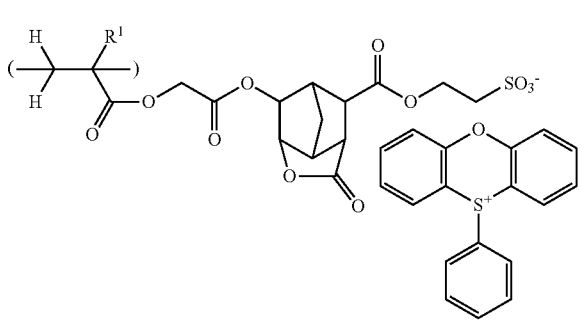
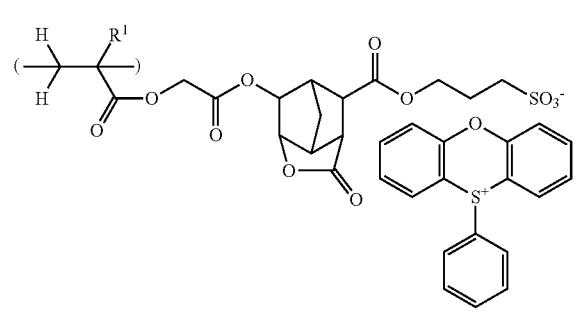
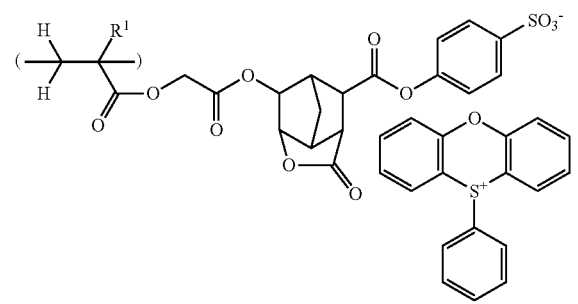
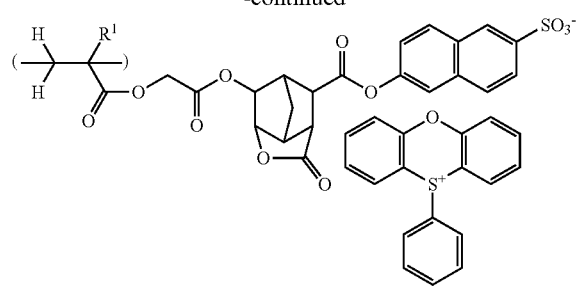
wherein, R¹ represents the same meanings as before.
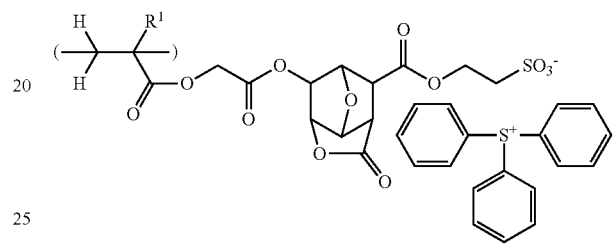
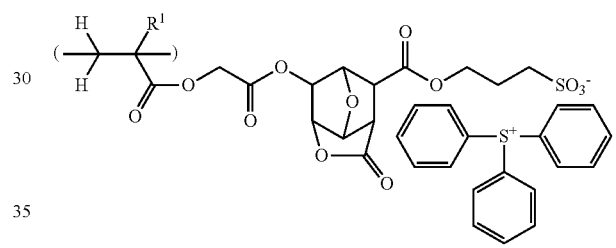
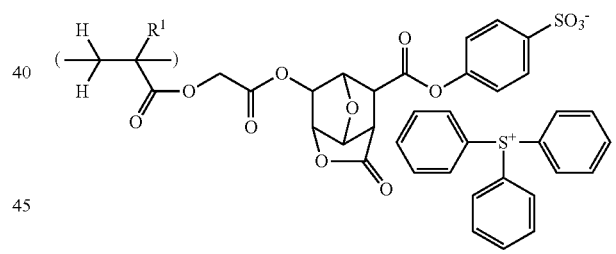
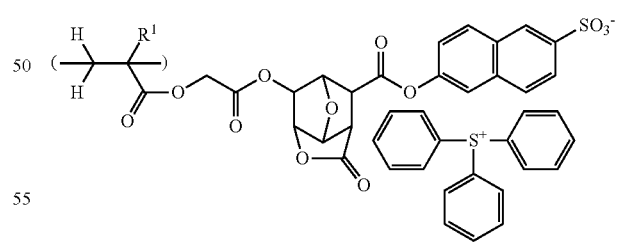
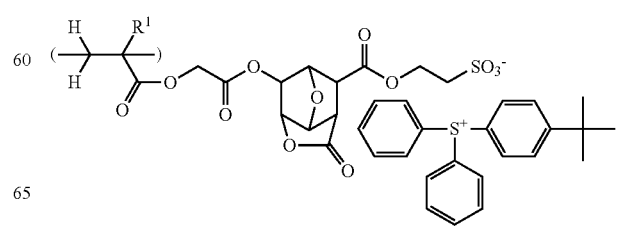

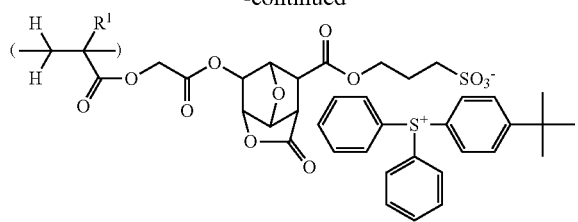
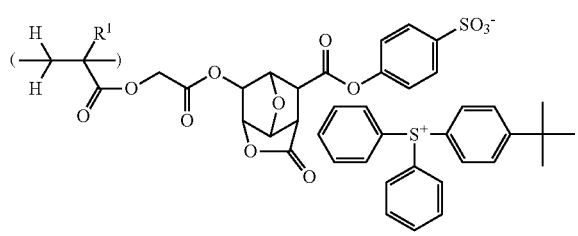
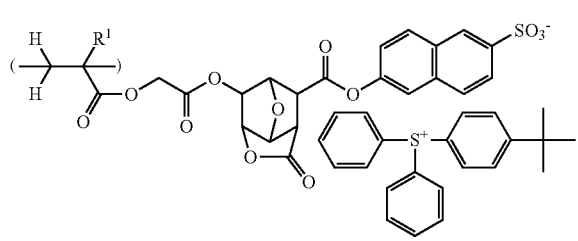
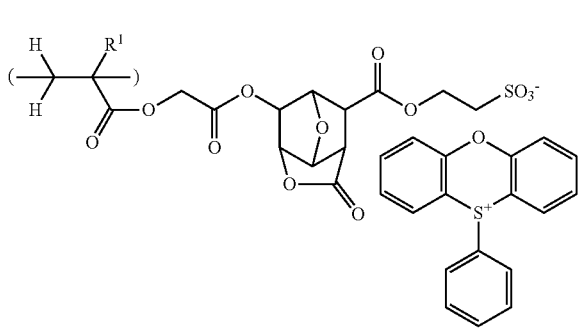
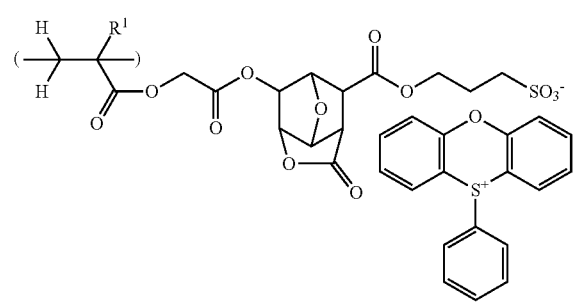
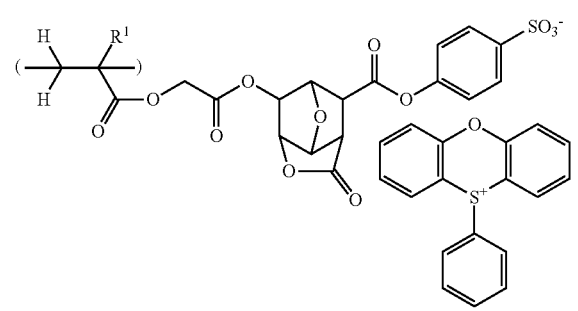
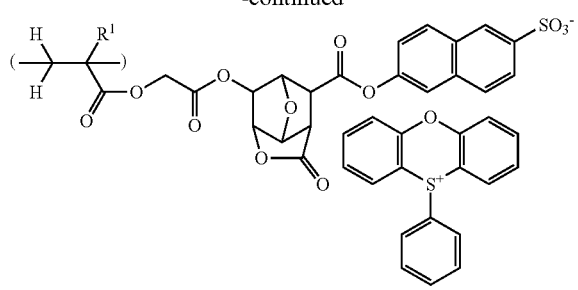
wherein, $R^a$ represents the same meanings as before.
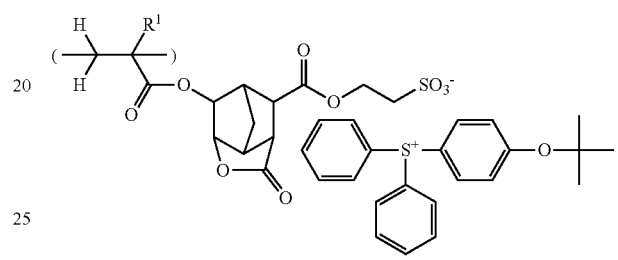
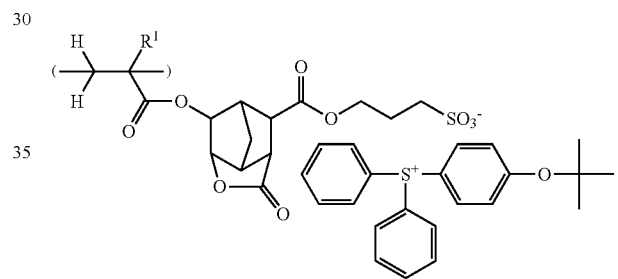
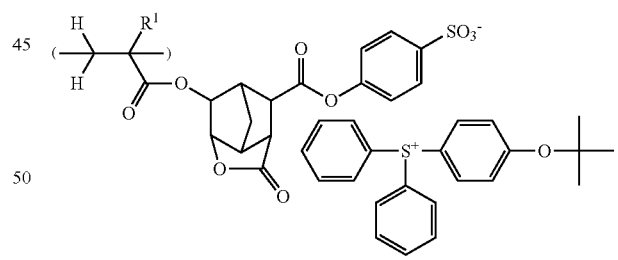
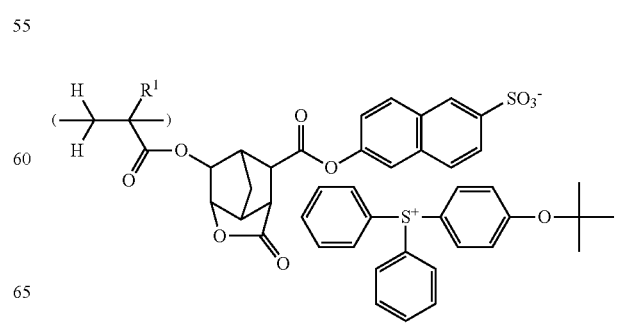

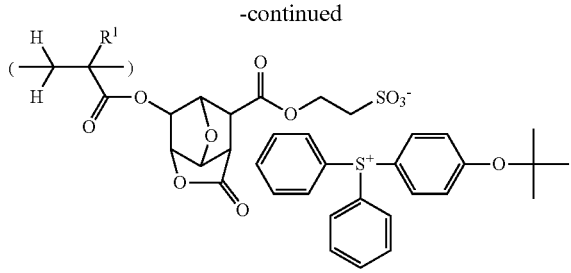
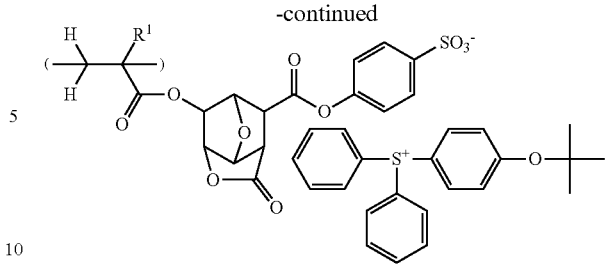
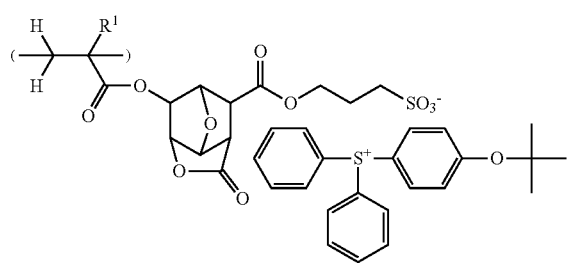
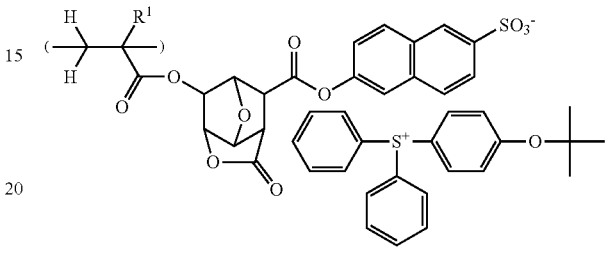
wherein, $R^1$ represents the same meanings as before.
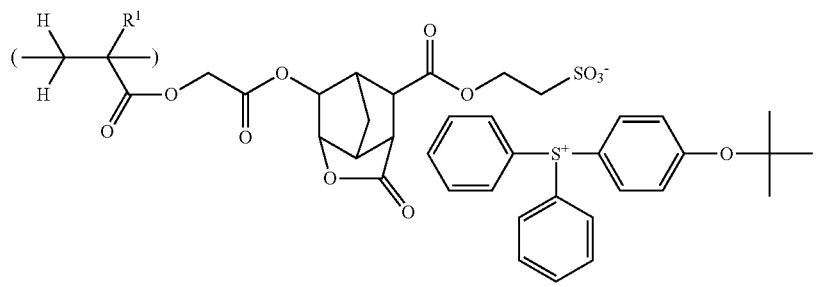
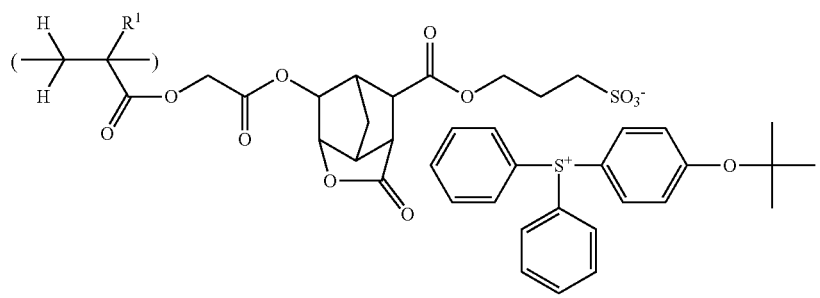
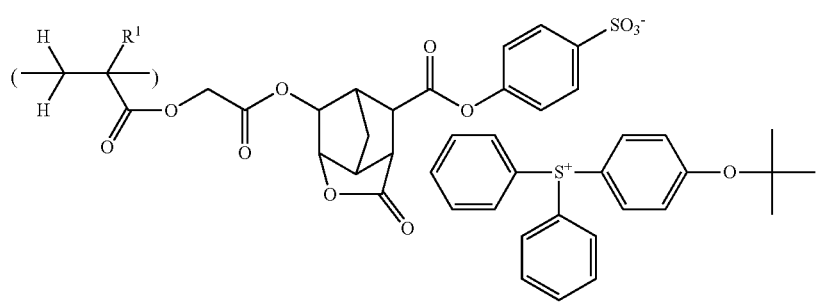

-continued
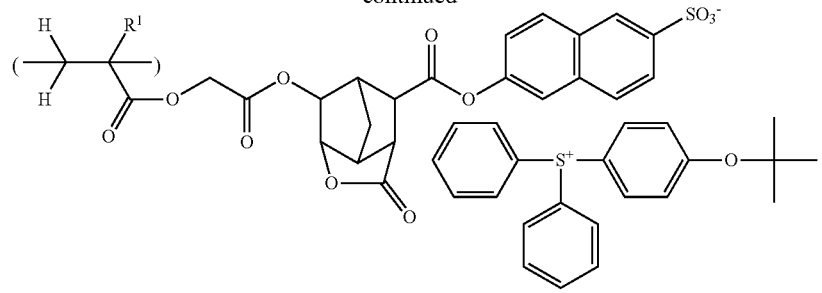
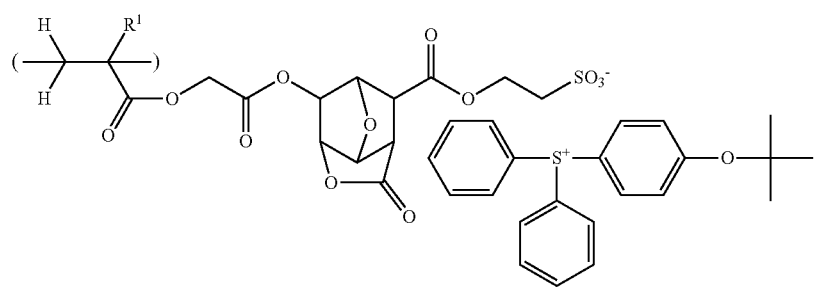
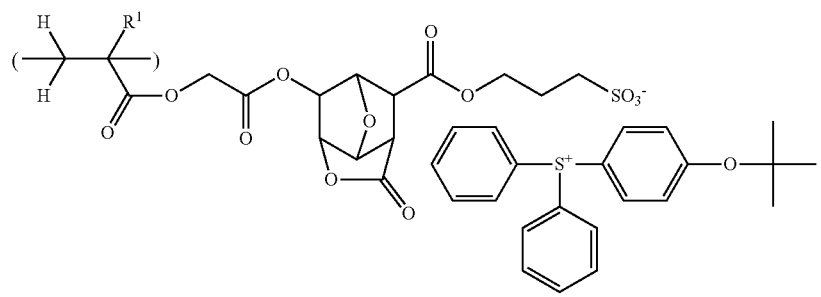
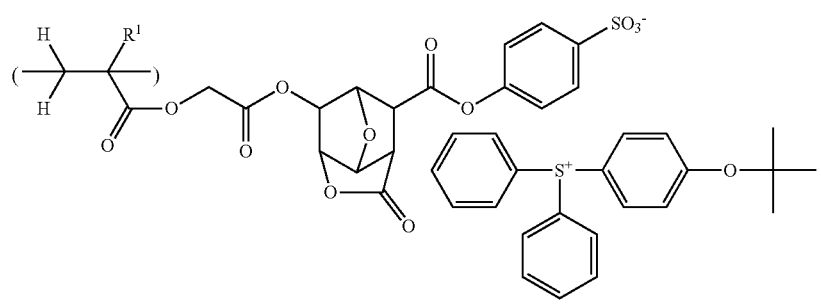
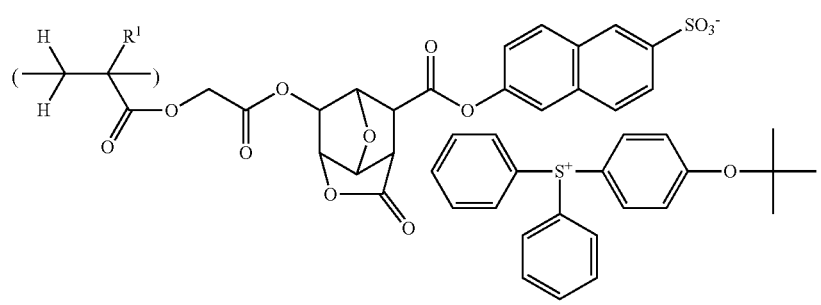

wherein, $R^1$ represents the same meanings as before.

Here, a monomer to obtain the repeating unit shown by the general formula (1) in the polymer of the present invention is a novel substance represented by the following general formula (1a).

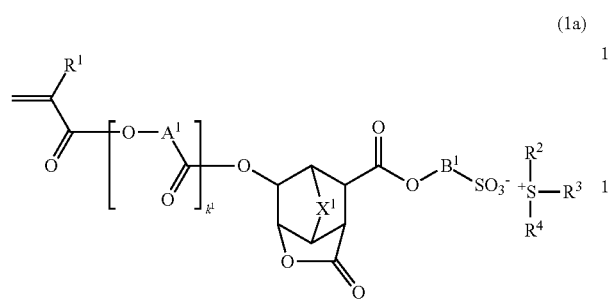

(1a)

wherein
$R^1$ represents any of a hydrogen atom, a fluorine atom, a methyl group, and a trifluoromethyl group, each $R^2$, $R^3$, and $R^4$ independently represents any of a substituted or an unsubstituted linear, branched, or cyclic alkyl, alkenyl, and oxoalkyl group having 1 to 10 carbon atoms; or any of a substituted or an unsubstituted aryl, aralkyl, and aryl oxoalkyl group having 6 to 18 carbon atoms; or any two or more of $R^2$, $R^3$, and $R^4$ may be bonded with each other to form a ring together with a sulfur atom in the formula, $X^1$ represents O or $CH_2$, $A^1$ represents a linear, a branched, or a cyclic divalent hydrocarbon group having 1 to 10 carbon atoms, $B^1$ represents an alkylene group having 1 to 10 carbon atoms or an arylene group having 6 to 18 carbon atoms wherein these groups may optionally contain a hetero atom except for a fluorine atom, and $k^1$ represents an integer of 0 or 1.

Illustrative example of the method to obtain the monomer (1a) is as following, though not limited to it. Hereinafter, the broken lines shown in the formulae indicate bonding hands,

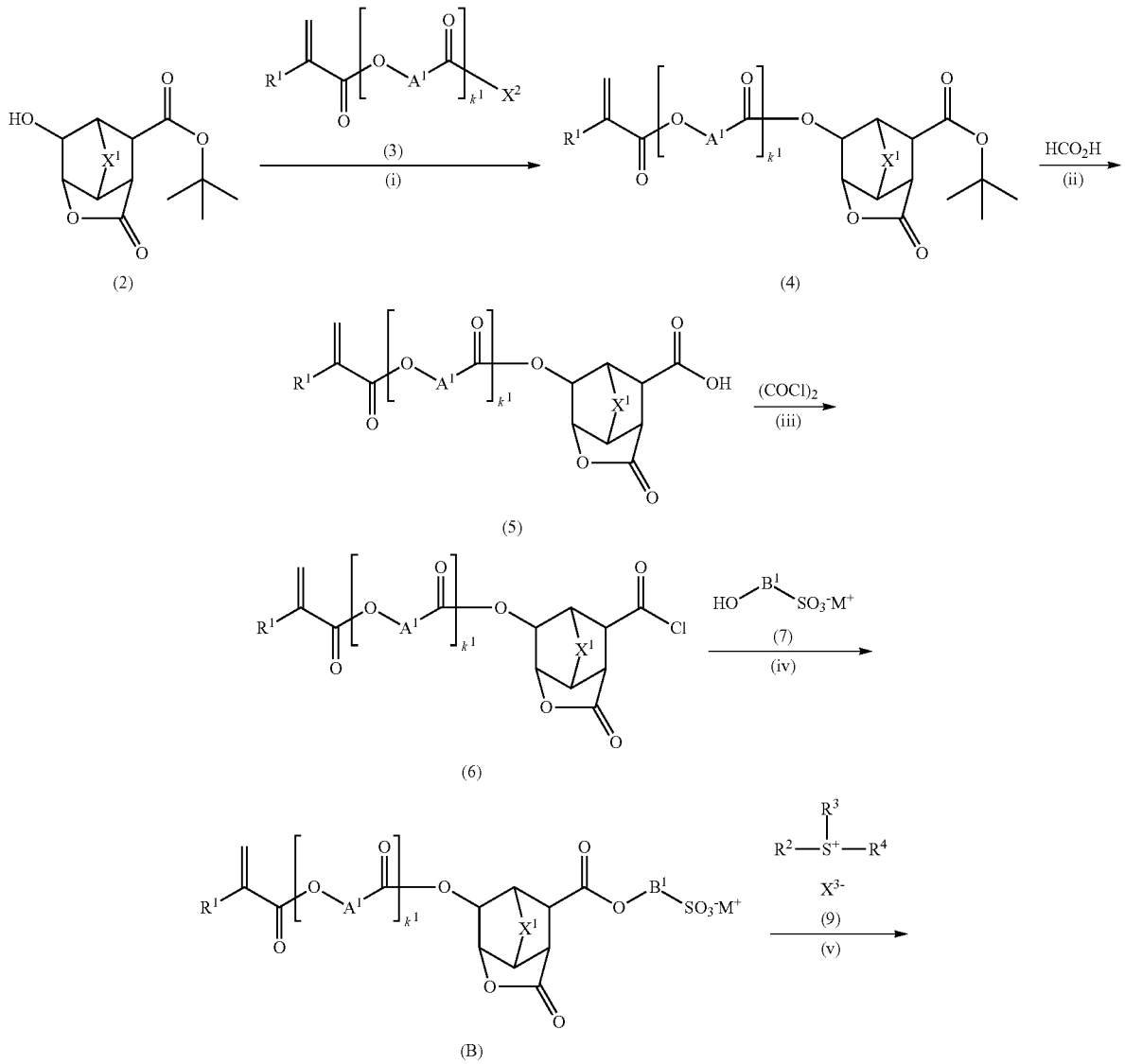

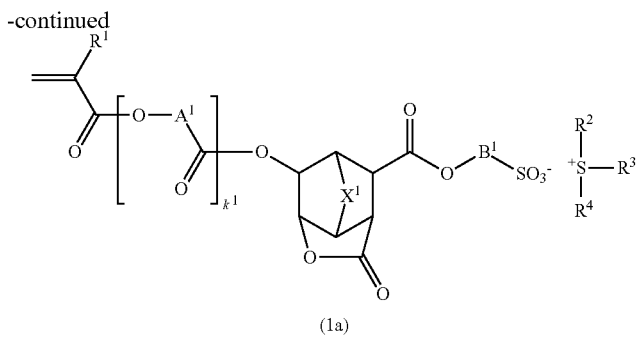

(1a)

wherein, $R^1$ to $R^4$, $X^1$, $A^1$, $B^1$, and $k^1$ represent the same meanings as before. $X^2$ represents a halogen atom, a hydroxyl group, an alkoxy group, or a substituent shown by the following general formula (10),

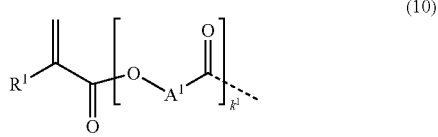

(10)

($R^1$, $A^1$, and $k^1$ represent the same meanings as before.) $M^+$ represents any of a lithium ion, a sodium ion, a potassium ion, and a substituted or unsubstituted ammonium ion. $X^{3-}$ represents a halide ion or a methylsulfate ion.

Meanwhile, in the case that $k^1$ in the general formula (1a) is 1, the compound (4) in the foregoing chemical reaction scheme can be obtained by the different method shown below,

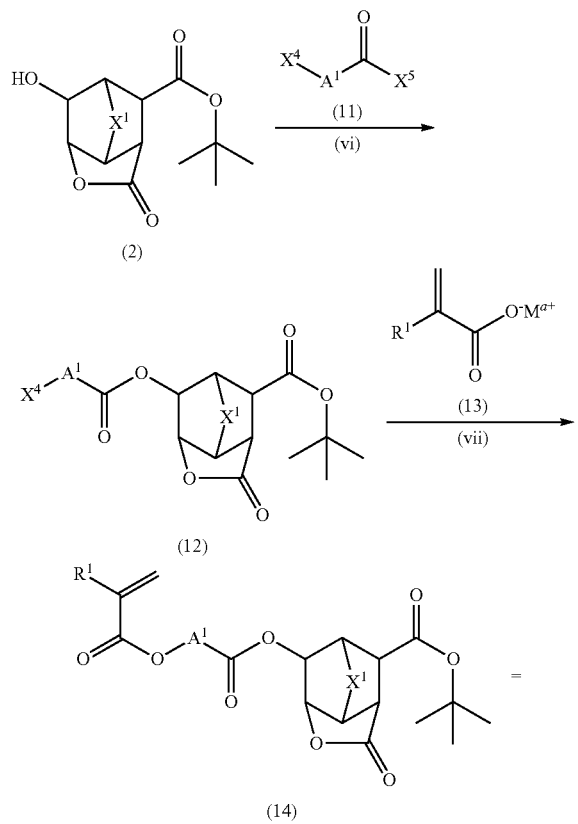

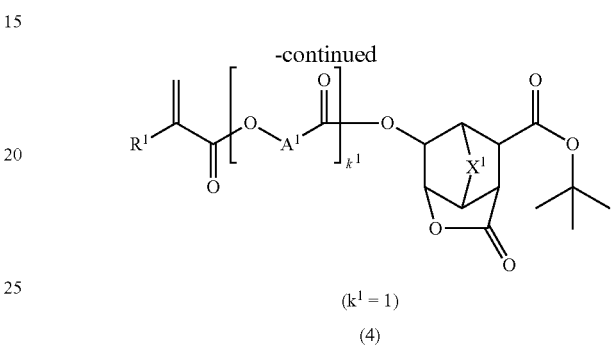

(4)

wherein, $X^1$, $R^1$, and $A^1$ represent the same meanings as before. $X^4$ represents a halogen atom. $X^5$ represents a halogen atom, a hydroxyl group, or an alkoxy group. $M^{a+}$ represents a lithium ion, a sodium ion, a potassium ion, a magnesium ion, a calcium ion, or a substituted or unsubstituted ammonium ion.

In the step (i), a hydroxyl lactone (2) is reacted with an esterification agent (3) to give the ester (4). Here, details of a synthesis method of the hydroxyl lactone (2) are described in Japanese Patent Laid-Open (kokai) No. 2000-159758 and Japanese Patent No. 4539865.

This reaction proceeds easily by a conventional method; and as to the esterification agent (3), an acid chloride (the case of $X^2$ in the formula (3) being a chlorine atom), an acid anhydride (the case of $X^2$ in the formula (3) being a substituent shown by the general formula (10)) or a carboxylic acid (the case of $X^2$ in the formula (3) being a hydroxyl group) is preferable.

In the case that an acid chloride or an acid anhydride is used as the esterification agent, the reaction may be suitably carried out as following; the hydroxyl lactone compound (2), a corresponding acid chloride or acid anhydride such as acryloyl chloride, methacryloyl chloride, acrylic anhydride, and methacrylic anhydride, and a base such as triethylamine, pyridine, and 4-dimethylaminopyridine are added sequentially or simultaneously into a solvent such as methylene chloride, toluene, hexane, diethyl ether, tetrahydrofurane, and acetonitrile or without using a solvent, and then the resulting mixture is heated or cooled as appropriate.

In the case that a carboxylic acid is used, the reaction may be suitably carried out as following; the hydroxyl lactone (2) and a corresponding carboxylic acid such as acrylic acid and methacylic acid are heated in the presence of an acid catalyst in a solvent such as toluene and hexane with removing generated water outside the system or the like if necessary. Illustrative example of the acid catalyst includes an inorganic acid such as hydrochloric acid, sulfuric acid, nitric acid, and perchloric acid, and an organic acid such as p-toluenesulfonic acid and benzenesulfonic acid.

In the step (ii), the tert-butyl ester moity of the tert-butyl ester (4) is deprotected by formic acid to obtain a carboxylic acid (5). The ester (4) is dissolved into formic acid as the solvent for it; and the carboxylic acid (5) can be obtained with stirring and with cooling or heating the reaction solution as appropriate.

In the step (iii), the carboxylic acid (5) is transformed to a corresponding acid chloride (6). The reaction may be suitably carried out by adding a chlorinating agent such as oxalyl dichloride sequentially or simultaneously with the carboxylic acid into such a solvent as methylene dichloride, toluene, hexane, diethyl ether, tetrahydrofurane, and acetonitrile; and then the resulting mixture is cooled or heated as appropriate.

In the step (iv), a nucleophilic substitution reaction of the acid chloride (6) with a sulfo alcohol (7) is carried out to obtain an onium salt (8). The reaction may be suitably carried out according to a usual method by adding, sequentially or simultaneously, the acid chloride (6), the sulfo alcohol (7), and a base into a solvent, and then the resulting mixture is cooled or heated as appropriate.

Illustrative example of the solvent usable in the reaction includes; water; an ether such as tetrahydrofurane, diethyl ether, diisopropyl ether, di-n-butyl ether, and 1,4-dioxane; a hydrocarbon such as n-hexane, n-heptane, benzene, toluene, and xylene; a nonprotonic polar solvent such as acetonitrile, dimethyl sulfoxide (DMSO), and N,N-dimethylformamide (DMF); and a chlorinated organic solvent such as methylene chloride, chloroform, and carbon tetrachloride. These solvents may be appropriately selected according to a reaction condition, and may be used singly or as a mixture of two or more of them.

Illustrative example of the base usable in the reaction shown by the step (iv) includes an amine such as ammonia, triethylamine, pyridine, lutidine, collidine, and N,N-dimethylaniline; a hydroxide such as sodium hydroxide, potassium hydroxide, and tetramethyl ammonium hydroxide; and a carbonate such as potassium carbonate and sodium hydrogen carbonate. These bases may be used singly or as a mixture of two or more of them.

In the step (v), an ion-exchange reaction of the onium salt (8) with a sulfonium salt (9) is carried out to obtain the polymerizable anion-containing sulfonium salt (1a). The onium salt (8) may be used after it is isolated by a usual post-tretament of an aqueous system after the reaction of step (iv) or without a particular post-tretament after stopping of the reaction.

In the case that the onium salt (8) once isolated is used, the onium salt (8) is dissolved into such a solvent as water, an ethers such as tetrahydrofurane, diethyl ether, diisopropyl ether, di-n-butyl ether, and 1,4-dioxane, a hydrocarbons such as n-hexane, n-heptane, benzene, toluene, and xylene, a nonprotonic polar solvents such as acetonitrile, dimethyl sulfoxide (DMSO), and N,N-dimethylformamide (DMF), and a chlorinated organic solvents such as methylene chloride, chloroform, and carbon tetrachloride, and then mixed with the sulfonium salt (9); the resulting mixture is cooled or heated as appropriate to obtain a reaction mixture. The polymerizable anion-containing sulfonium salt (1a) can be obtained from this reaction mixture by a usual post-treatment of an aqueous system (aqueous work-up); and purification thereof can be carried out by a conventional method such as distillation, recrystallization, and chromatography, as appropriate.

In the case that the onium salt (8) obtained without particular post-treatment after termination of the synthesis reaction of the onium salt (8) is used, the polymerizable anion-containing sulfonium salt (1a) can be obtained by adding the sulfonium salt (9) into the mixture obtained after termination of the synthesis reaction of the onium salt (8), followed by cooling or heating the resulting mixture as appropriate. At this time, a solvent including water, an ethers such as tetrahydrofurane, diethyl ether, diisopropyl ether, di-n-butyl ether, and 1,4-dioxane, a hydrocarbons such as n-hexane, n-heptane, benzene, toluene, and xylene, a nonprotonic polar solvents such as acetonitrile, dimethyl sulfoxide (DMSO), and N,N-dimethylformamide (DMF), and a chlorinated organic solvents such as methylene chloride, chloroform, and carbon tetrachloride may be added thereinto. The polymerizable anion-containing sulfonium salt (1a) can be obtained from the reaction mixture by a usual aqueous work-up; and purification thereof can be carried out by a usual method such as distillation, recrystallization, and chromatography, as appropriate.

The steps (vi) and (vii) show an alternative method to obtain the ester (4) in the reaction scheme shown above in the case that $k^1$ represents 1 in the general formula (1a).

In the step (vi), the hydroxyl lactone (2) is reacted with an esterification agent (11) to obtain a halo ester (12). The reaction proceeds easily by a heretofore known method; but an acid chloride (the case of $X^5$ being a chlorine atom in the formula (11)) or a carboxylic acid (the case of $X^5$ being a hydroxyl group in the formula (11)) is particularly preferable as the esterification agent (11).

In the case that an acid chloride is used, the reaction may be suitably carried out as following; the hydroxyl lactone (2), a corresponding acid chloride such as 2-chloroacety chloride and 3-chloropropionyl chloride, and a base such as triethylamine, pyridine, and 4-dimethylaminopyridine are added sequentially or simultaneously into a solvent such as methylene chloride, acetonitrile, toluene, and hexane or without using a solvent; and then, the resulting mixture is heated or cooled as appropriate.

In the case that a carboxylic acid is used, the reaction may be suitably carried out by heating the hydroxyl lactone (2) and a corresponding carboxylic acid such as 2-chloroacetic acid and 3-chloropropionic acid in the presence of an acid catalyst in a solvent such as toluene and hexane with removing generated water outside the system or the like if necessary.

Illustrative example of the acid catalyst to be used includes an inorganic acid such as hydrochloric acid, sulfuric acid, nitric acid, and perchloric acid, and an organic acid such as p-toluenesulfonic acid and benzenesulfonic acid. It is preferable that, in view of the reaction yield, the reaction be stopped at the time when it is completed with following course of the reaction by a gas chromatography (GC) or a silica gel thin-layer chromatography (TLC); but the reaction time is usually about 0.5 to about 24 hours. The halo ester (12) can be obtained from the reaction mixture by a usual aqueous work-up; and purification thereof can be carried out by a conventional method such as distillation, recrystallization, and chromatography, if necessary.

The step (vii) is a reaction of the halo ester (12) with a carboxylic acid salt compound (13) to give the ester (14).

The reaction of the step (vii) may be carried out by a usual method. As to the carboxylic acid salt compound (13), a carboxylic acid salt compound such as various commercially available carboxylic acid metal salts may be used in the form as they are, or a carboxylic acid salt compound prepared in the reaction system from a corresponding carboxylic acid such as methacrylic acid and acrylic acid and a base may be used. Amount of the carboxylic acid salt compound (13) to be used is preferably 0.5 to 10 moles, or in particular 1.0 to 3.0 moles, relative to one mole of the raw material halo ester (12). When the use amount is less than 0.5 mole, there is a case of substantial decrease in the reaction yield because a large amount of the raw material remains; when the use amount is more than 10 moles, there is a disadvantageous case in cost because of an increased cost of the raw material and a lowered pot-yeild. Illustrative example of the base to prepare the carboxylic acid salt compound from the corresponding carboxylic acid and the base in the reaction system includes an amine such as ammonia, triethylamine, pyridine, lutidine, collidine, and N,N-dimethylaniline; a hydroxide such as sodium hydroxide, potassium hydroxide, and tetramethyl ammonium hydroxide; a carbonate such as potassium carbonate and sodium hydrogen carbonate; a metal such as sodium; a metal hydride such as sodium hydride; a metal alkoxide such as sodium methoxide and potassium t-butoxide; an organometallic compound such as butyl lithium and ethyl magnesium bromide; and a metal amide such as lithium diisopropylamide; and they may be used singly or as a mixture of two or more of them. Amount of the base to be used is preferably 0.2 to 10 moles, or in particular 0.5 to 2.0 moles, relative to one mole of the corresponding carboxylic acid. When the amount is less than 0.2 mole, there is an disadvantageous case in cost because a large amount of the carboxylic acid is wasted; and when the amount is more than 10 moles, there is a case of substantial decrease in the reaction yield because a side reaction may increase. It is preferable that, in view of the reaction yield, the reaction be stopped when it is completed with following course of the reaction by a gas chromatography (GC) or a silica gel thin-layer chromatography (TLC); but the reaction time is usually about 0.5 to about 24 hours. The polymerizable anion-containing sulfonium salt (1a) can be obtained from the reaction mixture by a usual aqueous workup; and purification thereof can be carried out by a usual method such as distillation, recrystallization, and chromatography, as appropriate.

The repeating unit shown by the general formula (1) contained in the polymer of the present invention has a lactone structure as well as a sulfonium salt structure of a sulfonic acid not substituted with a fluorine atom in $B^1$. Because of these, when the polymer like this is used as a base resin for a chemically amplified resist composition, migration and diffusion of a strong acid generated from an acid generator can be controlled appropriately; and in addition, it can be expected that a resist film is provided with excellent adhesion with a substrate.

The polymer of the present invention can contain a repeating unit having an acid-labile group concomitantly with the repeating unit shown by the general formula (1). The repeating unit containing this acid-labile group may include the repeating unit containing an acid-labile group shown by the following general formula (2A),

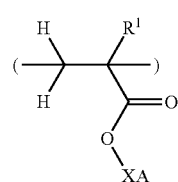
(2A)

wherein, $R^1$ represents the same meaning as before. XA represents an acid-labile group.

Hereinafter, the acid-labile unit will be explained in detail. The polymer having further the repeating unit shown by the general formula (2A) is the polymer that becomes alkaline-soluble by generating a carboxylic acid by action of an acid. Acid-labile groups XA shown by the following general formulae can be used.

(L1)

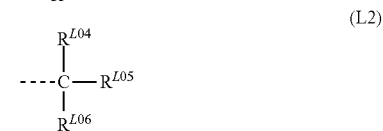
(L2)

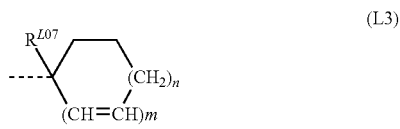
(L3)

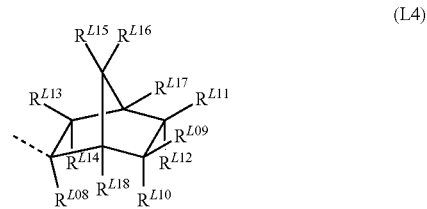
(L4)

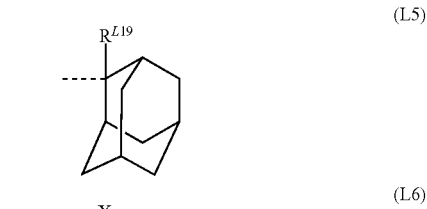
(L5)

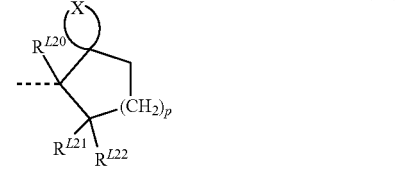
(L6)

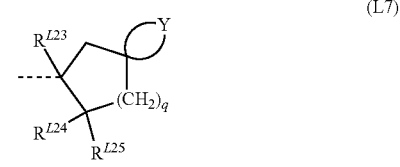
(L7)

(L8)

In the above formulae, the broken lines show bonding hands. $R^{L01}$ and $R^{L02}$ represent a hydrogen atom, or a linear, a branched, or a cyclic alkyl group having 1 to 18 carbon atoms, or preferably 1 to 10 carbon atoms. Specific example thereof includes a methyl group, an ethyl group, a propyl group, an isopropyl group, a n-butyl group, a sec-butyl group, a tert-butyl group, a cyclopentyl group, a cyclohexyl group, a 2-ethylhexyl group, a n-octyl group, and an adamantly group. $R^{L03}$ represents a monovalent hydrocarbon group having 1 to 18 carbon atoms, or preferably 1 to 10 carbon atoms and optionally containing a hetero atom such as an oxygen atom;

and this includes a linear, a branched, or a cyclic alkyl group, a part of whose hydrogen atoms may be optionally substituted with such groups as a hydroxyl group, an alkoxy group, an oxo group, an amino group, and an alkylamino group. Specific example of the linear, branched, or cyclic alkyl group includes those shown in $R^{L01}$ and $R^{L02}$; and example of the substituted alkyl group includes the following groups.

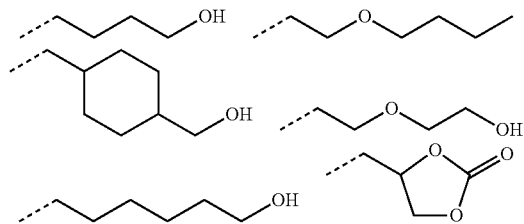

wherein, the broken lines show bonding hands.

$R^{L01}$ and $R^{L02}$, $R^{L01}$ and $R^{L03}$, and $R^{L02}$ and $R^{L03}$ may be bonded with each other to form a ring together with a carbon atom or an oxygen atom to which these groups are bonded; and in the case of forming the ring, $R^{L01}$ and $R^{L02}$, $R^{L01}$ and $R^{L03}$, and $R^{L02}$ and $R^{L03}$ that are involving in the ring formation respectively represent a linear or a branched alkylene group having 1 to 18 carbon atoms, or preferably 1 to 10 carbon atoms.

Each of $R^{L04}$, $R^{L05}$, and $R^{L06}$ independently represents a linear, a branched, or a cyclic alkyl group having 1 to 15 carbon atoms. Specific example thereof includes a methyl group, an ethyl group, a propyl group, an isopropyl group, a n-butyl group, a sec-butyl group, a tert-butyl group, a cyclopentyl group, a cyclohexyl group, a 2-ethylhexyl group, a n-octyl group, a 1-adamantyl group, and a 2-adamantyl group.

$R^{L07}$ represents an optionally substituted linear, branched, or cyclic alkyl group having 1 to 10 carbon atoms, or an optionally substituted aryl group having 6 to 20 carbon atoms. Specific example of the optionally substituted alkyl group includes a linear, a branched, or a cyclic alkyl group such as a methyl group, an ethyl group, a propyl group, an isopropyl group, a n-butyl group, a sec-butyl group, a tert-butyl group, a tert-amyl group, a n-pentyl group, a n-hexyl group, a cyclopentyl group, a cyclohexyl group, and a bicyclo[2.2.1]heptyl group; the said groups whose part of hydrogen atoms is substituted with such groups as a hydroxyl group, an alkoxy group, a carboxyl group, an alkoxy carbonyl group, an oxo group, an amino group, an alkylamino group, a cyano group, a mercapto group, an alkylthio group, and a sulfo group; and the said groups whose part of methylene group is substituted with an oxygen atom or a sulfur atom. Specific example of the optionally substituted ary group includes a phenyl group, a methylphenyl group, a naphthyl group, an anthryl group, a phenanthryl group, and a pyrenyl group. In the formula (L3), "m" represents 0 or 1, "n" represents any of 0, 1, 2, and 3, while they are the numbers satisfying 2m+2=2 or 3.

$R^{L08}$ represents an optionally substituted linear, branched, or cyclic alkyl group having 1 to 10 carbon atoms, or an optionally substituted aryl group having 6 to 20 carbon atoms. Specific example thereof includes the same groups as shown in $R^{L07}$. Each of $R^{L09}$ to $R^{L18}$ independently represents a hydrogen atom or a monovalent hydrocarbon group having 1 to 15 carbon atoms. Specific example thereof includes a linear, a branched, or a cyclic alkyl group such as a methyl group, an ethyl group, a propyl group, an isopropyl group, a n-butyl group, a sec-butyl group, a tert-butyl group, a tert-amyl group, a n-pentyl group, a n-hexyl group, a n-octyl group, a n-nonyl group, a n-decyl group, a cyclopentyl group, a cyclohexyl group, a cyclopentylmethyl group, a cyclopentylethyl group, a cyclopentylbutyl group, a cyclohexylmethyl group, a cyclohexylethyl group, and a cyclohexylbutyl group; and the said groups whose part of hydrogen atoms is substituted with such groups as a hydroxyl group, an alkoxy group, a carboxyl group, an alkoxy carbonyl group, an oxo group, an amino group, an alkylamino group, a cyano group, a mercapto group, an alkylthio group, and a sulfo group. $R^{L09}$ and $R^{L10}$, $R^{L09}$ and $R^{L11}$, $R^{L09}$ and $R^{L12}$, $R^{L10}$ and $R^{L12}$, $R^{L11}$ and $R^{L12}$, $R^{L13}$ and $R^{L14}$, $R^{L15}$ and $R^{L16}$, or $R^{L16}$ and $R^{L17}$ may be bonded with each other to form a ring; and in the case of forming the ring, $R^{L09}$ and $R^{L10}$, $R^{L09}$ and $R^{L11}$, $R^{L09}$ and $R^{L12}$, $R^{L10}$ and $R^{L12}$, $R^{R11}$ and $R^{L12}$, $R^{L13}$ and $R^{L14}$, $R^{L15}$ and $R^{L16}$, or $R^{L16}$ and $R^{L17}$ which involve in the ring formation represent a divalent hydrocarbon group having 1 to 15 carbon atoms, and specific example thereof includes a group having one hydrogen atom subtracted from the said monovalent hydrocarbon groups. Further, $R^{L09}$ and $R^{L11}$, $R^{L11}$ and $R^{L17}$, or $R^{L15}$ and $R^{L17}$ may be bonded with each other between neighboring carbon atoms to form a double bond without any intervention.

$R^{L19}$ represents an optionally substituted linear, branched, or cyclic alkyl group having 1 to 10 carbon atoms, or an optionally substituted aryl group having 6 to 20 carbon atoms; and specific example thereof includes the same groups as shown in $R^{L07}$.

$R^{L20}$ represents an optionally substituted linear, branched, or cyclic alkyl group having 1 to 10 carbon atoms, or an optionally substituted aryl group having 6 to 20 carbon atoms; and specific example thereof includes the same groups as shown in $R^{L07}$.

X represents a divalent group to form, together with a carbon atom to which this is bonded, a substituted or an unsubstituted cyclopentane, cyclohexane, or norbornane ring optionally containing a double bond. Each $R^{L21}$ and $R^{L22}$ independently represents a hydrogen atom, or a linear, a branched, or a cyclic monovalent hydrocarbon group having 1 to 10 carbon atoms. $R^{L21}$ and $R^{L22}$ may be bonded with each other to form a ring together with a carbon atom to which these groups are bonded; and in this case, these represent a divalent group to form a substituted or an unsubstituted cyclopentane or cyclohexane ring. "p" represents 1 or 2.

$R^{L23}$ represents an optionally substituted linear, branched, or cyclic alkyl group having 1 to 10 carbon atoms, or an optionally substituted aryl group having 6 to 20 carbon atoms; and specific example thereof includes the same groups as shown in $R^{L07}$.

Y represents a divalent group to form, together with a carbon atom to which this is bonded, a substituted or an unsubstituted cyclopentane, cyclohexane, or norbornane ring. Each $R^{L24}$ and $R^{L25}$ independently represents a hydrogen atom, or a linear, a branched, or a cyclic monovalent hydrocarbon group having 1 to 10 carbon atoms. $R^{L24}$ and $R^{L25}$ may be bonded with each other to form a ring together with a carbon atom to which these groups are bonded; and in this case, these represent a divalent group to form a substituted or an unsubstituted cyclopentane or cyclohexane ring. "q" represents 1 or 2.

$R^{L26}$ represents an optionally substituted linear, branched, or cyclic alkyl group having 1 to 10 carbon atoms, or an optionally substituted aryl group having 6 to 20 carbon atoms; and specific example thereof includes the same groups as shown in $R^{L07}$.

Z represents a divalent group to form, together with a carbon atom to which this is bonded, a substituted or an unsubstituted cyclopentane, cyclohexane, or norbornane ring. Each $R^{L27}$ and $R^{L28}$ independently represents a hydrogen atom, or a linear, a branched, or a cyclic monovalent hydrocarbon group having 1 to 10 carbon atoms. $R^{L27}$ and $R^{L28}$ may be bonded with each other to form a ring together with a carbon atom to which these groups are bonded; and in this case, these represent a divalent group to form a substituted or an unsubstituted cyclopentane or cyclohexane ring.

Among the acid-labile groups shown by the formula (L1), specific example of the linear or the branched group includes the following groups.

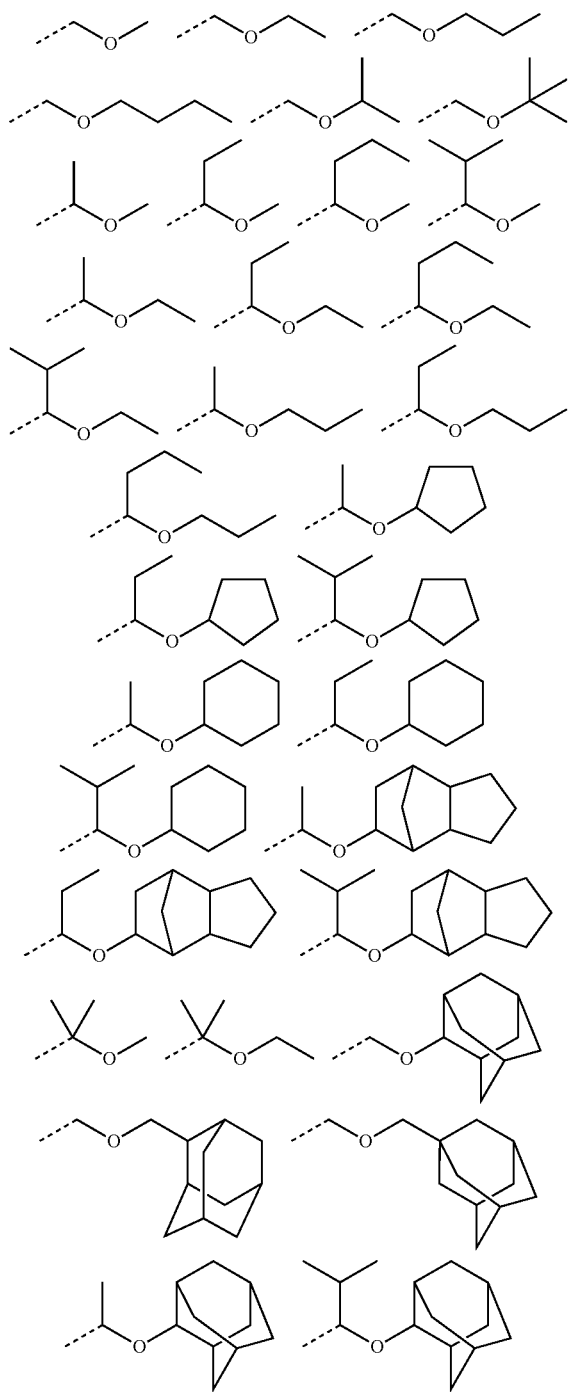

-continued

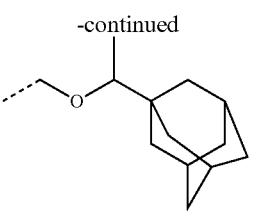

wherein, the broken lines show bonding hands.

Among the acid-labile groups shown by the formula (L1), specific example of the cyclic group includes a tetrahydrofurane-2-yl group, a 2-methyltetrahydrofurane-2-yl group, a tetrahydropyrane-2-yl group, and a 2-methyltetrahydropyrane-2-yl group.

Specific example of the acid-labile group shown by the formula (L2) includes a tert-butyl group, a tert-amyl group, and the groups shown below.

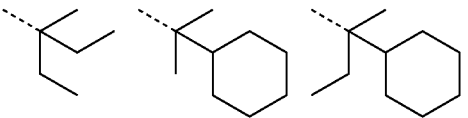
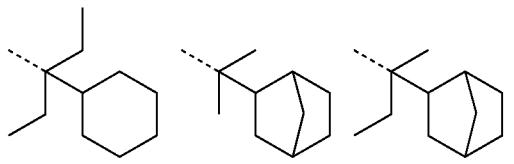
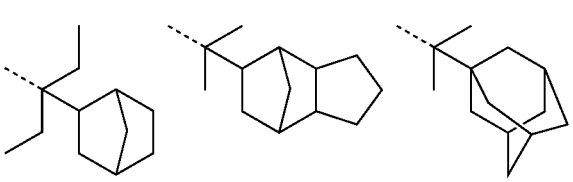
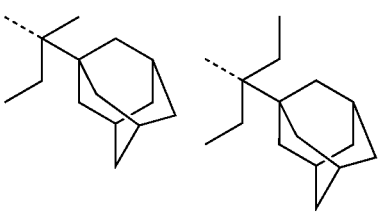

wherein, the broken lines show bonding hands.

Specific example of the acid-labile group shown by the formula (L3) includes a 1-methylcyclopentyl group, a 1-ethylcyclopentyl group, a 1-n-propylcyclopentyl group, a 1-isopropylcyclopentyl group, a 1-n-butylcyclopentyl group, a 1-sec-butylcyclopentyl group, a 1-cyclohexylcyclopentyl group, a 1-(4-methoxy-n-butyl)cyclopentyl group, a 1-(bicyclo[2.2.1]heptane-2-yl)cyclopentyl group, a 1-(7-oxabicyclo[2.2.1]heptane-2-yl)cyclopentyl group, a 1-methylcyclohexyl group, a 1-ethylcyclohexyl group, a 3-methyl-1-cyclopentene-3-yl group, a 3-ethyl-1-cyclopentene-3-yl group, a 3-methyl-1-cyclohexane-3-yl group, and a 3-ethyl-1-cyclohexene-3-yl group.

Especially preferable acid-labile groups shown by the formula (L4) are those shown by the following general formulae (L4-1) to (L4-4).

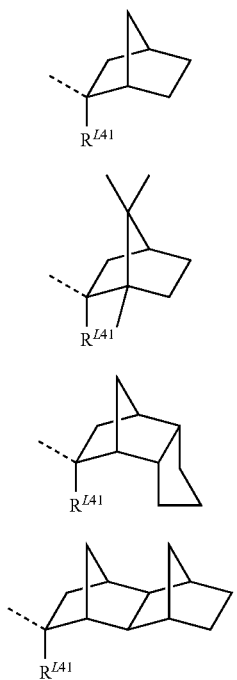

(L4-1)

(L4-2)

(L4-3)

(L4-4)

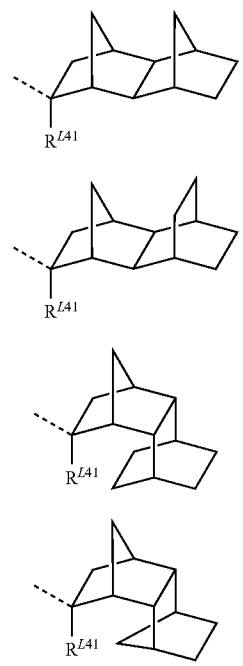

(L4-4-1)

(L4-4-2)

(L4-4-3)

(L4-4-4)

In the general formulae (L4-1) to (L4-4), the broken lines show bonding hands and bonding directions. Each $R^{L41}$ independently represents an optionally substituted linear, branched, or cyclic alkyl group having 1 to 10 carbon atoms, or an optionally substituted aryl group having 6 to 20 carbon atoms; specific example thereof includes a methyl group, an ethyl group, a propyl group, an isopropyl group, a n-butyl group, a sec-butyl group, a tert-butyl group, a tert-amyl group, a n-pentyl group, a n-hexyl group, a cyclopentyl group, and a cyclohexyl group.

It is possible that enantiomers and diastereomers exist in the formulae (L4-1) to (L4-4); and the formulae (L4-1) to (L4-4) represent all of these stereoisomers. These stereoisomers may be used singly or as a mixture of them.

For example, the formula (L4-3) represents one or a mixture of two or more kinds selected from the groups shown by the following general formulae (L4-3-1) and (L4-3-2).

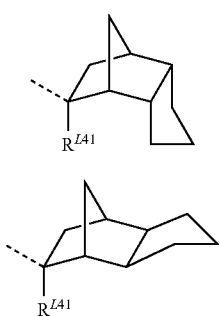

(L4-3-1)

(L4-3-2)

wherein, $R^{L41}$ represents the same meanings as before.

Further, the formula (L4-4) represents one or a mixture of two or more kinds selected from the groups shown by the following general formulae (L4-4-1) to (L4-4-4).

wherein, $R^{L41}$ represents the same meanings as before.

The formula (L4-3-1), (L4-3-2), and the formulae (L4-4-1) to (L4-4-4) represent enantiomers and enantiomer mixture thereof.

Meanwhile, when each bonding direction of the formulae (L4-1) to (L4-4), (L4-3-1) to (L4-3-2), and (L4-4-1) to (L4-4-4) is an exo position relative to the bicyclo[2.2.1]heptane ring, a high reactivity in the acid-catalyzed elimination reaction can be realized (see, Japanese Patent Laid-Open (Kokai) No. 2000-336121). In production of a monomer having a substituent of a tertiary exo-alkyl group having these bicyclo [2.2.1]heptane skeletons, a monomer having a substituent of an endo-alkyl group shown by the following general formulae (L4-1-endo) to (L4-4-endo) is sometimes contained; and in order to realize a good reactivity, the exo ratio thereof is preferably 50% or more, or more preferably 80% or more.

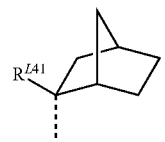

(L4-1-endo)

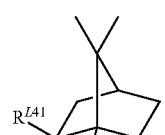

(L4-2-endo)

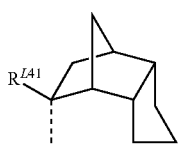

(L4-3-endo)

-continued (L4-4-endo)

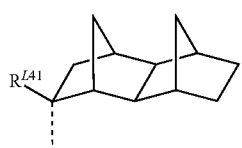

wherein, $R^{L41}$ represents the same meanings as before.

Specific example of the acid-labile group shown by the formula (L4) includes the following groups,

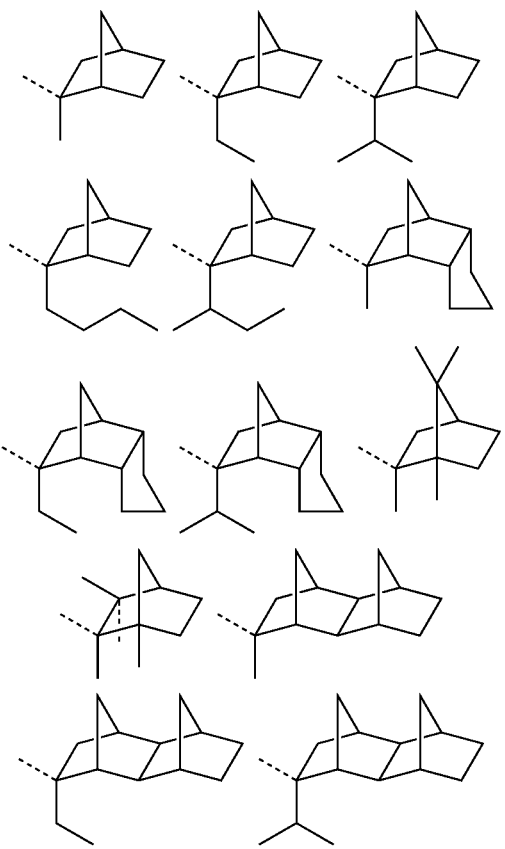

wherein, the broken lines show bonding hands.

Specific example of the acid-labile group shown by the formula (L5) includes the following groups,

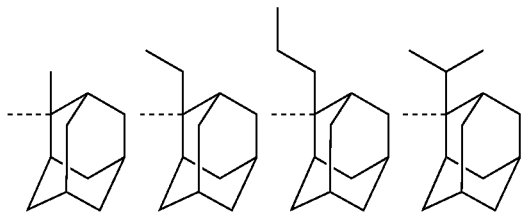

(In the formulae, the broken lines show bonding hands.)

Specific example of the acid-labile group shown by the formula (L6) includes the following groups.

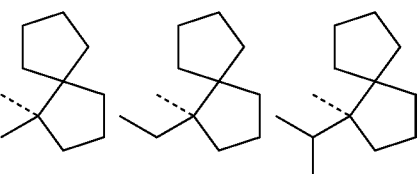
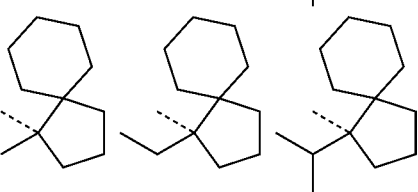
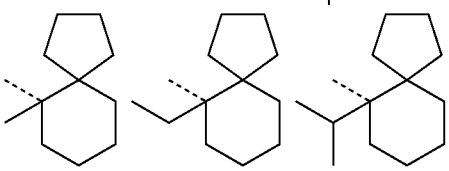
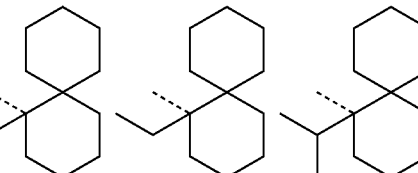
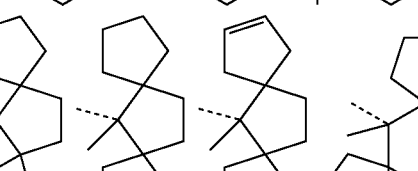
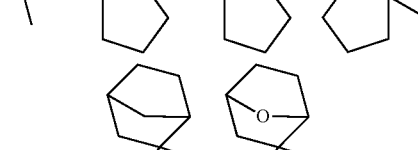

wherein, the broken lines show bonding hands.

Specific example of the acid-labile group shown by the formula (L7) includes the following groups,

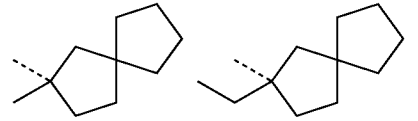
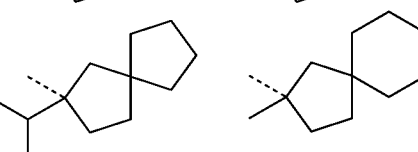
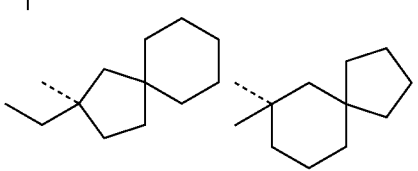

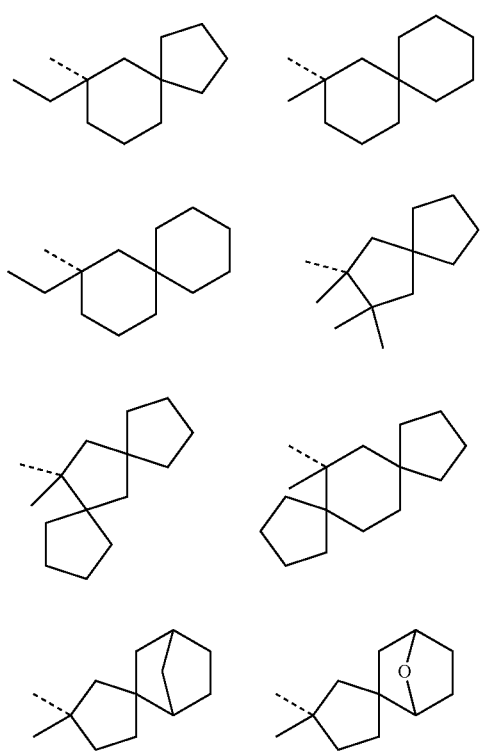
wherein, the broken lines show bonding hands.
Specific example of the acid-labile group shown by the formula (L8) includes the following groups,
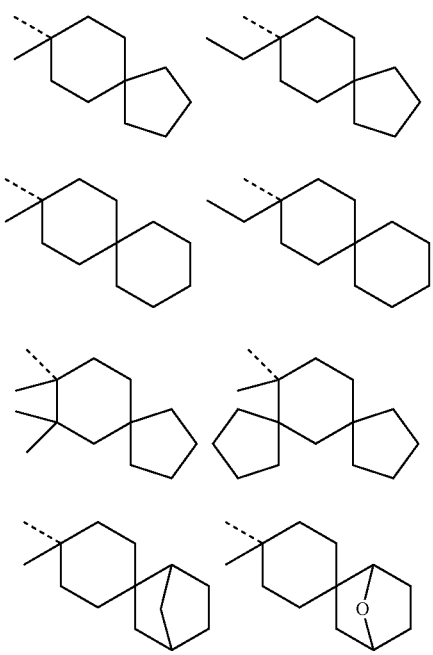
wherein, the broken lines show bonding hands.
Specific example of the repeating unit shown by the formula (2A) includes the followings, though not limited to them.
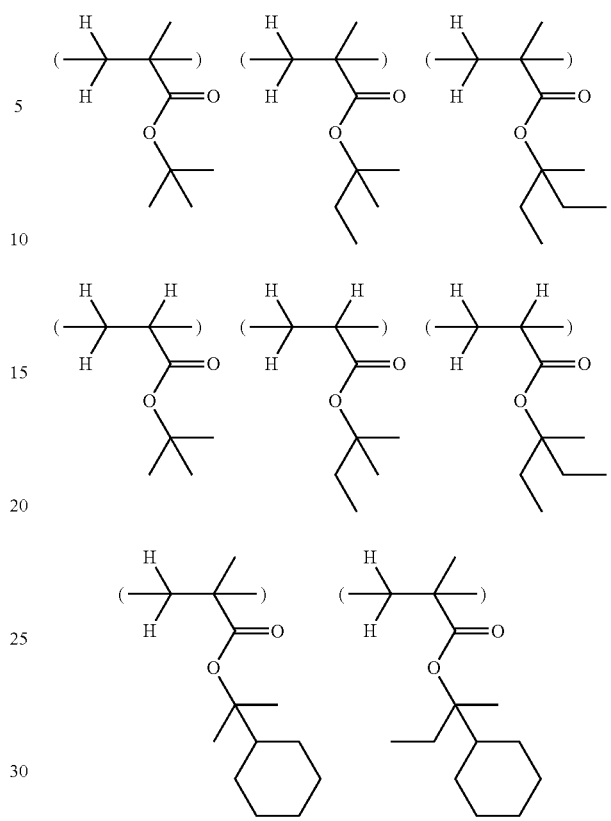
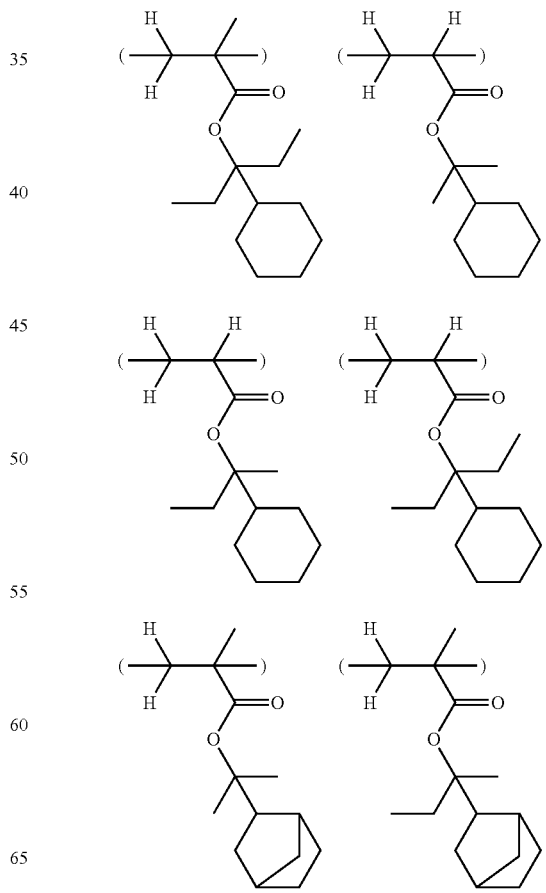

-continued
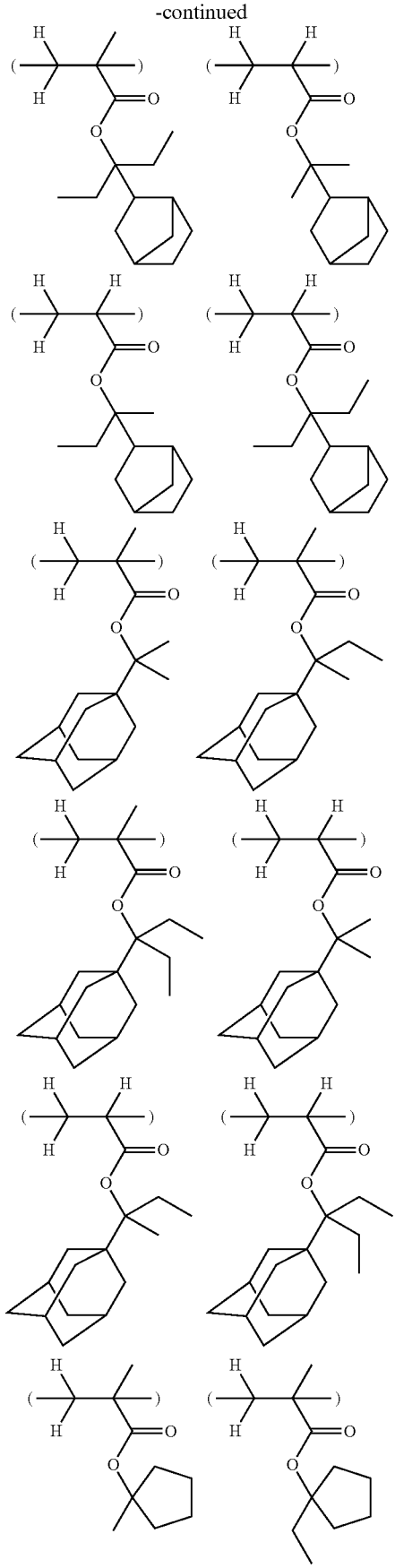
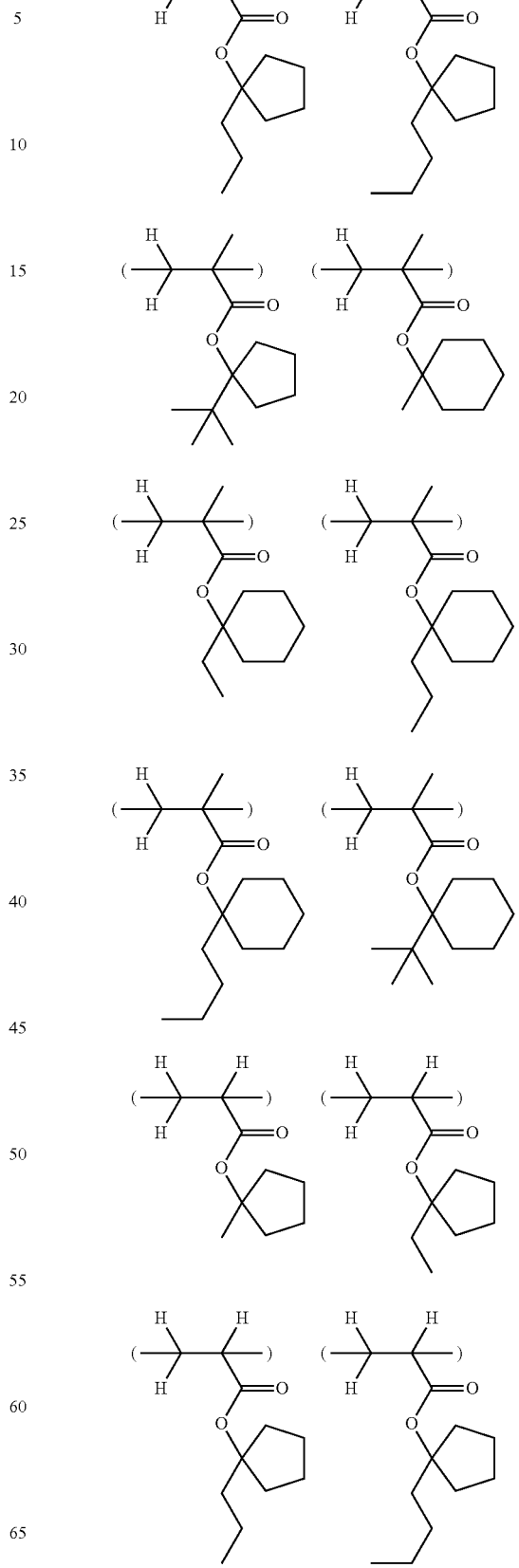

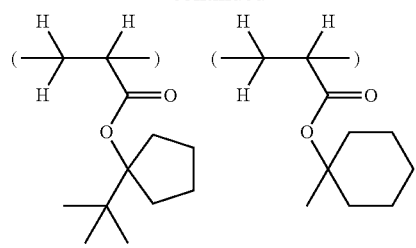
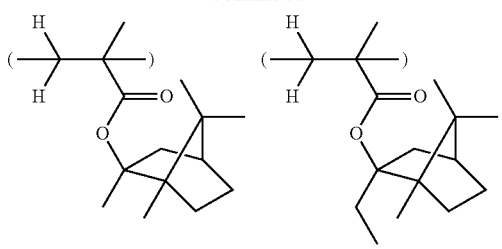
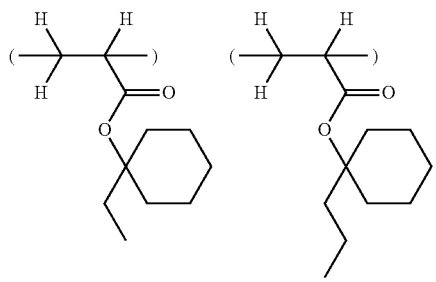
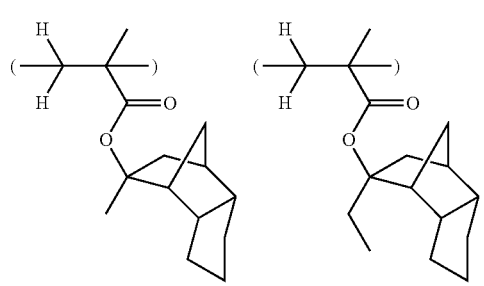
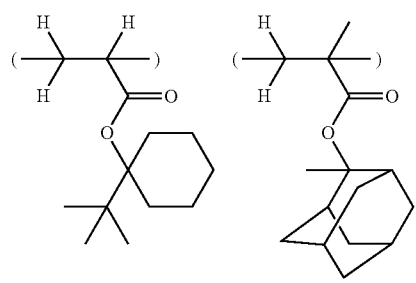
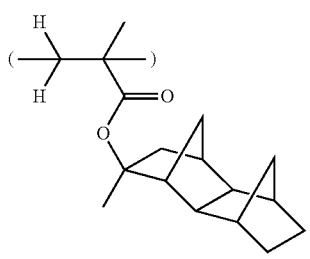
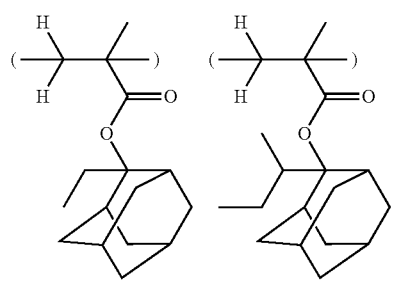
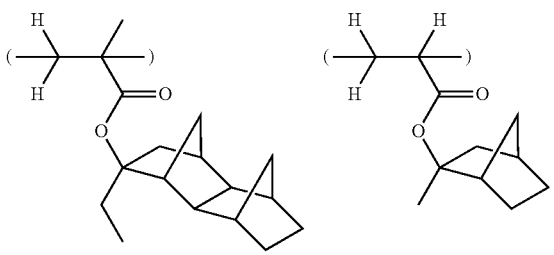
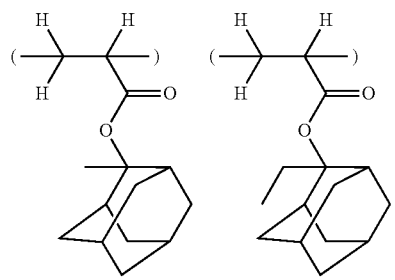
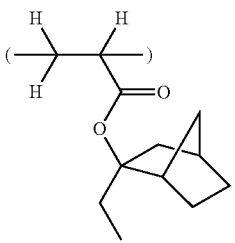
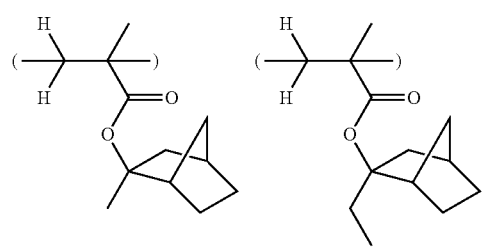
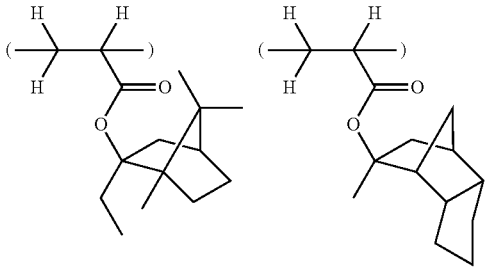

-continued
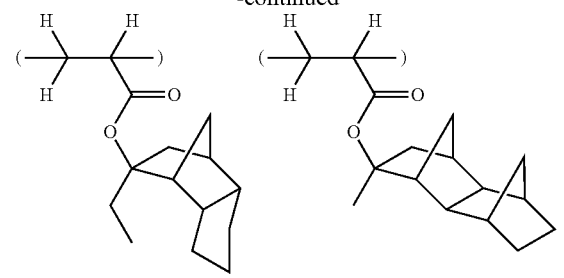
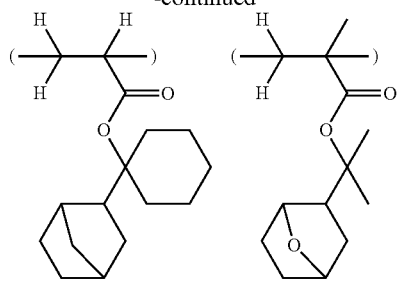
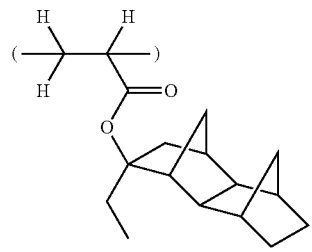
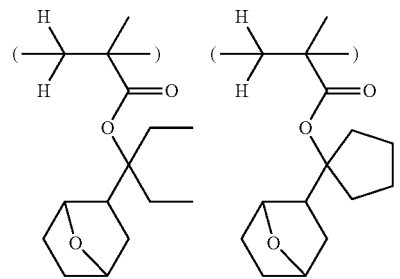
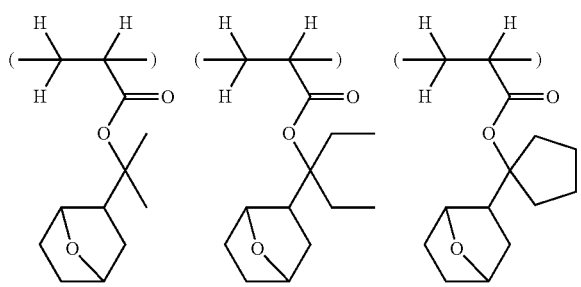
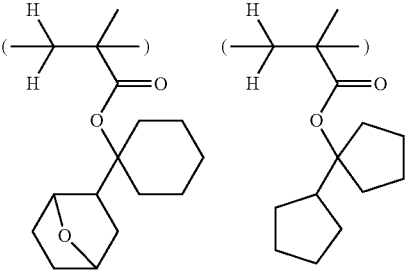
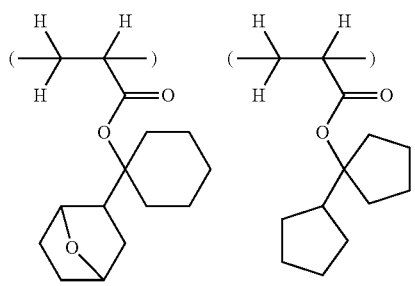
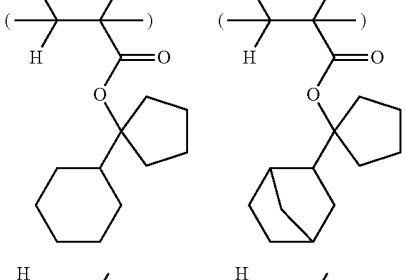
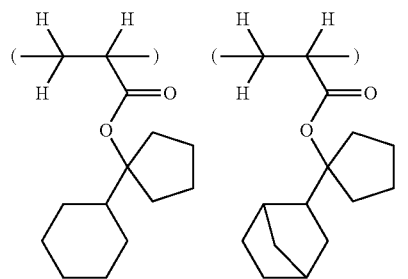
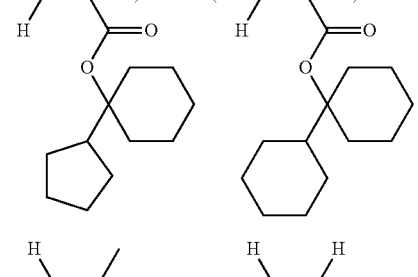
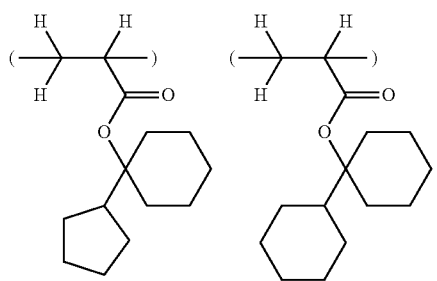
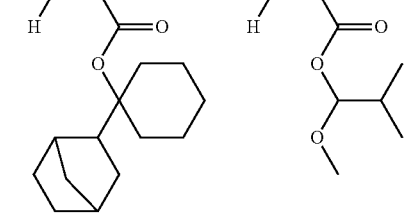

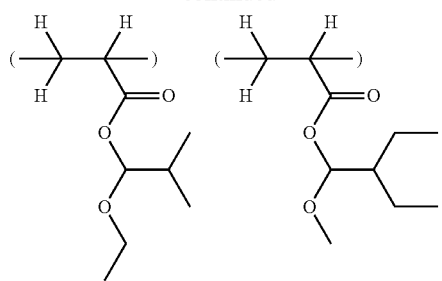
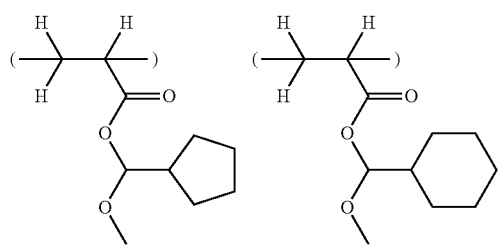
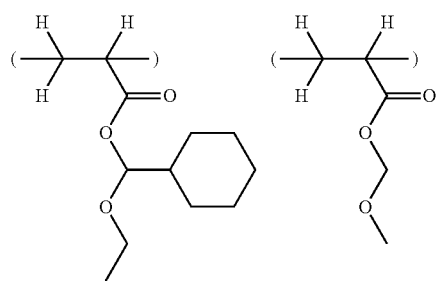
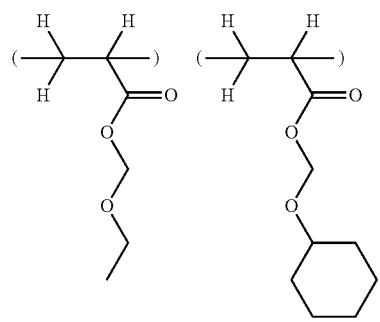
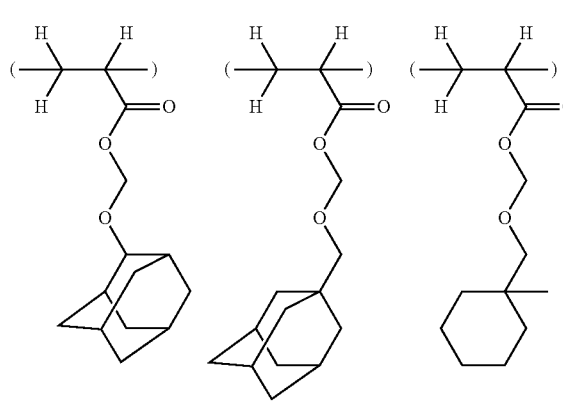
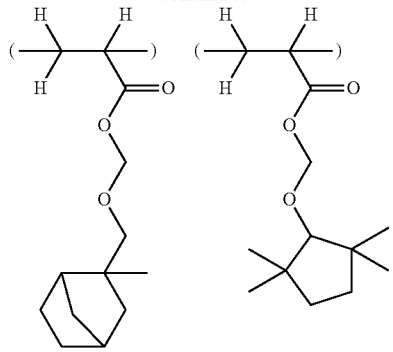
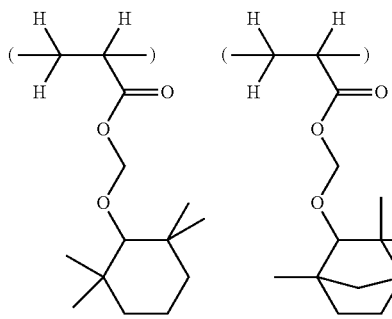
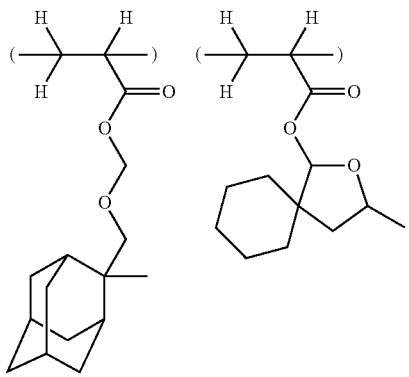
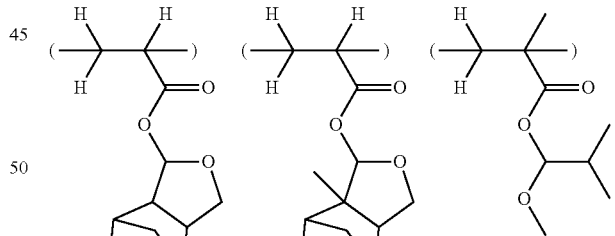
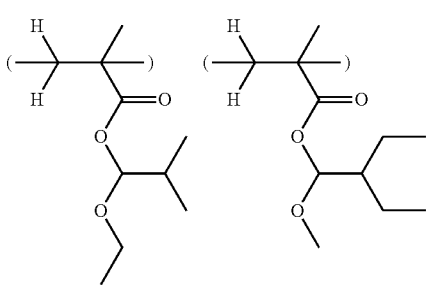

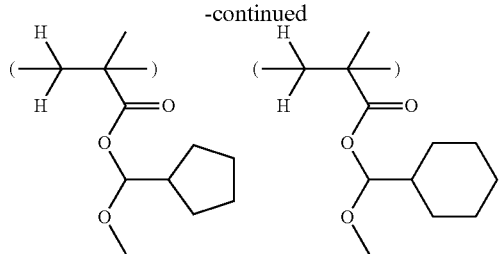
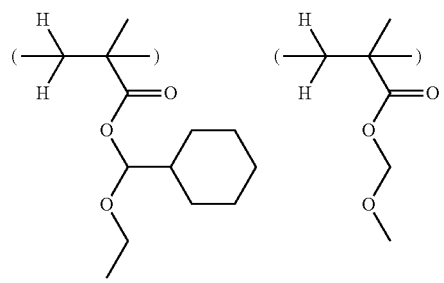
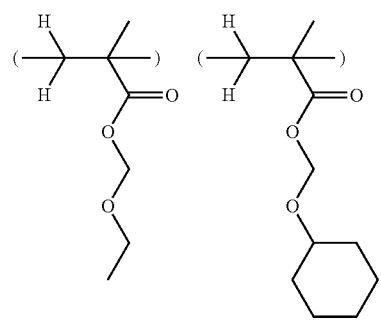
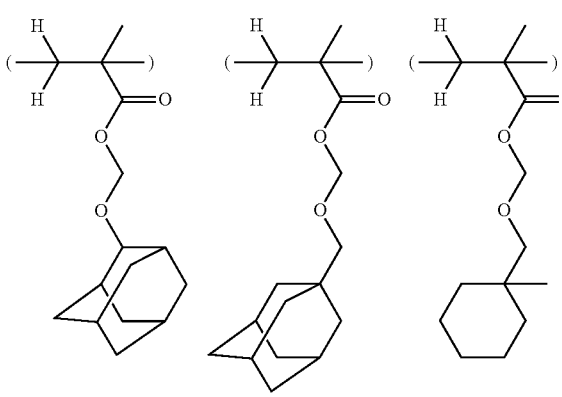
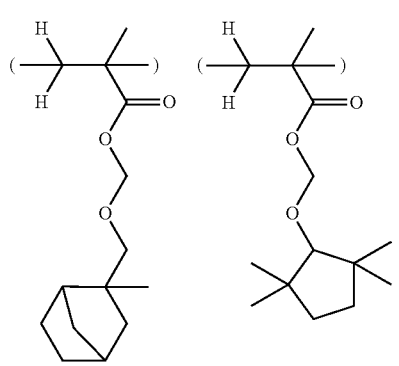
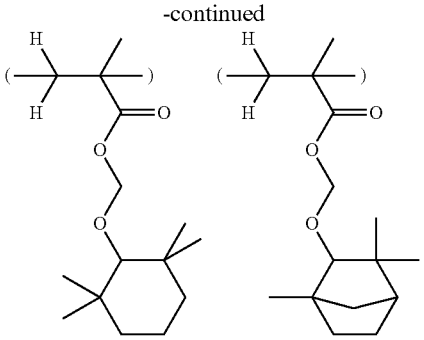
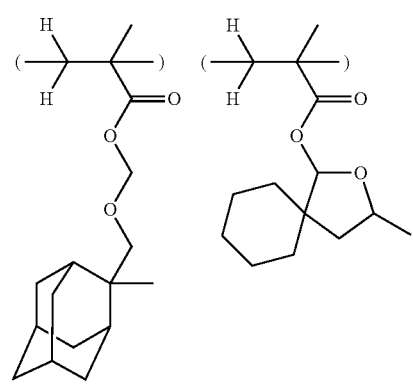
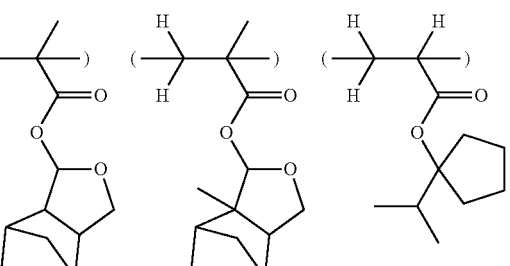
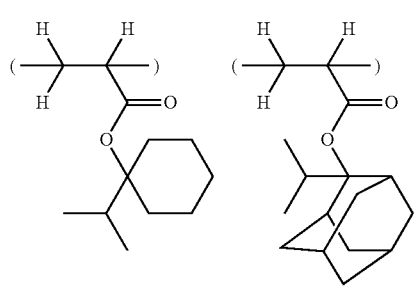
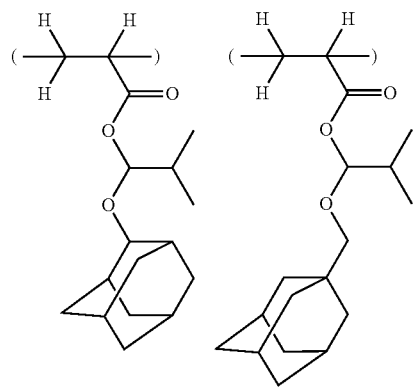

-continued

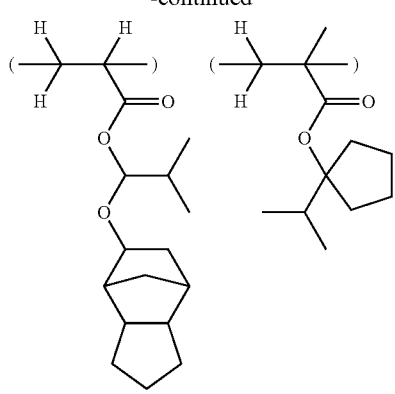

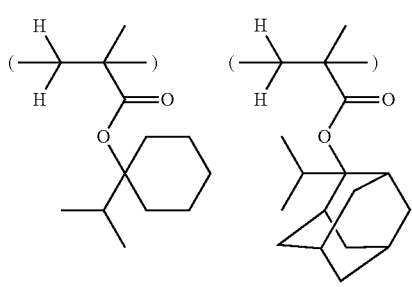

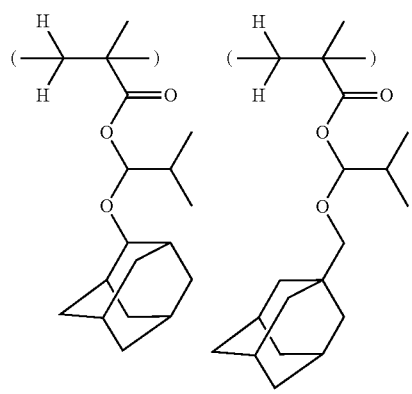

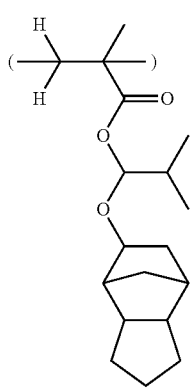

When the repeating unit of the present invention shown by the general formula (1) coexists with the repeating unit shown by the general formula (2A), the general formula (1) can not only function to control migration and diffusion of an acid but also function as the unit to generate an acid by itself by selection of the acid-labile units.

The polymer of the present invention can contain the repeating unit shown by the following formulae (2B) to (2E) concomitantly with the repeating units shown by the general formulae (1) and (2A), (2B)

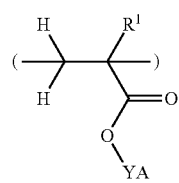

(2C)

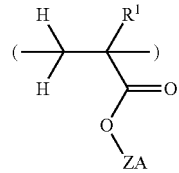

(2D)

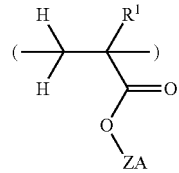

(2E)

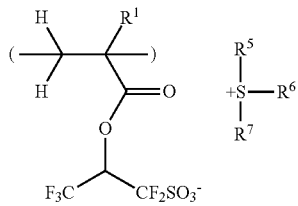

wherein, $R^1$ represents the same meanings as before; and each XB and XC independently represents a single bond, or a linear or a branched divalent hydrocarbon group having 1 to 4 carbon atoms. YA represents a substituent group having a lactone structure. ZA represents a hydrogen atom, a fluoroalkyl group having 1 to 15 carbon atoms and optionally containing an oxygen group, or a substituent group containing a fluoroalchol group having 1 to 15 carbon atoms. $k^{1A}$ represents an integer of 1 to 3. Each $R^5$, $R^6$, and $R^7$ independently represents a substituted or an unsubstituted linear or branched alkyl, alkenyl, or oxoalkyl group having 1 to 10 carbon atoms, or a substituted or an unsubstituted aryl, aralkyl, or aryl oxoalkyl group having 6 to 18 carbon atoms, or any two or more of $R^5$, $R^6$, and $R^7$ may be bonded with each other to form a ring together with a sulfur atom in the formula.

Specific example of the repeating unit shown by the general formula (2B) includes the followings.

-continued
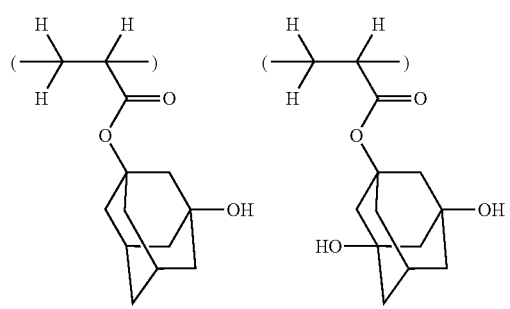
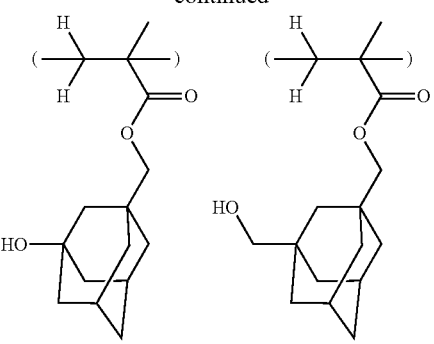
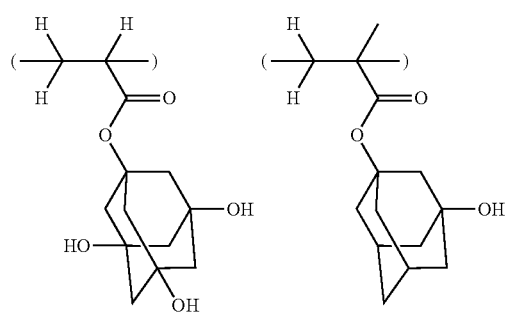
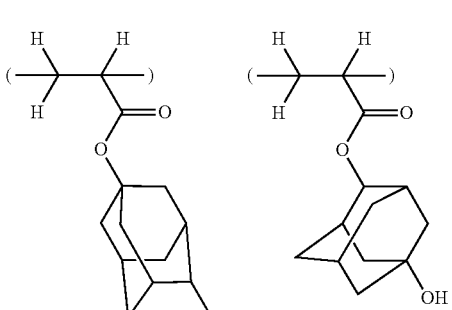
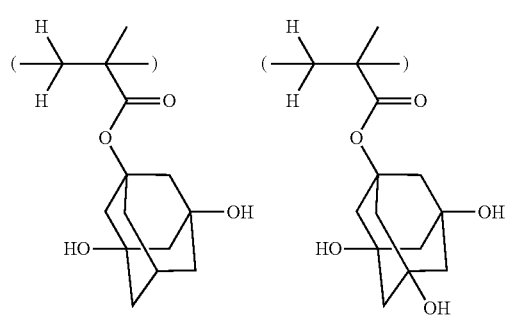
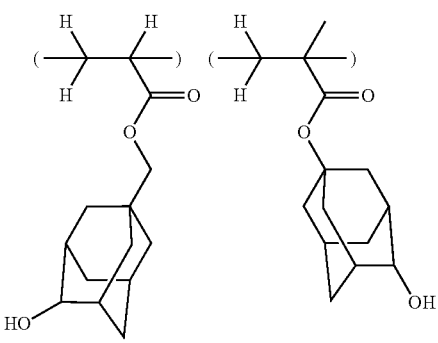
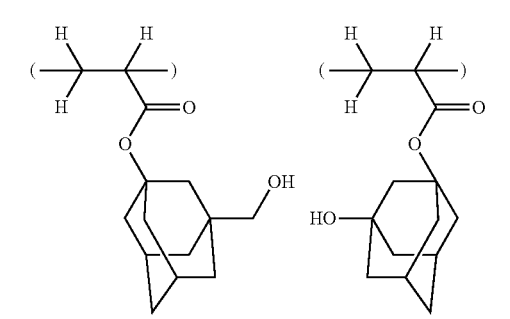
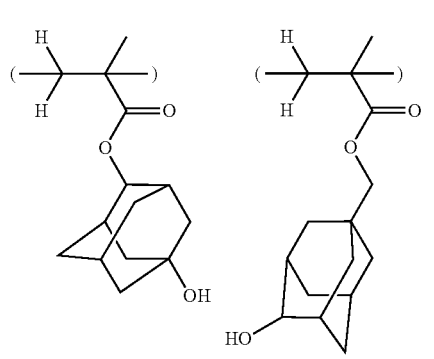
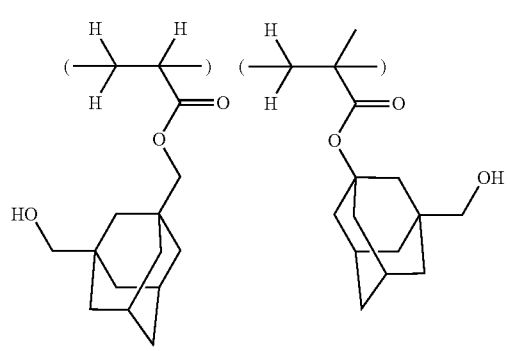
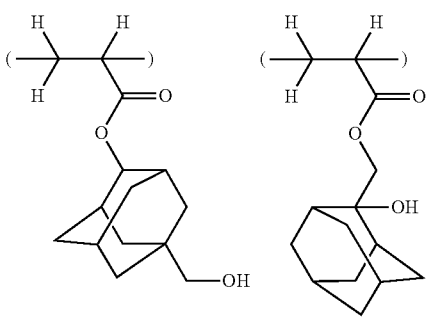

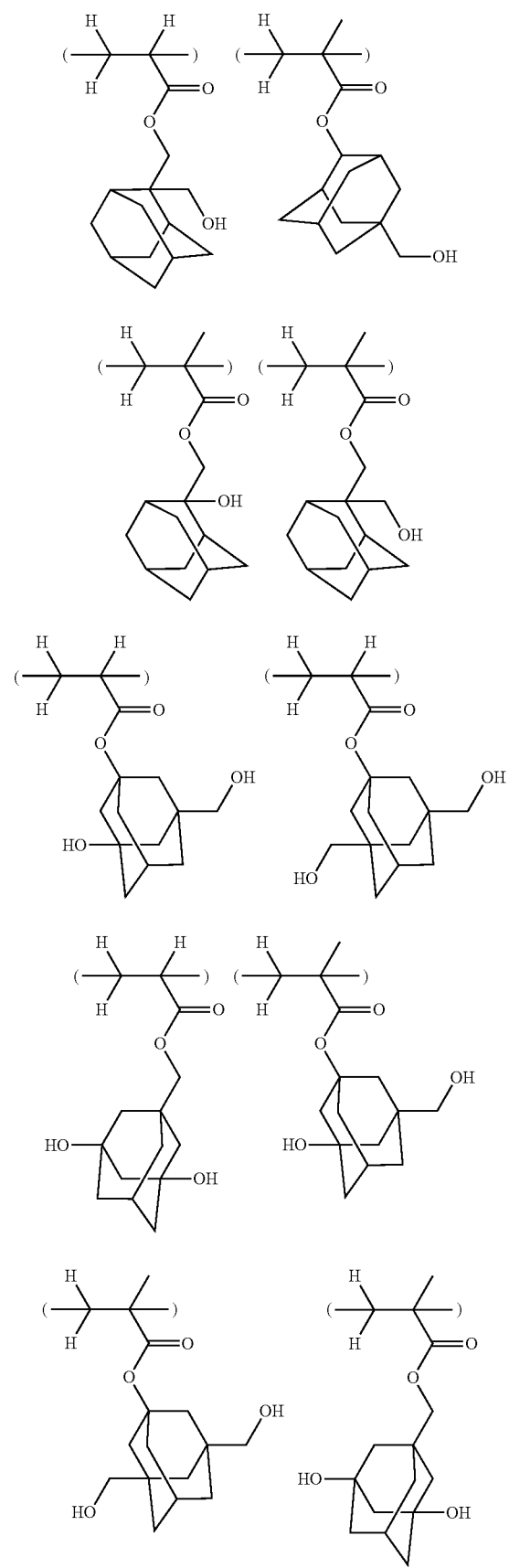
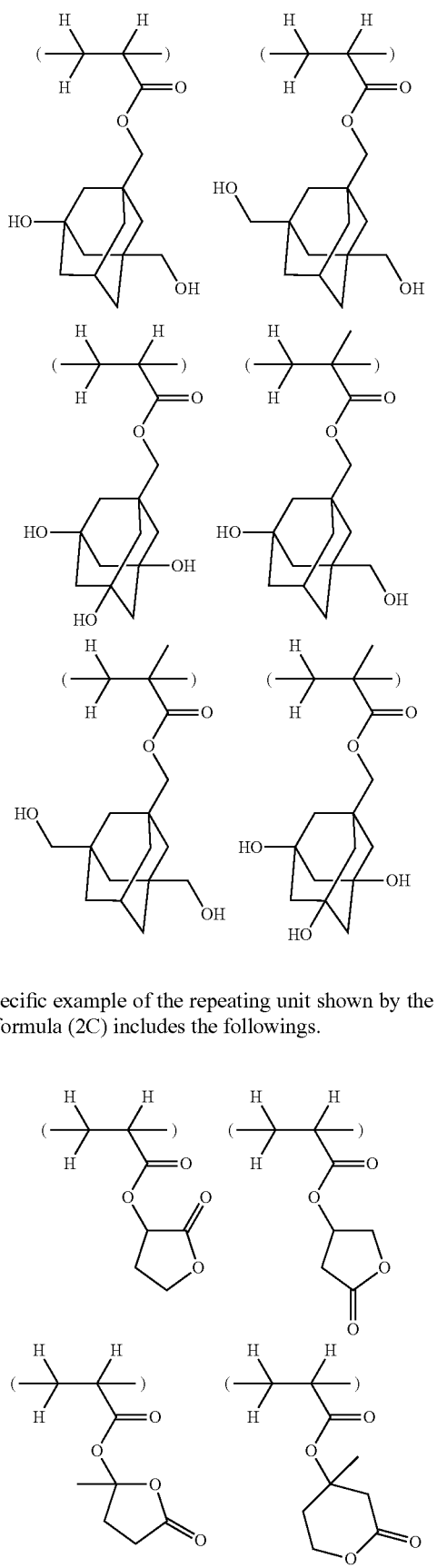
Specific example of the repeating unit shown by the general formula (2C) includes the followings.

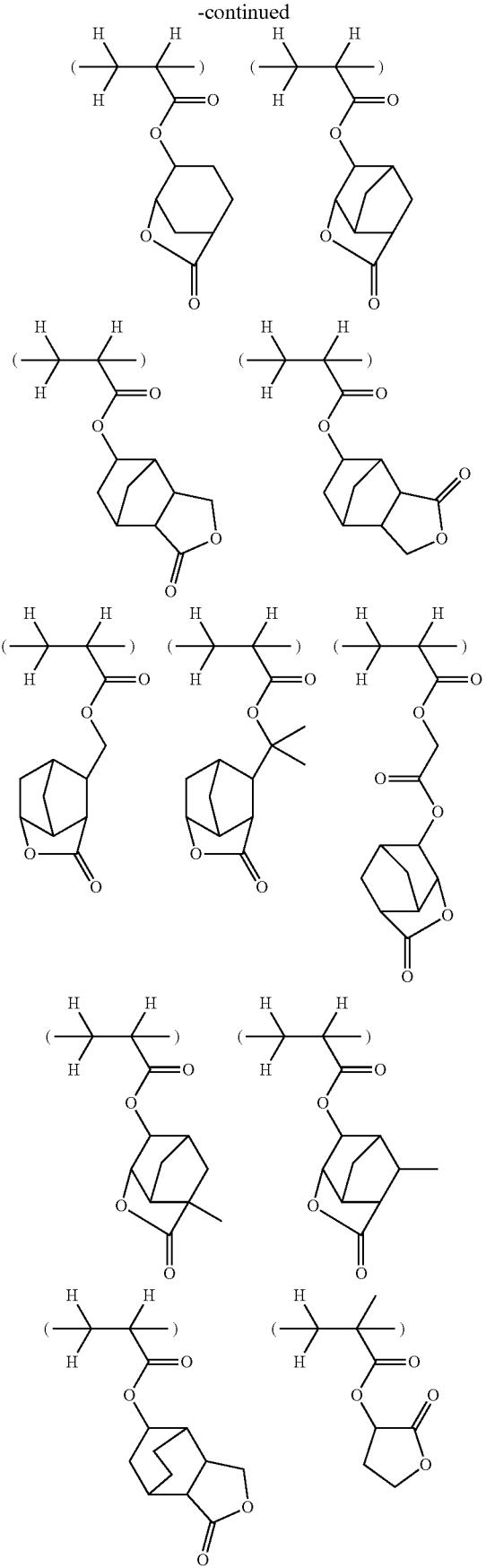
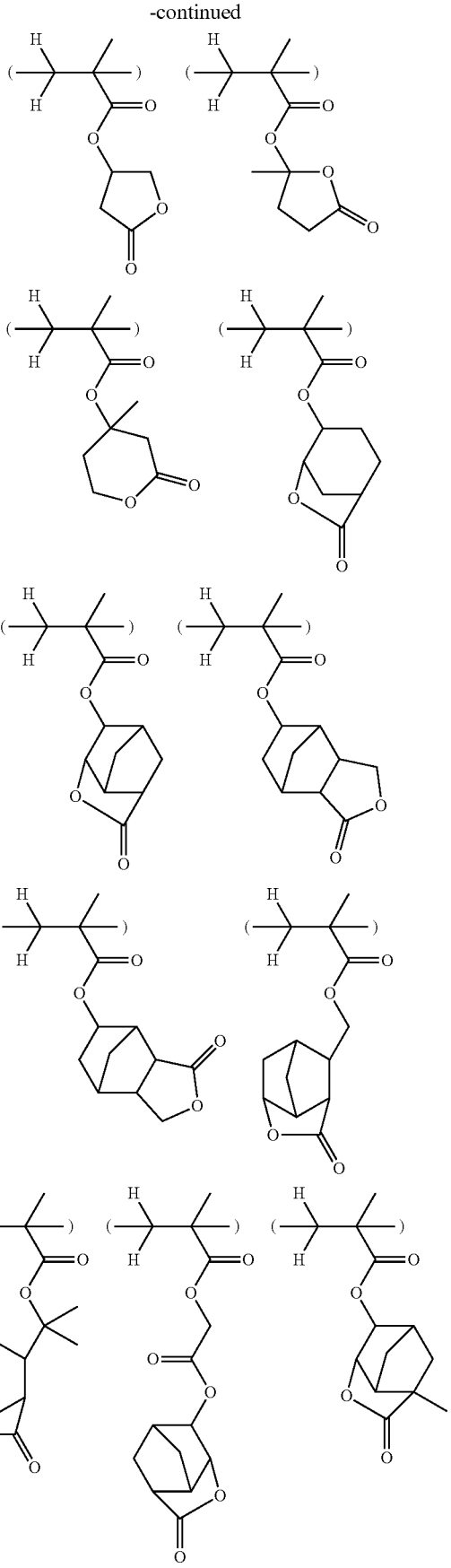

-continued
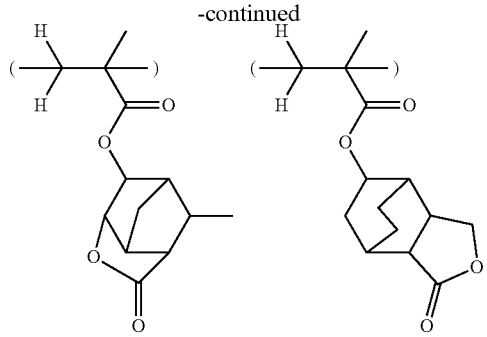
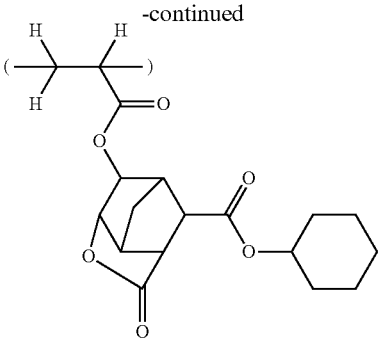
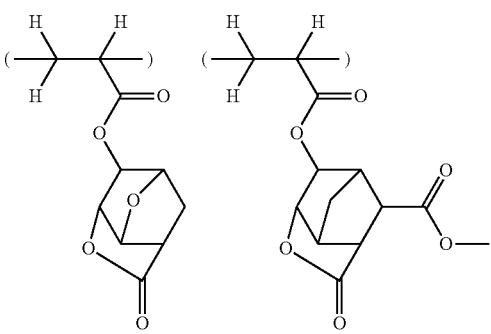
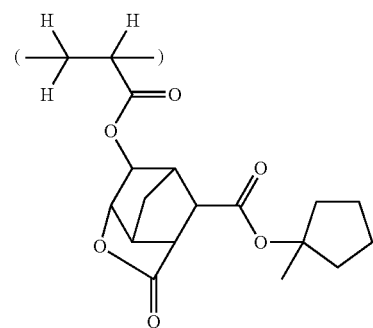
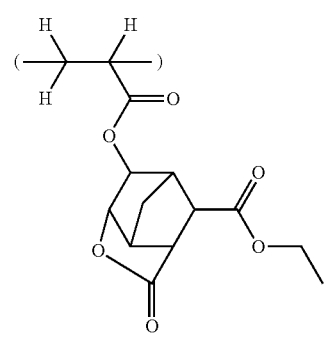
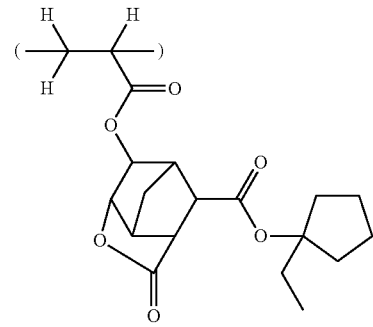
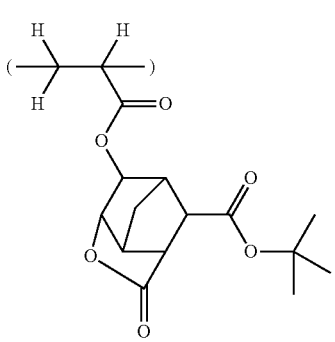
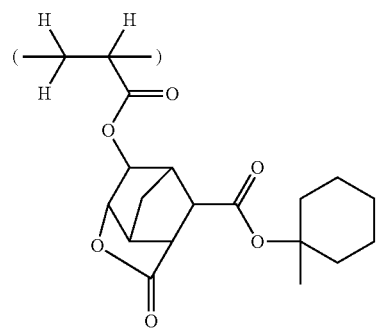
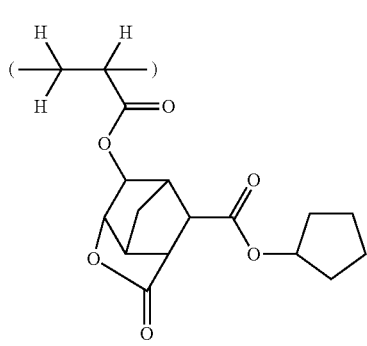

-continued
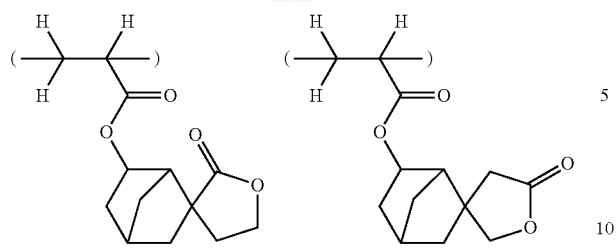
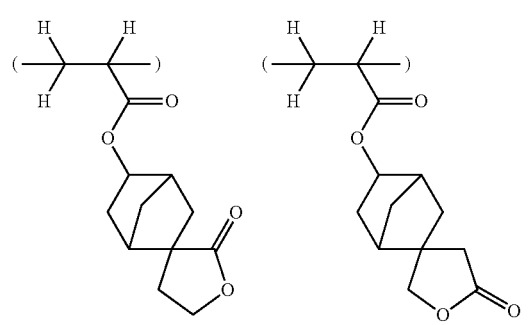
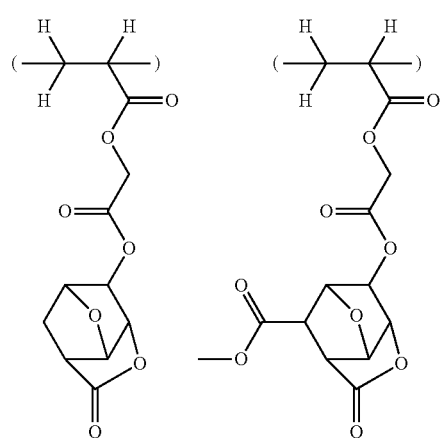
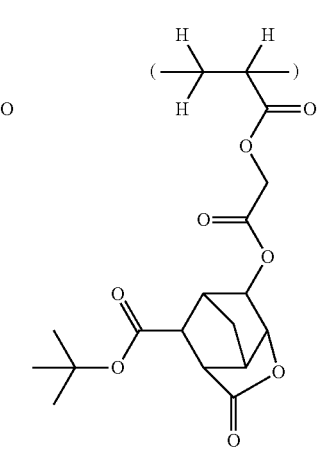
-continued
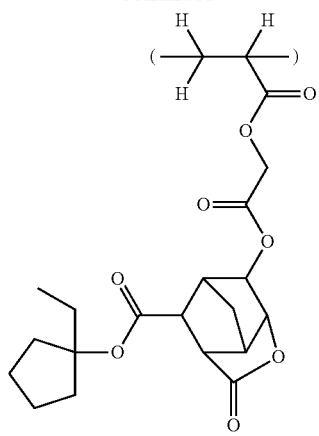
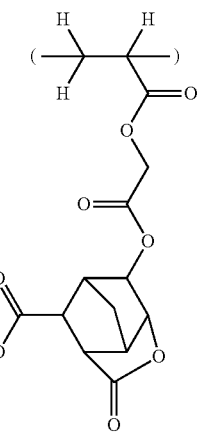
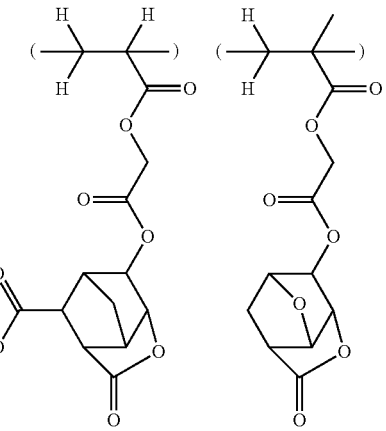

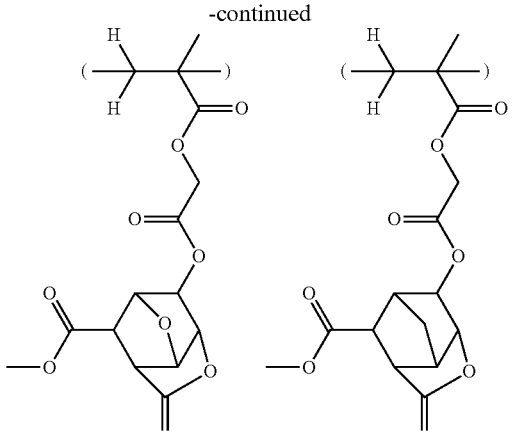
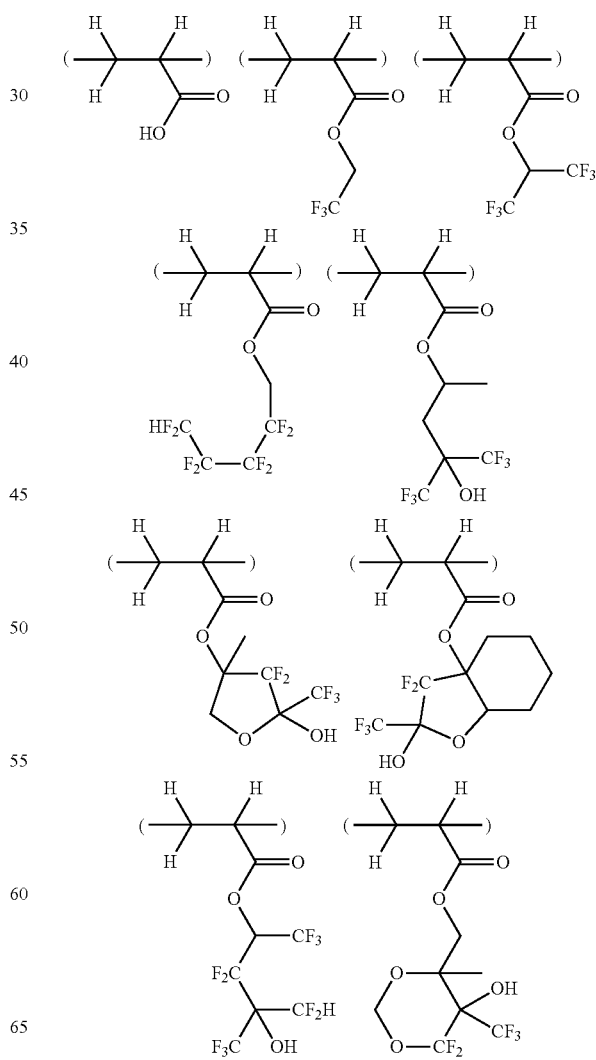
Specific example of the repeating unit shown by the general formula (2D) includes the followings.
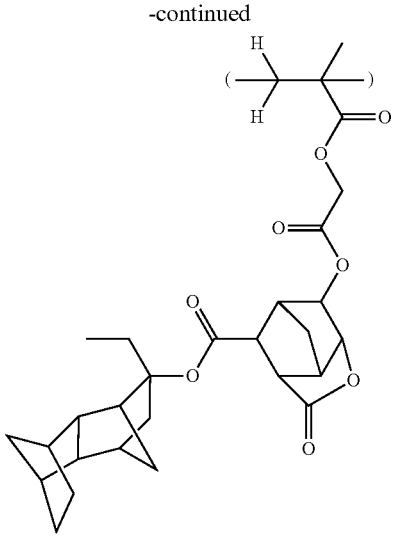

-continued
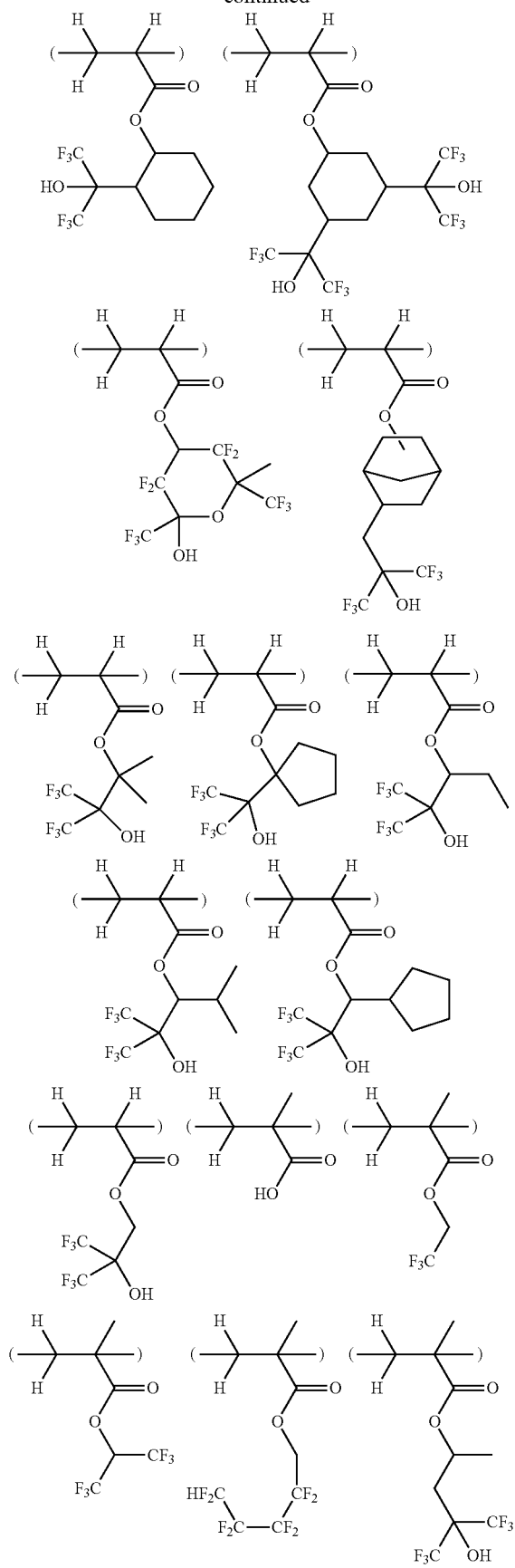
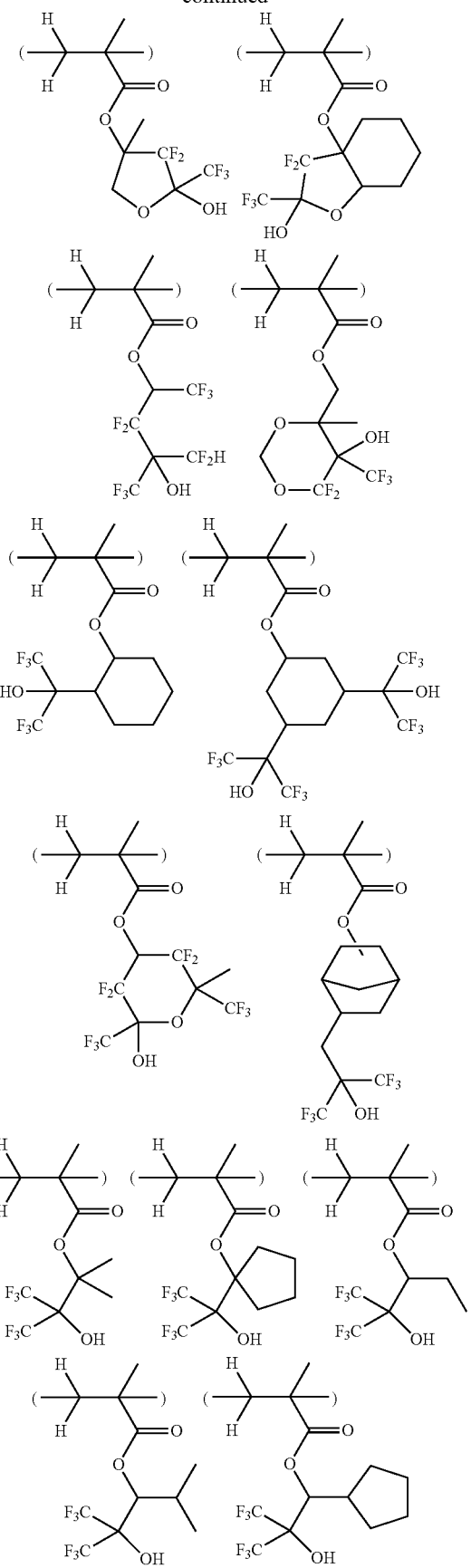

-continued

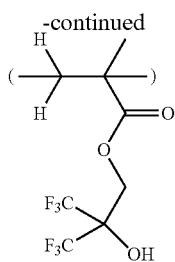

Specific example of the repeating unit shown by the general formula (2E) includes the followings,

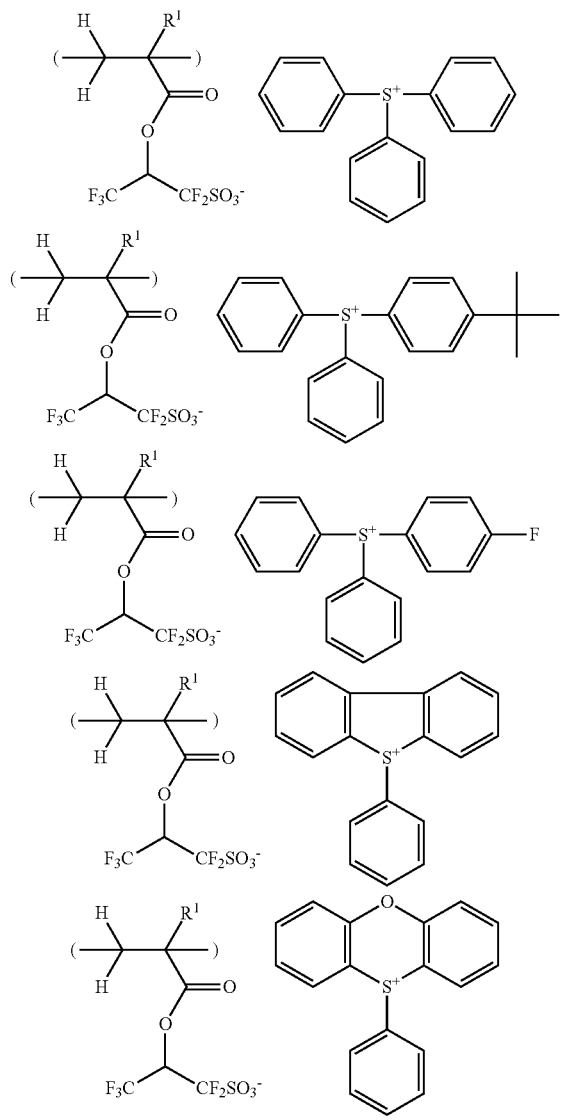

wherein, $R^1$ represents the same meanings as before.

When a polymer containing, in addition to the repeating unit (1) of the present invention, appropriate combination of the acid-labile unit shown by the general formula (2A) and the units shown by the general formulae (2B) to (2E) is used as a resist base resin, a chemically amplified resist composition having high resolution and high resistance to pattern fall can be obtained.

To synthesize the polymer of the present invention, a general polymerization method such as a radical polymerization method using an initiator such as 2,2'-azobisbutyronitrile (hereinafter abbreviated as AIBN) and an ionic polymerization method (anionic polymerization method) using an alkyl lithium and the like can be used; and these polymerizations may be carried out by usually used respective methods. Among them, synthesis of the polymer of the present invention is preferably carried out by a radical polymerization method. In this case, polymerization conditions are dependent on kind and adding amount of the initiator, temperature, pressure, concentration, solvent, additive, and so on.

The radical polymerization initiator is not particularly restricted; and illustrative example of the initiator includes an azo compound such as AIBN, 2,2'-azobis(4-methoxy-2,4-dimethylvaleronitrile), 2,2'-azobis(2,4-dimethylvaleronitrile), 2,2'-azobis(2,4,4-trimethylpentane), and 2,2'-azobis(isobutyric acid) dimethyl; a peroxide compound such as tert-butylperoxy pivalate, lauroyl peroxide, benzoyl peroxide, and tert-butylperoxy laurate; a water-soluble polymerization initiator such as potassium persulfate; and a redox initiator such as a combination of a peroxide such as potassium persulfate and hydrogen peroxide and a reducing agent such as sodium sulfite. Amount of the polymerization initiator may be changed appropriately depending on kind of the initiator, polymerization conditions, and so on; but the amount is usually 0.001 to 10% by mol, or in particular 0.01 to 6% by mol, relative to totality of the monomers to be polymerized.

In the synthesis of the polymer of the present invention, a heretofore known chain-transfer agent such as dodecyl mercaptan and 2-mercaptoethanol may be concomitantly used to control the molecular weight thereof. In this case, amount of these chain-transfer agents is preferably 0.01 to 10% by mol relative to total mol of the monomers to be polymerized.

When synthesizing the polymer of the present invention, polymerizable monomers corresponding to the repeating units shown by the general formulae (1) and (2A) to (2E) are mixed, and then, the initiator and the chain-transfer agent mentioned above are added thereinto to carry out the polymerization.

Here, introduction ratios of each repeating unit (1) and (2A) to (2E) in the polymer of the present invention is preferably $0<U1<1$, $0<U2<0.9$, $0≤U3≤0.3$, $0≤U4<0.7$, $0≤U5≤0.3$, $0≤U6≤0.15$, and $0≤U2+U3+U4+U5+U6≤0.7$, provided that total mol of the monomer corresponding to the unit shown by the general formula (1) is designated by U1, total mots of the respective monomers corresponding to the units of general formulae (2A) to (2E) are designated by U2, U3, U4, U5, and U6, and U1+U2+U3+U4+U5+U6=1 (100% by mol).

During polymerization, a solvent may be used as necessary. Polymerization solvent not inhibiting the polymerization reaction is preferably used; representative example thereof includes an ester such as ethyl acetate, n-butyl acetate, and γ-butyrolactone; a ketone such as acetone, methyl ethyl ketone, and methyl isobutyl ketone; an aliphatic or an aromatic hydrocarbon such as toluene, xylene, and cyclohexane; an alcohol such as isopropyl alcohol and ethylene glycol monomethyl ether; and an ether such as diethyl ether, dioxane, and tetrahydrofurane. These solvents may be used singly or as a mixture of two or more of them. Amount of the polymerization solvent may be changed appropriately depending on polymerization condition such as the intended degree of polymerization (molecular weight), amount of the initiator, and polymerization temperature; but amount of the solvent is usually such that concentration of the monomers to be polymerized may become in the range of 0.1 to 95% by mass, or in particular 5 to 90% by mass.

Reaction temperature of the polymerization reaction may be changed appropriately depending on kind of the polymerization initiator or boiling point of the solvent; but it is preferably 20 to 200° C. in general, or in particular 50 to 140° C. A reaction vessel for the polymerization reaction is not particularly restricted.

An organic solvent or water as the medium contained in a solution or a dispersion of the polymer thus obtained may be removed by any of heretofore known methods; illustrative example thereof includes reprecipitation accompanied with filtration and distillation by heating under reduced pressure.

The present invention provides a chemically amplified resist composition comprising (A) the polymer of the present invention, (B) an organic solvent, (C) a photo acid generator, and (D) a basic compound.

Details of the organic solvent (B) usable in the present invention can be found in Japanese Patent Laid-Open (Kokai) No. 2009-269953 and so on. Among the organic solvents (B), diethylene glycol dimethyl ether, 1-ethoxy-2-propanol, propylene glycol monomethyl ether acetate, cyclohexanone, 4-butyrolactone, and a mixture of them are preferably used because they have highest solubility to an acid generator contained as the resist component.

Amount of the organic solvent to be used is preferably 200 to 5000 parts by mass, or in particular 400 to 3000 parts by mass, relative to 100 parts by mass of the base resin.

To realize the function as the chemically amplified resist composition, a compound generating an acid by photo-exposure to a high energy beam ((C) photo acid generator) may be contained therein. Any compound may be used as the component of the photo acid generator (C) as far as the compound can generate an acid by photo-exposure to a high energy beam; but preferable example thereof includes an acid generator such as a sulfonium salt, an iodonium salt, a sulfonyl diazomethane, an N-sulfonyl oximide, and an oxime-O-sulfonate type, and specific example thereof may be found in paragraphs [0108] to [0116] of Japanese Patent Laid-Open (Kokai) No. 2010-002599.

The photo acid generator especially shown by the following general formula (C)-1 is preferably used,

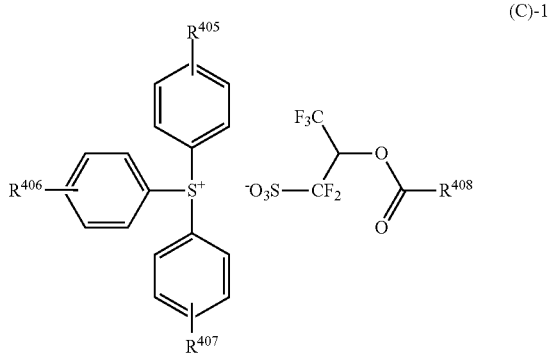

(C)-1 wherein, each $R^{405}$, $R^{406}$, and $R^{407}$ independently represents a hydrogen atom, or a linear, a branched, or a cyclic monovalent hydrocarbon group having 1 to 20 carbon atoms and optionally containing a hetero atom, in particular an alkyl group or an alkoxy group. $R^{408}$ represents a linear, a branched, or a cyclic monovalent hydrocarbon group having 7 to 30 carbon atoms and optionally containing a hetero atom.

Amount of the photo acid generator in the chemically amplified resist composition of the present invention is not particularly restricted as far as the amount thereof is in the range not adversely affecting the effects of the present invention; but it is preferably 0 to 40 parts by mass, especially 0.1 to 40 parts by mass, or still especially 0.1 to 20 parts by mass, relative to 100 parts by mass of the base resin in the chemically amplified resist composition. When the amount of the photo acid generator is within the range as mentioned above, there are no fears of deterioration in resolution and a problem of a foreign material during development and resist removal; and thus, this range is preferable. The photo acid generator may be used singly or as a mixture of two or more of them. In addition, a photo acid generator having low transmittance at the wavelength of a exposing beam may be used so that transmittance of the resist film may be controlled by the adding amount thereof.

In addition, a basic compound (D) may also be added into the chemically amplified resist composition of the present invention. Example of the basic compound (D) includes an aliphatic amine such as a primary, a secondary, and a tertiary amine, a mixed amine, an aromatic amine, a heterocyclic amine, a nitrogen-containing compound having a carboxy group, a nitrogen-containing compound having a sulfonyl group, a nitrogen-containing compound having a hydroxyl group, a nitrogen-containing compound having a hydroxyphenyl group, an alcoholic nitrogen-containing compound, an amide, an imide, a carbamate, and an ammonium salt; specific examples thereof are described in Japanese Patent Laid-Open (Kokai) No. 2009-269953.

In this case, the basic compound may be used singly or in a combination of two or more kinds of them; amount thereof is not particularly restricted as far as the amount thereof is in the range not adversely affecting the effects of the general formula (1) of the present invention; but it is preferably 0.001 to 12 parts by mass, especially 0.01 to 8 parts by mass, relative to 100 parts by mass of the base resin.

The chemically amplified resist composition of the present invention may further contain one or more additive selected from an organic acid derivative and/or a fluorinated alcohol, a dissolution inhibitor having weight-average molecular weight of 3000 or less, and a surfactant.

Addition of the organic acid derivative and/or the fluorinated alcohol and the compound (dissolution inhibitor) having weight-average molecular weight of 3000 or less is optional; and these can be referred to the compounds described in Japanese Patent Laid-Open (Kokai) No. 2009-269953.

The surfactant may be referred to the components defined (E) of Japanese Patent Laid-Open (Kokai) No. 2009-269953. In addition, reference may be made to Japanese Patent Laid-Open (Kokai) No. 2008-122932, Japanese Patent Laid-Open (Kokai) No. 2010-134012, Japanese Patent Laid-Open (Kokai) No. 2010-107695, Japanese Patent Laid-Open (Kokai) No. 2009-276363, Japanese Patent Laid-Open (Kokai) No. 2009-192784, Japanese Patent Laid-Open (Kokai) No. 2009-191151, and Japanese Patent Laid-Open (Kokai) No. 2009-98638, whereby a usually used surfactant and an alkaline-soluble surfactant may be used.

Amount of the surfactant to be added is 0.001 to 20 parts by mass, or preferably 0.01 to 10 parts by mass, relative to 100 parts by mass of the base resin in the resist composition. This matter is described in detail in Japanese Patent Laid-Open (Kokai) No. 2007-297590.

The present invention provides a patterning process comprising a step of applying the chemically amplified resist composition onto a substrate, a step of heat treatment, a step of exposing to a high energy beam via a photomask, and a step of development by using a developer.

In addition, the present invention provides a patterning process comprising a step of applying the chemically amplified resist composition onto a substrate, a step of heat treatment, a step of coating with a top coat that is not soluble in water but soluble in an alkaline developer, a step of exposure to a high energy beam via a photomask while water is inserted between the substrate and a projector lens, and a step of development by using a developer.

In more detail, to form a pattern by using the resist composition of the present invention, a heretofore known lithography technique may be used; for example, a resist film is formed by applying the composition onto a substrate for manufacturing of an integrated circuit (Si, $SiO_2$, SiN, SiON, TiN, WSi, BPSG, SOG, organic anti-reflective film, and so on) or onto a substrate for manufacturing of a mask circuit (Cr, CrO, CrON, MoSi, and so on) by a method such as spin coating so as to make a film thickness of 0.05 to 2.0 µm, which is followed by pre-baking of this on a hot plate at 60 to 150° C. for 1 to 10 minutes, or preferably at 80 to 140° C. for 1 to 5 minutes. Then, with covering over the resist film thus formed by a mask to form an intended pattern, a high energy beam such as a deep ultraviolet beam, an excimer laser beam, an X-ray, and an electron beam is irradiated thereonto with the exposure dose of 1 to 200 $mJ/cm^2$, or preferably 10 to 100 $mJ/cm^2$. Alternatively, an electron beam is directly irradiated for drawing without using a mask for patterning. Thereafter, post-exposure bake (PEB) is done on a hot plate at 60 to 150° C. for 1 to 5 minutes, or preferably at 80 to 140° C. for 1 to 3 minutes. Then, development is done by using an aqueous alkaline developer such as tetramethyl ammonium hydroxide (TMAH) with concentration thereof being 0.1 to 5% by mass, or preferably 2 to 3% by mass, for 0.1 to 3 minutes, or preferably for 0.5 to 2 minutes, with a usually used method such as a dip method, a puddle method, and a spray method to form an intended pattern on a substrate.

Alternatively, a negative pattern may be formed by using an organic solvent developer, wherein the development is done by dissolving an unexposed part by a usually used method such as a dip method, a puddle method, and a spray method for 0.1 to 3 minutes, or preferably for 0.5 to 2 minutes. As to the developer preferably used for this, there may be mentioned a ketone such as 2-octanone, 2-nonanone, 2-heptanone, 3-heptanone, 4-heptanone, 2-hexanone, 3-hexanone, diisobutyl ketone, methyl cyclohexanone, acetophenone, and methyl acetophenone; an ester such as propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, and ethyl crotonate; and an aromatic ester such as methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

In the resist composition of the present invention, a pattern size after development may be shrunk with various shrinking methods. For example, a hole size may be shrunk with a heretofore known method such as a thermal flow method, RELACS, SAFIRE, and WASOOM. Especially in the case that a hydrogenated ROMP polymer (hydrogenated cycloolefin ring-open metathesis polymer) having a low polymer Tg is blended, a hole size can be effectively shrunk by a thermal flow method.

Meanwhile, the chemically amplified resist composition of the present invention is most suitable for fine patterning using the high energy beams having wavelength of especially 250 to 190 nm including a deep ultraviolet beam or an excimer beam, an X-ray, and an electron beam. The foregoing range is preferable because an intended pattern can be obtained.

Exposure may also be done with an immersion method in a certain case, in addition to a usual exposure method. In the immersion lithography, exposure is done while an immersing medium (preferably water) is inserted between a resist film after prebake and a projector lens (between a substrate and a projector lens). In the ArF immersion lithography, pure water is mainly used as the immersing medium. Immersion lithography is an important technology to prolong a life of the ArF lithography to the post 65-nm node by combination with a projector lens having NA of 1.0 or more; and thus, the development thereof is accelerated. In this case, a top coat not soluble in water may also be used.

The top coat not soluble in water as mentioned above used to suppress leaching from the resist film and to improve water repellent property of the film surface, may be classified into roughly two kinds. One is an organic-solvent-removal type wherein the top coat needs to be removed by using an organic solvent not dissolving the resist film before the alkaline development; and the other is an alkaline-soluble type wherein the top coat soluble in an alkaline developer is removed simultaneously with removal of a soluble resist part.

In the latter case, a material containing a polymer as a base, not soluble in water but soluble in an alkaline developer, especially having a 1,1,1,3,3,3-hexafluoro-2-propanol residue, dissolved in an alcohol solvent having 4 or more carbon atoms, an ether solvent having 8 to 12 carbon atoms, or a mixture of them, is preferable.

A material containing the foregoing surfactant, not soluble in water but soluble in an alkaline developer, dissolved in an alcohol solvent having 4 or more carbon atoms, an ether solvent having 8 to 12 carbon atoms, or a mixture of them, may also be used.

As a measure for the patterning process, after formation of a photoresist film, an acid generator and so on may be extracted from the film surface or a particle may be flushed away by rinsing with pure water (Post-soak); or water remained on the film after exposure may be removed by rinsing (post-soak).

EXAMPLES

Hereinafter, the present invention will be explained specifically by showing Synthesis Examples, Comparative Synthesis Examples, Examples, and Comparative Examples; but the present invention is not limited to the following Examples. Meanwhile, Me in the following description means a methyl group.

Synthesis Example 1

Synthesis of Polymer-1

In a flask under a nitrogen atmosphere, 4.94 g of triphenylsulfonium=2-(6-methacryloyloxy-2-oxohexahydro-3,5-methano-2H-cyclopenta[b]furane-7-carbonyloxy)ethanesulfonate, 19.0 g of methacrylic acid=1-isopropylcyclopentyl, 6.61 g of methacrylic acid=2-oxotetrahydrofurane-3-yl, 12.09 g of methacrylic acid=5-oxo-4,8-dioxatricyclo[$4.2.1.0^{3,7}$]nona-2-yl, 2.20 g of V-601 (manufactured by Wako Pure Chemical Industries, Ltd.), and 0.45 g of 2-mercaptoethanol were dissolved into 68 g of GBL (γ-butyrolactone) to obtain a solution containing the monomers and the polymerization initiator. Into a different flask under a nitrogen atmosphere was taken 24 g of GBL; and after heating it to 80° C. with stirring, the monomer solution was gradually added into it over 4 hours. After the gradual addition, the polymerization solution was stirred for 2 hours with keeping the temperature at 80° C., and then cooled to room temperature. The polymerization solution thus obtained was gradually added into 640 g of a water-methanol solution (weight ratio of 3:7) with vigorous stirring, and then the deposited copolymer was separated by filtration. The copolymer was washed with 240 g of the water-methanol solution (weight ratio of 3:7) twice, and then dried at 50° C. under vacuum for 20 hours to obtain 30.3 g of a white powdery copolymer. It was found from the $^{13}$C-NMR analysis that the copolymer was composed of the monomers with the ratio of 2/50/20/28% by mol (the order is in accordance with the above mentioned).

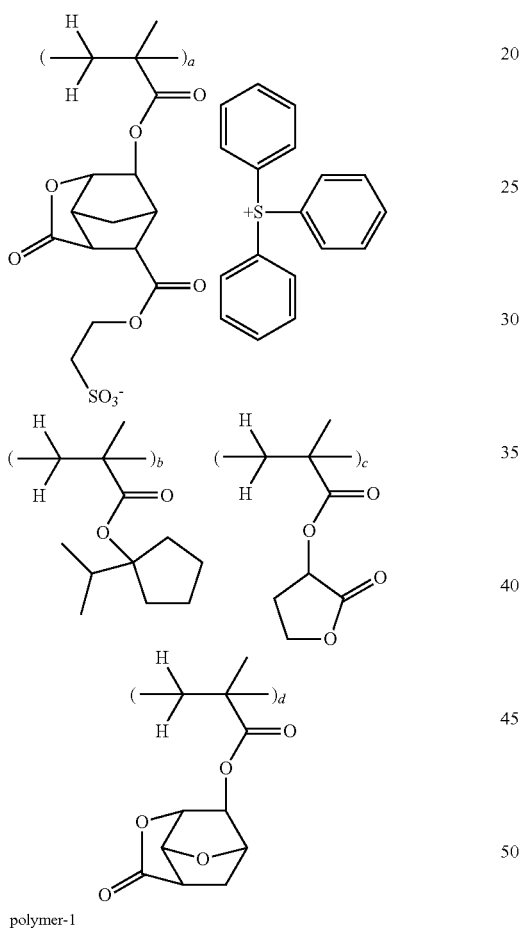

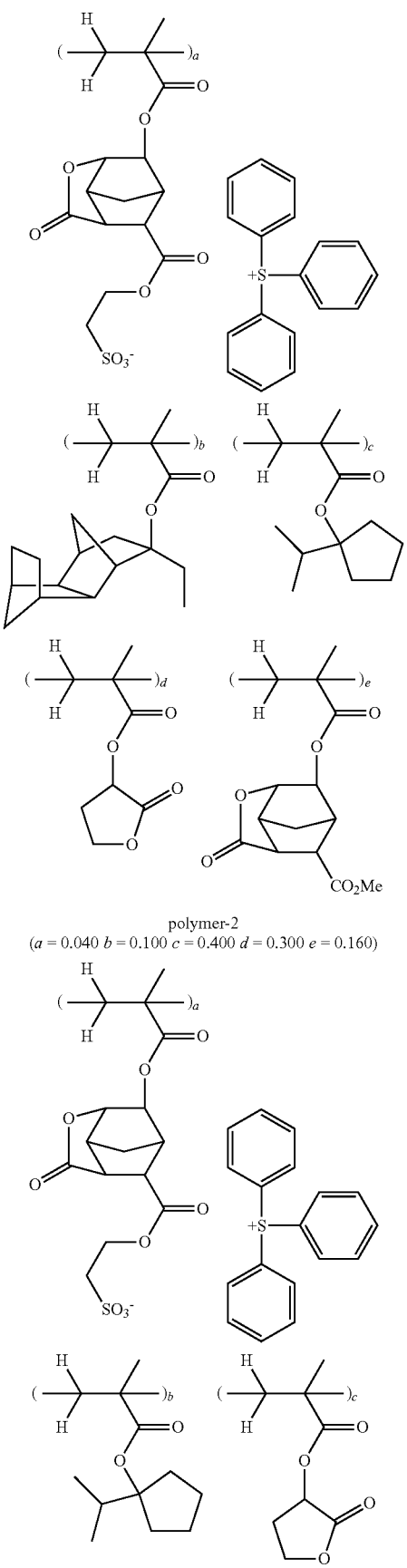

Synthesis Examples 2 to 7 and Comparative Synthesis Examples 1 to 4

Synthesis of Polymer-2 to Polymer-7 and Polymer-A to Polymer-D

By following the procedure similar to that of Synthesis Example 1, except that kinds and blending ratio of the monomers were changed, the polymers shown below were synthesized.

-continued
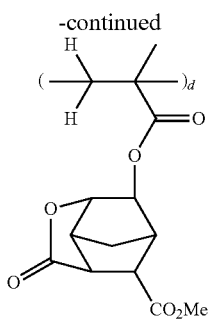
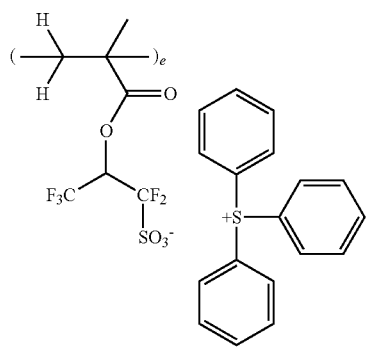
polymer-3
(a = 0.020 b = 0.500 c = 0.240 e = 0.040)
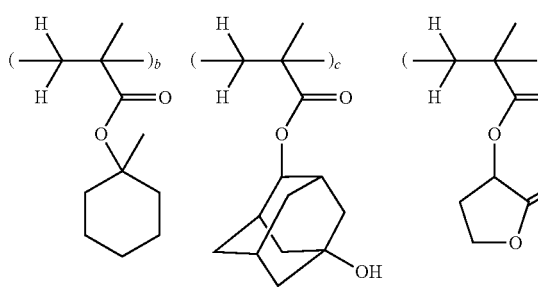
polymer-4
(a = 0.020 b = 0.480 c = 0.100 d = 0.400)
-continued
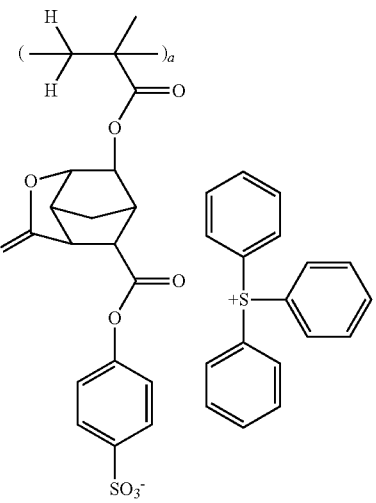
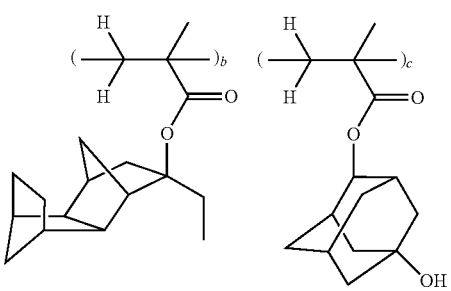
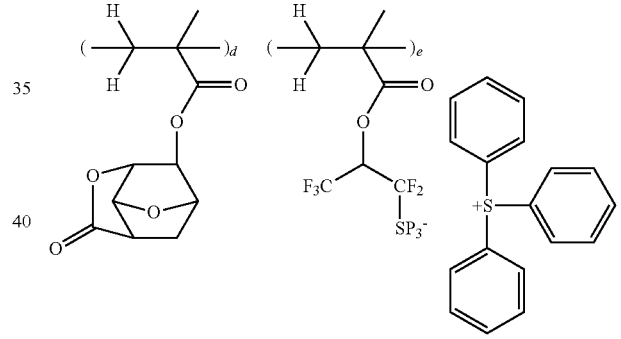
polymer-5
(a = 0.020 b = 0.500 c = 0.100 d = 0.340 e = 0.040)
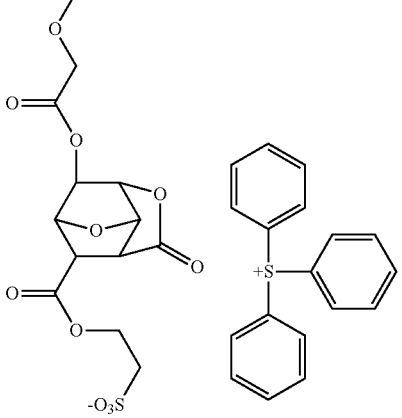

-continued
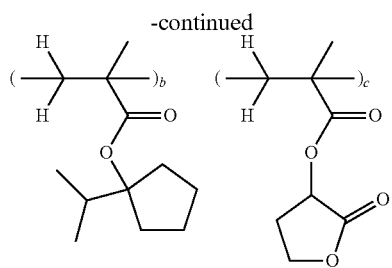
polymer-6
(a = 0.020 b = 0.500 c = 0.200 d = 0.280)
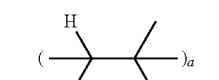
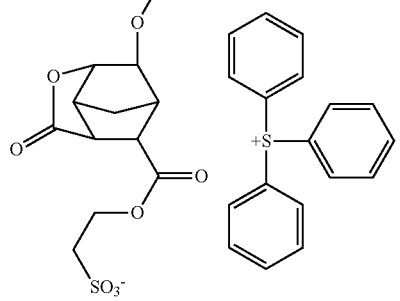
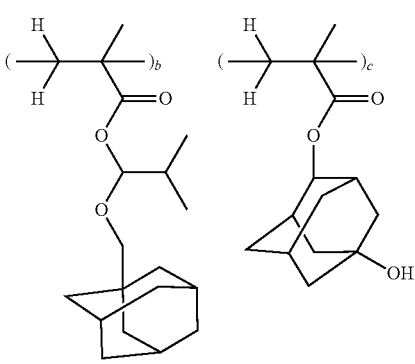
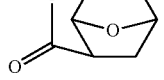
polymer-7
(a = 0.040 b = 0.500 c = 0.100 d = 0.360)
-continued
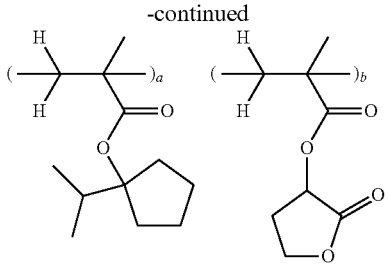
polymer-A
(a = 0.500 b = 0.300 c = 0.200)
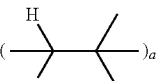
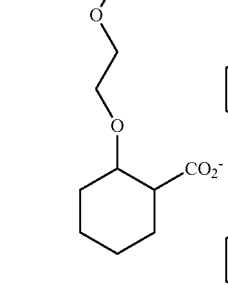
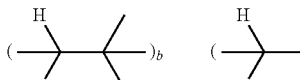
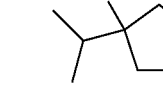
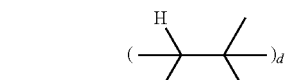
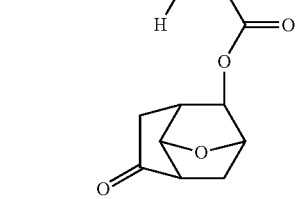
polymer-B
(a = 0.020 b = 0.500 c = 0.200 d = 0.280)

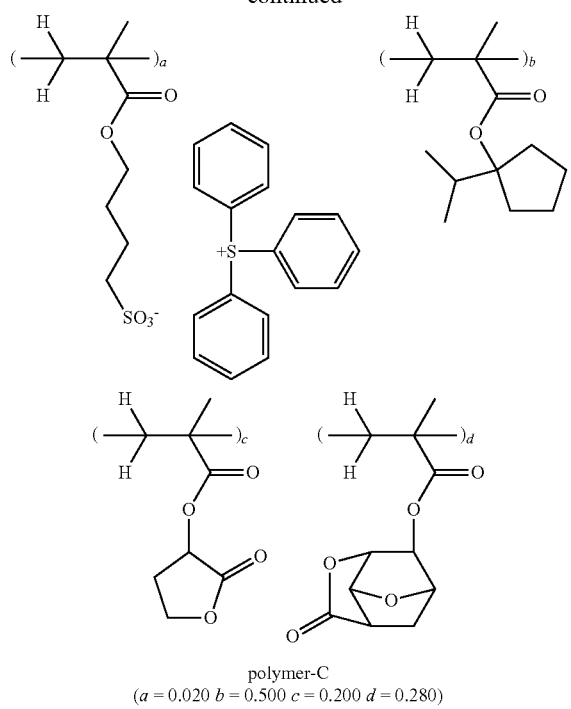

polymer-C
(a = 0.020 b = 0.500 c = 0.200 d = 0.280)

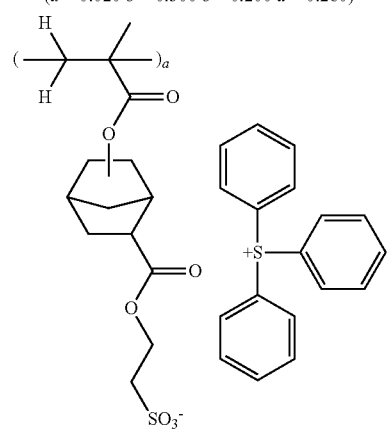

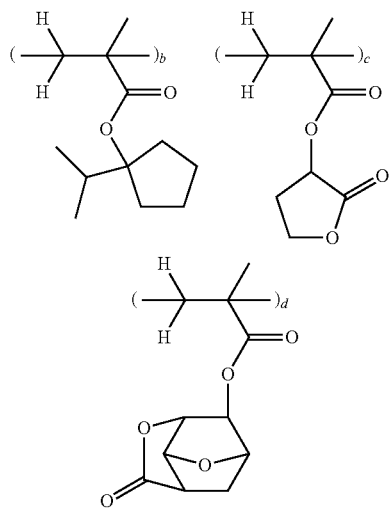

polymer-D
(a = 0.020 b = 0.500 c = 0.200 d = 0.280)

Preparation of Chemically Amplified Resist Compositions

Example 1-1 to Example 1-7 and Comparative Example 1-1 to Comparative Example 1-4

By using the polymers obtained in the above Synthesis Examples, respective resist compositions were prepared by dissolving these polymers, photo acid generators, quenchers, and alkaline-soluble surfactant (SF-1), which are shown below, with the ratio shown in Table 1, into a solvent containing 0.01% by mass of the following surfactant A (manufactured by OMNOVA SOLUTIONS, Inc.); and then, the composition thus obtained was filtrated through a Teflon (registered trade mark) filter having a size of 0.2 μm to prepare respective resist solutions (R-01 to R-11).

Meanwhile, in Table 1, photo acid generators, quenchers, solvents, and alkaline-soluble surfactant (SF-1) used in the resist composition together with the polymers shown by the above Synthesis Examples are as following.

P-1 to P-7: foregoing Polymer-1 to Polymer-7

P-A to P-D: foregoing Polymer-A to Polymer-D

PAG-1: 4-t-butylphenyldiphenylsulfonium=2-(adamantane-1-carbonyloxy)-1,1,3,3,3-pentafluoropropane-1-sulfonate PAG-2: N-nonafluorobutanesulfonyloxy-1,8-naphthalenedicarboxylmide Q-1: 1-benzyloxycarbonyl-2-phenylbenzimidazole Q-2: triphenylsulfonium=10-camphorsulfonate PGMEA: propylene glycol monomethyl ether acetate GBL: γ-butyrolactone Alkaline-soluble surfactant (SF-1): compound shown by the following formula (compound described in Japanese Patent Laid-Open (Kokai) No. 2008-122932)

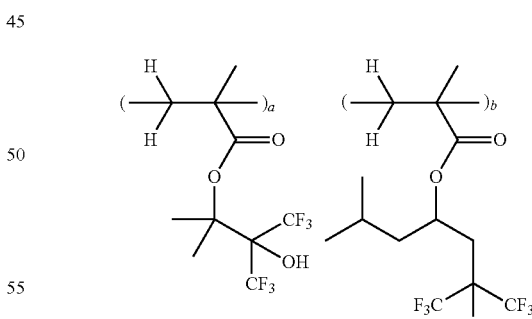

SF-1
(a = 0.5 b = 0.5, Mw = 7,300)

Surfactant A: 3-methyl-3-(2,2,2-trifluoroethoxymethyl)oxetane/tetrahydrofurane/2,2-dimethyl-1,3-propanediol copolymer shown by the following formula (manufactured by OMNOVA SOLUTIONS, Inc.)

TABLE 1

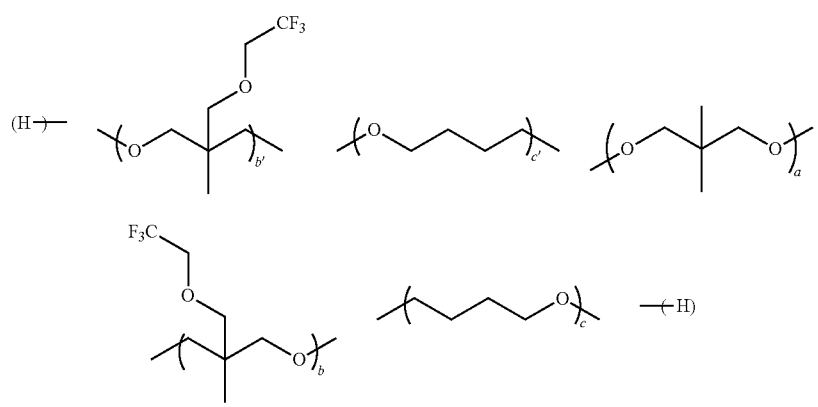

a:(b + b'):(c + c') = 1:4~7:0.01~1 (mole ratio)
Weight Average Molecular Weight 1,500

| | Resist | Polymer (parts by mass) | Photo Acid Generator (parts by mass) | Quencher (parts by mass) | Alkaline Soluble Surfactant (parts by mass) | Solvent 1 (parts by mass) | Solvent 2 (parts by mass) |
|---|---|---|---|---|---|---|---|
| Example 1-1 | R-01 | P-1 (80) | PAG-1 (6.9) | — | SF-1 (5.0) | PGMEA (2,700) | GBL (300) |
| Example 1-2 | R-02 | P-2 (80) | PAG-2 (4.8) | — | SF-1 (5.0) | PGMEA (2,700) | GBL (300) |
| Example 1-3 | R-03 | P-3 (80) | — | — | SF-1 (5.0) | PGMEA (2,700) | GBL (300) |
| Example 1-4 | R-04 | P-4 (80) | PAG-2 (4.8) | — | SF-1 (5.0) | PGMEA (2,700) | GBL (300) |
| Example 1-5 | R-05 | P-5 (80) | — | — | SF-1 (5.0) | PGMEA (2,700) | GBL (300) |
| Example 1-6 | R-06 | P-6 (80) | PAG-1 (6.9) | — | SF-1 (5.0) | PGMEA (2,700) | GBL (300) |
| Example 1-7 | R-07 | P-7 (80) | — | Q-1 (0.8) | SF-1 (5.0) | PGMEA (2,700) | GBL (300) |
| Comparative Example 1-1 | R-08 | P-A (80) | PAG-1 (6.9) | Q-2 (4.8) | SF-1 (5.0) | PGMEA (2,700) | GBL (300) |
| Comparative Example 1-2 | R-09 | P-B (80) | PAG-2 (4.8) | — | SF-1 (5.0) | PGMEA (2,700) | GBL (300) |
| Comparative Example 1-3 | R-10 | P-C (80) | PAG-1 (6.9) | — | SF-1 (5.0) | PGMEA (2,700) | GBL (300) |
| Comparative Example 1-4 | R-11 | P-D (80) | PAG-1 (6.9) | — | SF-1 (5.0) | PGMEA (2,700) | GBL (300) |

Evaluation of Patterning by ArF Exposure

Example 2-1 to Example 2-7 and Comparative Example 2-1 to Comparative Example 2-4

An anti-reflective film solution (ARC-29A, manufactured by Nissan Chemical Industries, Ltd.) was applied onto a silicon substrate, and then it was baked at 200° C. for 60 seconds to obtain an anti-reflective film (film thickness of 100 nm); onto this was applied a resist solution by a spin coating method; and then, it was baked on a hot plate at 100° C. for 60 seconds to obtain a resist film having a film thickness of 20 nm. This was immersion-exposed by using an ArF excimer laser scanner (NSR-S610C: manufactured by Nikon Corp., NA=1.30, dipole, Cr mask), baked at 80° C. for 60 seconds (PEB), and then developed by an aqueous tetramethyl ammonium hydroxide solution with concentration of 2.38% by mass for 60 seconds.

In evaluation of the resist profile, exposure dose to resolve the line-and-space of the 40-nm group at 1:1 was taken as the optimum exposure dose (Eop, mJ/cm$^2$). Pattern profile and roughness (LWR) at the said optimum exposure dose were observed with an electron microscope for evaluation.

Evaluation criteria of the pattern profile are as following.

Rectangular: excellent profile having a vertical line side wall with no size change from bottom (near the substrate) to top.
Taper: profile having a narrower line size going from bottom to top.

Leaching amount of the resist components to the immersed water was evaluated as following. Firstly, a true circular Teflon (registered trade mark) ring having inner diameter of 10 cm was placed on a wafer having the resist film formed by the method as mentioned above; and into the ring was carefully poured 10 mL of pure water such that the resist film may be contacted with the pure water for 60 seconds at room temperature. Thereafter, the pure water was recovered; and then, concentration of the anionic component of the sulfonium ion (mol/cm$^2$·sec) in the pure water was measured with an LC-MS analysis instrument (manufactured by Agilent Technologies, Inc.).

Adhesion of the resist pattern with the substrate was evaluated based on whether a peel-off defect was observed or not by hovering observation with an electron microscope.

Evaluation results of respective resist compositions are shown in Table 2.

TABLE 2

| Resist | | PEB Temperature (° C.) | optimum exposure dose (mJ/cm$^2$) | Pattern Profile | LWR (nm) | Leaching amount of the anionic component (×10$^{-13}$ mol/cm$^2$· sec) | Adhesion |
|---|---|---|---|---|---|---|---|
| Example 2-1 | R-01 | 90 | 31 | Rectangular | 3.2 | 5.1 | Good |
| Example 2-2 | R-02 | 85 | 33 | Rectangular | 3.5 | 1.2 | Good |
| Example 2-3 | R-03 | 95 | 35 | Rectangular | 3.2 | 1.9 | Good |
| Example 2-4 | R-04 | 95 | 31 | Rectangular | 3.3 | 1.0 | Good |
| Example 2-5 | R-05 | 100 | 34 | Rectangular | 3.6 | 1.7 | Good |
| Example 2-6 | R-06 | 90 | 30 | Rectangular | 3.1 | 5.4 | Good |
| Example 2-7 | R-07 | 80 | 27 | Rectangular | 3.5 | 5.4 | Good |
| Comparative Example 2-1 | R-08 | 90 | 29 | Rectangular | 3.8 | 16.2 | Peel-off |
| Comparative Example 2-2 | R-09 | 90 | 30 | Taper | 4.2 | 1.5 | Peel-off |
| Comparative Example 2-3 | R-10 | 90 | 34 | Taper | 4.4 | 5.2 | Peel-off |
| Comparative Example 2-4 | R-11 | 90 | 35 | Taper | 4.2 | 5.5 | Peel-off |

From the results shown in Table 2, it was confirmed that, when the polymer of the present invention containing a repeating unit having a specific structure of the sulfonium salt is used as a base resin of the resist composition, it gave a pattern with excellent rectangularity, low leaching of an anionic component of the sulfonium ion, small LWR, and excellent adhesion with a substrate. From these results, the resist composition of the present invention is suitable as the immersion lithography material.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A polymer having a repeating unit shown by the following general formula (1),

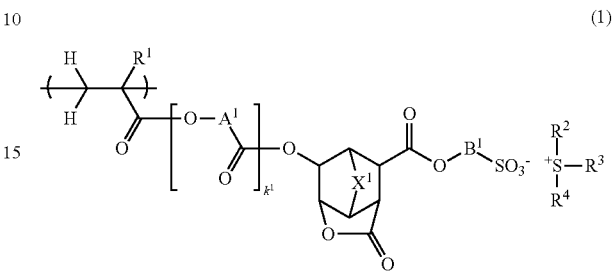

(1)

wherein

R$^1$ represents any of a hydrogen atom, a fluorine atom, a methyl group, and a trifluoromethyl group, each R$^2$, R$^3$, and R$^4$ independently represents any of a substituted or an unsubstituted linear, branched, or cyclic alkyl, alkenyl, and oxoalkyl group having 1 to 10 carbon atoms; or any of a substituted or an unsubstituted aryl, aralkyl, and aryl oxoalkyl group having 6 to 18 carbon atoms; or any two or more of R$^2$, R$^3$, and R$^4$ may be bonded with each other to form a ring together with a sulfur atom in the formula, X$^1$ represents O or CH$_2$, A$^1$ represents a linear, a branched, or a cyclic divalent hydrocarbon group having 1 to 10 carbon atoms, B$^1$ represents an alkylene group having 1 to 10 carbon atoms or an arylene group having 6 to 18 carbon atoms wherein these groups may optionally contain a hetero atom except for a fluorine atom, and k$^1$ represents an integer of 0 or 1.

2. The polymer according to claim 1, wherein the polymer contains a repeating unit having an acid-labile group in addition to the repeating unit shown by the general formula (1).

3. A chemically amplified resist composition comprising (A) the polymer according to claim 1, (B) an organic solvent, (C) a photo acid generator, and (D) a basic compound.

4. A chemically amplified resist composition comprising (A) the polymer according to claim 2, (B) an organic solvent, (C) a photo acid generator, and (D) a basic compound.

5. A patterning process comprising a step of applying the chemically amplified resist composition according to claim 3 onto a substrate, a step of heat treatment, a step of exposing to a high energy beam via a photomask, and a step of development by using a developer.

6. A patterning process comprising a step of applying the chemically amplified resist composition according to claim 4 onto a substrate, a step of heat treatment, a step of exposing to a high energy beam via a photomask, and a step of development by using a developer.

7. A patterning process comprising a step of applying the chemically amplified resist composition according to claim 3 onto a substrate, a step of heat treatment, a step of coating with a top coat that is not soluble in water but soluble in an alkaline developer, a step of exposure to a high energy beam via a photomask while water is inserted between the substrate and a projector lens, and a step of development by using the developer.

8. A patterning process comprising a step of applying the chemically amplified resist composition according to claim 4 onto a substrate, a step of heat treatment, a step of coating with a top coat that is not soluble in water but soluble in an alkaline developer, a step of exposure to a high energy beam via a photomask while water is inserted between the substrate and a projector lens, and a step of development by using the developer.

* * * * *